(12) United States Patent
Widjaja et al.

(10) Patent No.: US 10,032,776 B2
(45) Date of Patent: Jul. 24, 2018

(54) METHOD OF MAINTAINING THE STATE OF SEMICONDUCTOR MEMORY HAVING ELECTRICALLY FLOATING BODY TRANSISTOR

(71) Applicant: Zeno Semiconductor, Inc., Sunnyvale, CA (US)

(72) Inventors: Yuniarto Widjaja, Cupertino, CA (US); Zvi Or-Bach, San Jose, CA (US)

(73) Assignee: Zeno Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 15/701,187

(22) Filed: Sep. 11, 2017

(65) Prior Publication Data

US 2018/0012893 A1     Jan. 11, 2018

Related U.S. Application Data

(63) Continuation of application No. 15/485,011, filed on Apr. 11, 2017, now Pat. No. 9,793,277, which is a continuation of application No. 15/347,048, filed on Nov. 9, 2016, now Pat. No. 9,653,467, which is a continuation of application No. 14/956,253, filed on Dec. 1, 2015, now Pat. No. 9,514,803, which is a continuation of application No. 14/688,122, filed on Apr. 16, 2015, now Pat. No. 9,236,382, which is a (Continued)

(51) Int. Cl.
*G11C 14/00* (2006.01)
*H01L 27/108* (2006.01)
*G11C 11/4099* (2006.01)
*G11C 11/4096* (2006.01)
*H01L 29/78* (2006.01)
*H01L 29/10* (2006.01)
*H01L 29/08* (2006.01)
*H01L 27/102* (2006.01)

(52) U.S. Cl.
CPC .... *H01L 27/10802* (2013.01); *G11C 11/4096* (2013.01); *G11C 11/4099* (2013.01); *H01L 27/1023* (2013.01); *H01L 29/0821* (2013.01); *H01L 29/1004* (2013.01); *H01L 29/7841* (2013.01)

(58) Field of Classification Search
CPC .......... G11C 11/404; G11C 2211/4016; G11C 16/02
See application file for complete search history.

(56) References Cited

U.S. PATENT DOCUMENTS 4,003,076 A     1/1977   Polata et al.
4,126,899 A    11/1978   Lohstroh et al.
(Continued)

OTHER PUBLICATIONS

Rodriguez et al., "A-RAM: Novel capcitor-less DRAM memory." In SOI Conference, 2009 IEEE International, pp. 1-2, IEEE, 2009.
(Continued)

*Primary Examiner* — Tuan T Nguyen
(74) *Attorney, Agent, or Firm* — Alan W. Cannon

(57) ABSTRACT

Methods of maintaining a state of a memory cell without interrupting access to the memory cell are provided, including applying a back bias to the cell to offset charge leakage out of a floating body of the cell, wherein a charge level of the floating body indicates a state of the memory cell; and accessing the cell.

17 Claims, 51 Drawing Sheets

Related U.S. Application Data continuation of application No. 14/448,757, filed on Jul. 31, 2014, now Pat. No. 9,030,872, which is a continuation of application No. 13/941,475, filed on Jul. 13, 2013, now Pat. No. 8,937,834, which is a continuation of application No. 13/478,014, filed on May 22, 2012, now Pat. No. 8,514,623, which is a continuation of application No. 13/244,855, filed on Sep. 26, 2011, now Pat. No. 8,208,302, which is a continuation of application No. 12/797,334, filed on Jun. 9, 2010, now Pat. No. 8,130,547, which is a continuation-in-part of application No. 12/552,903, filed on Sep. 2, 2009, now Pat. No. 8,194,451.

(60) Provisional application No. 61/093,726, filed on Sep. 3, 2008, provisional application No. 61/094,540, filed on Sep. 5, 2008, provisional application No. 61/309,589, filed on Mar. 2, 2010.

(56) References Cited

U.S. PATENT DOCUMENTS

| | | |
|---|---|---|
| 4,300,212 A | 11/1981 | Simko |
| 4,385,308 A | 5/1983 | Uchida |
| 4,393,481 A | 7/1983 | Owen et al. |
| 4,404,662 A | 9/1983 | Masenas, Jr. |
| 4,480,318 A | 10/1984 | Chong |
| 4,521,873 A | 6/1985 | Heuber et al. |
| 4,536,858 A | 8/1985 | Ueno |
| 4,611,303 A | 9/1986 | Kitano |
| 4,651,302 A | 3/1987 | Kimmel et al. |
| 4,821,236 A | 4/1989 | Hayashi et al. |
| 4,841,484 A | 6/1989 | Watanabe et al. |
| 4,959,812 A | 9/1990 | Momodomi et al. |
| 5,091,879 A | 2/1992 | Tran |
| 5,350,938 A | 9/1994 | Matsukawa et al. |
| 5,371,703 A | 12/1994 | Miyamoto |
| 5,410,507 A | 4/1995 | Tazunoki et al. |
| 5,485,425 A | 1/1996 | Iwai et al. |
| 5,511,022 A | 4/1996 | Yim et al. |
| 5,519,831 A | 5/1996 | Holzhammer |
| 5,581,504 A | 12/1996 | Chang et al. |
| 5,670,906 A | 9/1997 | Roohparvar |
| 5,734,616 A | 3/1998 | Kazama et al. |
| 5,767,549 A | 6/1998 | Chen et al. |
| 5,877,978 A | 3/1999 | Morishita et al. |
| 5,896,313 A * | 4/1999 | Kao ................. G11C 11/41 257/552 |
| 5,999,444 A | 12/1999 | Fujiwara et al. |
| 6,005,818 A | 12/1999 | Ferrant |
| 6,064,100 A | 5/2000 | Wen |
| 6,141,248 A | 10/2000 | Forbes et al. |
| 6,163,048 A | 12/2000 | Hirose et al. |
| 6,166,407 A | 12/2000 | Ohta |
| 6,337,824 B1 | 1/2002 | Kono et al. |
| 6,341,087 B1 | 1/2002 | Kunikyo |
| 6,356,485 B1 | 3/2002 | Proebsting |
| 6,373,325 B1 | 4/2002 | Kuriyama |
| 6,376,876 B1 | 4/2002 | Shin et al. |
| 6,542,411 B2 | 4/2003 | Tanikawa et al. |
| 6,614,684 B1 | 9/2003 | Shukuri et al. |
| 6,686,624 B2 | 2/2004 | Hsu |
| 6,724,657 B2 | 4/2004 | Shukuri et al. |
| 6,734,490 B2 | 5/2004 | Esseni et al. |
| 6,791,882 B2 | 9/2004 | Seki et al. |
| 6,801,452 B2 | 10/2004 | Miwa et al. |
| 6,849,501 B2 | 2/2005 | Rudeck |
| 6,870,751 B2 | 3/2005 | Van Brocklin et al. |
| 6,885,581 B2 | 4/2005 | Nemati et al. |
| 6,913,964 B2 | 7/2005 | Hsu |
| 6,925,006 B2 | 8/2005 | Fazan et al. |
| 6,954,377 B2 | 10/2005 | Choi et al. |
| 6,969,662 B2 | 11/2005 | Fazan et al. |
| 7,085,156 B2 | 8/2006 | Ferrant et al. |
| 7,118,986 B2 | 10/2006 | Steigerwalt et al. |
| 7,170,807 B2 | 1/2007 | Fazan et al. |
| 7,224,019 B2 | 5/2007 | Hieda et al. |
| 7,259,420 B2 | 8/2007 | Anderson et al. |
| 7,259,992 B2 | 8/2007 | Shirota |
| 7,285,820 B2 | 10/2007 | Park et al. |
| 7,301,803 B2 | 11/2007 | Okhonin et al. |
| 7,329,580 B2 | 2/2008 | Cho et al. |
| 7,440,333 B2 | 10/2008 | Hsia et al. |
| 7,447,068 B2 | 11/2008 | Tsai et al. |
| 7,450,423 B2 | 11/2008 | Lai et al. |
| 7,473,611 B2 | 1/2009 | Cho et al. |
| 7,504,302 B2 | 3/2009 | Matthew et al. |
| 7,541,636 B2 | 6/2009 | Ranica et al. |
| 7,542,345 B2 | 6/2009 | Okhonin et al. |
| 7,579,241 B2 | 8/2009 | Hieda et al. |
| 7,609,551 B2 | 10/2009 | Shino et al. |
| 7,622,761 B2 | 11/2009 | Park et al. |
| 7,633,801 B2 | 12/2009 | Hanafi et al. |
| 7,701,763 B2 | 4/2010 | Roohparvar |
| 7,733,693 B2 | 6/2010 | Ferrant et al. |
| 7,759,715 B2 | 7/2010 | Bhattacharyya |
| 7,760,548 B2 | 7/2010 | Widjaja |
| 7,847,338 B2 | 12/2010 | Widjaja |
| 7,924,630 B2 | 4/2011 | Carman |
| 7,933,140 B2 | 4/2011 | Wang et al. |
| 8,014,200 B2 | 9/2011 | Widjaja |
| 8,036,033 B2 | 10/2011 | Widjaja |
| 8,059,459 B2 | 11/2011 | Widjaja |
| 8,077,536 B2 | 12/2011 | Widjaja et al. |
| 8,130,547 B2 * | 3/2012 | Widjaja ................. G11C 11/404 365/185.05 |
| 8,130,548 B2 | 3/2012 | Widjaja et al. |
| 8,159,878 B2 | 4/2012 | Widjaja |
| 8,174,886 B2 | 5/2012 | Widjaja et al. |
| 8,194,451 B2 | 6/2012 | Widjaja |
| 8,208,302 B2 * | 6/2012 | Widjaja ................. G11C 11/404 365/185.05 |
| 8,243,499 B2 | 8/2012 | Widjaja |
| 8,294,193 B2 | 10/2012 | Widjaja |
| 8,305,803 B2 | 11/2012 | Mazure et al. |
| 8,514,623 B2 | 8/2013 | Widjaja et al. |
| 8,531,881 B2 | 9/2013 | Widjaja |
| 8,559,257 B2 | 10/2013 | Widjaja |
| 8,570,803 B2 | 10/2013 | Widjaja |
| 8,654,583 B2 | 2/2014 | Widjaja |
| 8,787,085 B2 | 7/2014 | Widjaja |
| 8,837,247 B2 | 9/2014 | Widjaja |
| 8,902,663 B1 * | 12/2014 | Or-Bach ................. G11C 16/02 365/185.08 |
| 8,923,052 B2 | 12/2014 | Widjaja |
| 8,937,834 B2 | 1/2015 | Widjaja et al. |
| 8,995,186 B2 | 3/2015 | Widjaja |
| 9,030,872 B2 | 5/2015 | Widjaja et al. |
| 9,087,580 B2 | 7/2015 | Widjaja |
| 9,153,309 B2 | 10/2015 | Widjaja et al. |
| 9,153,333 B2 | 10/2015 | Widjaja |
| 9,218,864 B1 | 12/2015 | Yi et al. |
| 9,230,965 B2 | 1/2016 | Widjaja |
| 9,236,382 B2 | 1/2016 | Widjaja et al. |
| 9,257,179 B2 | 2/2016 | Widjaja |
| 9,460,790 B2 | 10/2016 | Widjaja |
| 9,484,082 B2 | 11/2016 | Widjaja |
| 9,490,012 B2 | 11/2016 | Widjaja |
| 9,514,803 B2 | 12/2016 | Widjaja et al. |
| 9,614,080 B2 | 4/2017 | Widjaja |
| 9,646,693 B2 | 5/2017 | Widjaja |
| 9,653,467 B2 | 5/2017 | Widjaja et al. |
| 9,679,648 B2 | 6/2017 | Widjaja |
| 9,715,932 B2 | 7/2017 | Widjaja |
| 9,747,983 B2 | 8/2017 | Widjaja |
| 9,761,311 B2 | 9/2017 | Widjaja |
| 9,761,589 B2 | 9/2017 | Widjaja |
| 9,793,277 B2 | 10/2017 | Widjaja et al. |
| 2002/0018366 A1 | 2/2002 | Schwerin et al. |
| 2002/0033499 A1 | 3/2002 | Esseni et al. |
| 2002/0054514 A1 | 5/2002 | Kajigaya et al. |
| 2002/0097603 A1 | 7/2002 | Tanaka et al. |
| 2002/0176303 A1 | 11/2002 | Shore |

(56) References Cited

U.S. PATENT DOCUMENTS

| | | |
|---|---|---|
| 2003/0168680 A1 | 9/2003 | Hsu |
| 2004/0104407 A1 | 6/2004 | Hsu et al. |
| 2004/0223392 A1 | 11/2004 | Ikehashi |
| 2004/0228168 A1 | 11/2004 | Ferrant et al. |
| 2005/0002219 A1 | 1/2005 | Choi et al. |
| 2005/0024968 A1 | 2/2005 | Lee et al. |
| 2005/0032313 A1 | 2/2005 | Forbes |
| 2005/0124120 A1 | 6/2005 | Du et al. |
| 2006/0044915 A1 | 3/2006 | Park et al. |
| 2006/0046408 A1 | 3/2006 | Ohsawa |
| 2006/0056234 A1 | 3/2006 | Lowrey |
| 2006/0125010 A1 | 6/2006 | Bhattacharyya |
| 2006/0146606 A1 | 7/2006 | Bhattacharyya et al. |
| 2006/0157679 A1 | 7/2006 | Scheuerlein |
| 2006/0193174 A1 | 8/2006 | Choi et al. |
| 2006/0227601 A1 | 10/2006 | Bhattacharyya |
| 2006/0237770 A1 | 10/2006 | Huang et al. |
| 2006/0278915 A1 | 12/2006 | Lee et al. |
| 2007/0004149 A1 | 1/2007 | Tews |
| 2007/0090443 A1 | 4/2007 | Choi et al. |
| 2007/0164351 A1 | 7/2007 | Hamamoto |
| 2007/0164352 A1 | 7/2007 | Padilla |
| 2007/0183191 A1 | 8/2007 | Kim |
| 2007/0210338 A1 | 9/2007 | Orlowski |
| 2007/0211535 A1 | 9/2007 | Kim |
| 2007/0215954 A1 | 9/2007 | Mouli |
| 2007/0284648 A1 | 12/2007 | Park et al. |
| 2008/0048239 A1 | 2/2008 | Huo et al. |
| 2008/0056010 A1 | 3/2008 | Horch |
| 2008/0080248 A1 | 4/2008 | Lue et al. |
| 2008/0111154 A1 | 5/2008 | Voldman |
| 2008/0123418 A1 | 5/2008 | Widjaja |
| 2008/0180995 A1 | 7/2008 | Okhonin |
| 2008/0224202 A1 | 9/2008 | Young et al. |
| 2008/0265305 A1 | 10/2008 | He et al. |
| 2008/0303079 A1 | 12/2008 | Cho et al. |
| 2008/0316828 A1 | 12/2008 | Hanafi et al. |
| 2009/0016101 A1 | 1/2009 | Okhonin |
| 2009/0020754 A1 | 1/2009 | Suryagandh et al. |
| 2009/0034320 A1 | 2/2009 | Ueda |
| 2009/0065853 A1 | 3/2009 | Hanafi |
| 2009/0081835 A1 | 3/2009 | Kim et al. |
| 2009/0085089 A1 | 4/2009 | Chang et al. |
| 2009/0108322 A1 | 4/2009 | Widjaja |
| 2009/0108351 A1 | 4/2009 | Yang et al. |
| 2009/0109750 A1 | 4/2009 | Widjaja |
| 2009/0140317 A1 | 6/2009 | Rosmeulen |
| 2009/0173983 A1 | 7/2009 | Kusunoki et al. |
| 2009/0173985 A1 | 7/2009 | Lee et al. |
| 2009/0190402 A1 | 7/2009 | Hsu et al. |
| 2009/0201723 A1 | 8/2009 | Okhonin et al. |
| 2009/0230447 A1 | 9/2009 | Hwang |
| 2009/0242996 A1 | 10/2009 | Van Bentrum et al. |
| 2009/0251966 A1 | 10/2009 | Widjaja |
| 2009/0316492 A1 | 12/2009 | Widjaja |
| 2010/0008139 A1 | 1/2010 | Bae |
| 2010/0034041 A1 | 2/2010 | Widjaja |
| 2010/0046287 A1 | 2/2010 | Widjaja |
| 2010/0096701 A1 | 4/2010 | Yoo |
| 2010/0149882 A1 | 6/2010 | Shum et al. |
| 2010/0149886 A1 | 6/2010 | Song |
| 2010/0157664 A1 | 6/2010 | Chung |
| 2010/0202202 A1 | 8/2010 | Roohparvar |
| 2010/0246277 A1 | 9/2010 | Widjaja |
| 2010/0246284 A1 | 9/2010 | Widjaja |
| 2011/0007578 A1 | 1/2011 | Okhonin et al. |
| 2011/0032756 A1 | 2/2011 | Widjaja |
| 2011/0042736 A1 | 2/2011 | Widjaja |
| 2011/0044110 A1 | 2/2011 | Widjaja |
| 2011/0211399 A1 | 9/2011 | Son et al. |
| 2011/0228591 A1 | 9/2011 | Widjaja |
| 2011/0305085 A1 | 12/2011 | Widjaja |
| 2012/0012915 A1 | 1/2012 | Widjaja et al. |
| 2012/0014180 A1 | 1/2012 | Widjaja |
| 2012/0014188 A1 | 1/2012 | Widjaja et al. |
| 2012/0069652 A1 | 3/2012 | Widjaja |
| 2012/0106234 A1 | 5/2012 | Widjaja |
| 2012/0113712 A1 | 5/2012 | Widjaja |
| 2012/0120752 A1 | 5/2012 | Widjaja |
| 2012/0217549 A1 | 8/2012 | Widjaja |
| 2012/0230123 A1 | 9/2012 | Widjaja et al. |
| 2013/0015517 A1 | 1/2013 | Widjaja et al. |
| 2013/0148422 A1 | 6/2013 | Widjaja |
| 2013/0250685 A1 | 9/2013 | Widjaja |
| 2013/0292635 A1 | 11/2013 | Widjaja |
| 2014/0021549 A1 | 1/2014 | Widjaja |
| 2014/0085981 A1 | 3/2014 | Takeuchi |
| 2014/0160868 A1 | 6/2014 | Widjaja et al. |
| 2014/0332899 A1 | 11/2014 | Widjaja |
| 2014/0340972 A1 | 11/2014 | Widjaja et al. |
| 2014/0355343 A1 | 12/2014 | Widjaja |
| 2015/0109860 A1 | 4/2015 | Widjaja |
| 2015/0170743 A1 | 6/2015 | Widjaja |
| 2015/0221650 A1 | 8/2015 | Widjaja et al. |
| 2015/0310917 A1 | 10/2015 | Widjaja |
| 2015/0371707 A1 | 12/2015 | Widjaja |
| 2016/0005750 A1 | 1/2016 | Widjaja |
| 2016/0078921 A1 | 3/2016 | Widjaja et al. |
| 2016/0086655 A1 | 3/2016 | Widjaja |
| 2016/0111158 A1 | 4/2016 | Widjaja |
| 2016/0365444 A1 | 12/2016 | Widjaja |
| 2017/0025534 A1 | 1/2017 | Widjaja |
| 2017/0032842 A1 | 2/2017 | Widjaja |
| 2017/0040326 A1 | 2/2017 | Widjaja |
| 2017/0053919 A1 | 2/2017 | Widjaja et al. |
| 2017/0133091 A1 | 5/2017 | Widjaja |
| 2017/0169887 A1 | 6/2017 | Widjaja |
| 2017/0213593 A1 | 7/2017 | Widjaja |
| 2017/0221900 A1 | 8/2017 | Widjaja et al. |
| 2017/0294230 A1 | 10/2017 | Widjaja |

OTHER PUBLICATIONS

Rodriguez et al., "Novel capacitorless 1T-DRAM cell for 22-nm node compatible with bulk and SOI substrates." Electron devices, IEEE Transactions on Electron Devices, vol. 58, No. 8 (2011), pp. 2371-2377.

Rodriguez et al., "A-RAM memory cell: concept and operation." Electron Device Letters, IEEE, vol. 31, No. 9 (2010), pp. 972-974.

Romanjek et al., "Compact (Wg/Lg+80/85nm) FDSOI 1T-DRAM programmed by Meta Stable Dip", Ultimate Integration on Silicon (ULIS), 2012 13th International Conference on, Mar. 6, 2012, pp. 199-202.

Rothemund et al., "The importance of being modular", Nature, vol. 485, May 2012, pp. 584-585.

Reisch, "On bistable behavior and open-base breakdown of bipolar transistors in the avalanche regime-modeling and applications." Electron Devices, IEEE Transactions on, 39.6 (1992): 1398-1409.

Sakui et al., "A new static memory cell based on the reverse base current effect of bipolar transistor." Electron Devices, IEEE Transactions on, 36.6 (1989): 1215-1217.

Sakui et al, "A new static memory cell based on reverse base current (RBC) effect of bipolar transistor." Electron Devices Meeting, 1988. IEDM'88. Technical digest, International IEEE, 1988, pp. 44-47.

Shim et al., "A BJT-Based heterostructure 1T-DRAM for Low-voltage Operation." Electron Device Letters, vol. 33, No. 1, 2012, pp. 14-16.

Shin et al., "A novel double HBT-based capacitorless 1T DRAM cell with Si/SiGe heterojunctions." Electron Device Letters, vol. 32, No. 7, 2011, pp. 850-852.

Shin et al., "Vertical-Gate Si/SiGe Double-HBT-Based Capacitorless 1T-DRAM Cell for Extended Retention Time at Low Latch Voltage." Electron Device Letters, vol. 33, No. 2, 2012, pp. 134-136.

Sze et al., Physics of Semiconductor Devices, Wiley Intersciences, John Wiley & Sons, 2007, pp. 1-4.

Terada et al., "A new VLSI memory cell using capacitance coupling (CC cell)." Electron Devices, IEEE Transactions on, 31.9 (1984): pp. 1319-1324.

(56) References Cited

OTHER PUBLICATIONS

Ventrice et al., "Analytical model of deeply-scaled thyristors for memory applications." Microelectronics and Electron Devices (VMED), 2012 IEEE Workshop on. IEEE, 2012, pp. 1-4.

Villaret et al., "Further insight into the physics and modeling of floating-body capacitorless DRAMs." Electron Devices, IEEE Transaction on, 52.11 (2005); pp. 2447-2454.

Wu et al., "Experimental Demonstration of the High-Performance Floating-Body/Gate DRAM Cell for Embedded Memories", IEEE Elec. Dev. Letters, col. 33, No. 6, Jun. 2012, pp. 743-745.

Zhang et al., "Total Ionizing Dose Effects on FinFET-Based Capacitor-Less 1T-DRAMSs." Nuclear Science, IEEE Transactions on, vol. 57, No. 6, 2010, pp. 3298-3304.

Ban et al., "A Scaled Floating Body Cell (FBC) Memory with High-k+Metal Gate on Thin-Silicon and Thin-BOX for 16-nm Technology Node and Beyond", Symposium on VLSI Technology, 2008, pp. 92-93.

Campardo et al., "VLSI Design of Non-Volatile Memories", ISBN3-540-20198-X, Springer Berlin Heidelberg New York, 2005, pp. 94-95.

Han et al., "Programming/erasing Characteristics of 45 nm NOR-Type Flash Memory Based on SOI FinFET Structure." J Korean Phys. Society, vol. 47, Nov. 2005, pp. S564-S567.

Headland, "Hot electron injection", Feb. 19, 2004.

Kim et al., "Silicon on Replacement Insulator (SRI) Floating Body Cell (FBC) Memory", Tech Digest, Symposium on VLSI Technology, 2010, pp. 165-166.

Kim et al., "Vertical Double Gate Z-RAM Technology with Remarkable low voltage operation for DRAW application," Symposium on VLSI Technology, 2010, pp. 163-164.

Lin et al., "A New 1T DRAM Cell with Enhanced Floating Body Effect", IEEE International Workshop on Memory Technology, Design and Testing, 2006, pp. 23-27.

Oh et al., "A 4-bit Double SONOS memory (DSM) with 4 Storage Nodes per Cell for Ultimate Multi-Bit Operation." Tech Digest, Symposium on VLSI Technology, 2006, pp. 58-59.

Ohsawa et al., "An 18.5ns, 128Mb SOI DRAM with a Floating Body Cell", IEEE International Solid-State Circuits Conference, 2005, pp. 458-459, 609.

Ohsawa et al., "Memory Design Using One-Transistor Gain Cell on SOI", Tech. Digest, IEEE International Solid-State Circuits, vol. 37, No. 11, 2002, pp. 1510-1522.

Okhonin et al., "A SOI Capacitor-less 1T-DRAM Concept." IEEE International SOI Conference, 2001, pp. 153-154.

Okhonin et al., "Principles of Transient Charge Pumping on partially Depleted SOI MOSFETs." IEEE Electron Device Letters, vol. 23, No. 5, May, 2002, pp. 279-281.

Okhonin et al., "A Capacitor-less 1T-DRAM Cell", IEEE Electron Device Letters, vol. 23, No. 2, Feb. 2002, pp. 85087.

Pelizzer et al., "A 90nm Phase Change Memory Technology for Stand-Alone Non-Volatile memory Applications", Sympsoium on VLSI Technology Digest of Technical Papers, 2006, pp. 1-2.

Ranica et al., "Scaled 1-T Bulk devices built with CMOS 90nm technology for low-cost eDRAM applications." 2005 Symposium on VLSI Technology Digest of Technical Papers, 2005, pp. 38-39.

Pierret, "Semiconductor Device Fundamentals", ISBN: 0-201-54393-1, 1996, by Addison-Wesley Publishing Company, Inc. PNPN Devices 463-476.

Tack et al., "The Multistable Charge-Controlled memory Effect in SOI Transistors at Low Temperatures", IEEE Transactions on Electron Devices, vol. 37, May 1990, pp. 1373-1382.

Yoshida et al., "A Design of a Capacitorless 1T-DRAM Cell Using Gate-Induced Drain Leakage (GIDL) Current for Low-power and High-speed Embedded Memory", International Electron Devices Meeting, 2003, pp. 1-4.

Villaret et al., "Mechanism of charge modulation in the floating body of triple-well nMOSFET capacitor-less DRAMs", Microelectronic Engineering 72 (2004) 434-439.

Almeida, et al., "Comparison between low and high read bias in FB-RAM on UTBOX FDSOI devices", Ultimate Integration on Silicon (ULIS), 2012 13th International Conference on, Mar. 6, 2012, pp. 61-64.

Andrade, et al., "The Impact of Back Bias on the Floating Body Effect in UTBOX SOI Devices for 1T-FBRAM Memory Applications", Devices, Circuits and Systems (ICCDCS), 2012 8th International Caribbean Conference on. IEEE, 2012, pp. 1-4.

Aoulaiche, et al. "Junction Field Effect on the Retention Time for One-Transistor Floating-Body RAM." Electron Devices, IEEE Transactions on, vol. 59, No. 8, 2012, pp. 2167-2172.

Aoulaiche, et al. "Hot hole induced damage in 1T-FBRAM on bulk FinFET." Reliability Physics Symposium (IRPS), 2011 IEEE International. IEEE, 2011, pp. 99-104.

Avci, et al. "Floating-Body Diode—A Novel DRAM Device." Electron Device Letters, IEEE, vol. 33, No. 2, 2012, pp. 161-163.

Bawedin, et al., "Floating-Body SOI Memory: Concepts, Physics, and Challenges", ECS Transactions 19.4 (2009), pp. 243-256.

Ban, et al. "Integration of Back-Gate doping for 15-nm node floating body cell (FBC) memory." VLSI Technology (VLSIT), 2010 Symposium on. IEEE, 2010, pp. 159-160.

Cho, et al. "Variation-aware study of BJT-based capacitorless DRAM cell scaling limit." Silicon Nanoelectronics Workshop (SNW), 2012 IEEE. IEEE, 2012, pp. 1-2.

Cho, et al. "Variation Study and Implications for BJT-Based Thin-Body Capacitorless DRAM." Electron Device Letters, IEEE, vol. 33, No. 3, 2012, pp. 312-314.

Chiu, et al. "Characteristics of a new trench-oxide thin-film transistor and its 1T-DRAM applications." Solid-State and Integrated Circuit Technology (ICSICT), 2010 10th IEEE International Conference on. IEEE, 2010, pp. 1106-1108.

Chiu, et al. "A simple process of thin-film transistor using the trench-oxide layer for improving 1T-DRAM performance." Next-Generation Electronics (ISNE), 2010 International Symposium on. IEEE, 2010, pp. 254-257.

Chun, et al. "A 1.1 V, 667MHz random cycle, asymmetric 2T gain cell embedded DRAM with a 99.9 percentile retention time of 110μsec." VLSI Circuits (VLSIC), 2010 IEEE Symposium on. IEEE, 2010, pp. 191-192.

Chun, et al. "A 667 MHz Logic-Compatible Embedded DRAM Featuring an Asymmetric 2T Gain Cell for High Speed On-Die Caches." Solid-State Circuits, IEEE Journal of, vol. 47, No. 2, 2012, pp. 547-559.

Cao, et al. "A Novel 1T-1D DRAM Cell for Embedded Application." Electron Devices, IEEE Transactions on, vol. 59, No. 5, 2012, pp. 1304-1310.

Collaert, et al. "Substrate bias dependency of sense margin and retention in bulk FinFET 1T-DRAM cells." Solid-State Electronics 65 (2011, pp. 205-210.

Collaert, et al. "A low-voltage biasing scheme for aggressively scaled bulk FinFET 1T-DRAM featuring 10s retention at 85 C." VLSI Technology (VLSIT), 2010 Symposium on. IEEE, 2010, pp. 161-162.

Chatterjee, et al. "Taper isolated dynamic gain RAM cell." Electron Devices Meeting, 1978 International. vol. 24. IEEE, 1978, pp. 698-699.

Chatterjee, et al. Circuit Optimization of the Paper Isolated Dynamic Gain RAM Cell for VLSI Memories, pp. 22-23, 1979.

Chatterjee, et al. "A survey of high-density dynamic RAM cell concepts." Electron Devices, IEEE Transactions on 26.6 (1979): 827-839.

Erb, D. "Stratified charge memory." Solid-State Circuits Conference. Digest of Technical Papers. 1978 IEEE International. vol. 21. IEEE, 1978, pp. 24-25.

Galeti, M., et al. "BJT effect analysis in p-and n-SOI MuGFETs with high-k gate dielectrics and TiN metal gate electrode for a 1T-DRAM application." SOI Conference (SOI), 2011 IEEE International. IEEE, 2011, pp. 1-2.

Gamiz, et al. "3D Trigate 1T-DRAM Memory Cell for 2x nm Nodes." Memory Workshop (IMW), 2012 4th IEEE International. IEEE, 2012, pp. 1-4.

(56) References Cited

OTHER PUBLICATIONS

Gamiz, et al. "A 20nm low-power triple-gate multibody 1T-DRAM cell." VLSI Technology, Systems, and Applications (VLSI-TSA), 2012 International Symposium on. IEEE, 2012, pp. 1-2.
Giusi, et al. "Bipolar mode operation and scalability of double-gate capacitorless 1T-DRAM cells." Electron Devices, IEEE Transactions on, vol. 57, No. 8 (2010), pp. 1743-1750.
Gupta, et al. "32nm high-density high-speed T-RAM embedded memory technology." Electron Devices Meeting (IEDM), 2010 IEEE International IEEE, 2010, pp. 12-1.
Han, et al. "Bistable resistor (biristor)-gateless silicon nanowire memory." VLSI Technology (VLSIT), 2010 Symposium on. IEEE, 2010, pp. 171-172.
Han, et al. "Biristor—Bistable resistor based on a silicon nanowire." Electron Device Letters, IEEE 31.8 (2010): 797-799.
Hubert, et al., "Experimental comparison of programming mechanisms in 1T-DRAM cells with variable channel length", Solid-State Device Research Conference (ESSDERC), 2010 Proceedings of the European, pp. 150-153, Sep. 14-16, 2010.
Hwang, et al. "Offset buried metal gate vertical floating body memory technology with excellent retention time for DRAM application." VLSI Technology (VLSIT), 2011 Symposium on. IEEE, 2011, pp. 172-173.
Kim, et al. "Investigation of 1T DRAM cell with non-overlap structure and recessed channel." Silicon Nanoelectronics Workshop (SNW), 2010. IEEE, 2010, pp. 1-2.
Kim, et al. "Optical charge-pumping: A universal trap characterization technique for nanoscale floating body devices." VLSI Technology (VLSIT), 2011 Symposium on. IEEE, 2011, pp. 190-191.
Leiss, et al, "dRAM Design Using the Taper-Isolated Dynamic RAM Cell." Solid-State Circuits, IEEE Journal of 17.2 (1982):337-344.
Lee, et al. "A Novel Capacitorless 1T DRAM Cell for Data Retention Time Improvement." Nanotechnology, IEEE Transactions on, vol. 10, No. 3, 2011, pp. 462-466.
Lu, et al., "A Simplified Superior Floating-Body/Gate DRAM Cell", IEEE Elec. Dev. Letters, vol. 30, No. 3, Mar. 2009, pp. 282-284.
Lu, et al., "A Floating-Body/Gate DRAM Cell Upgraded for Long Retention Time", IEEE Elec. Dev. Letters, vol. 32, No. 6, pp. 731-733, Jun. 2011.
Liu, Xuelian, et al. "A three-dimensional DRAM using floating body cell in FDSOI devices." Design and Diagnostics of Electronic Circuits & Systems (DDECS), 2012 IEEE 15th International Symposium on. IEEE, 2012, pp. 159-162.
Lin, et al., A new 1T DRAM Cell with enhanced Floating Body Effect, pp. 1-5, 2006.
Lanyon, et al., "Bandgap Narrowing in Moderately to Heavily Doped Silicon", ppl 1014-1018, No. 7, vol. ED-26, 1979.
Mahatme, et al. "Total ionizing dose effects on ultra thin buried oxide floating body memories." Reliability Physics Symposium (IRPS), 2012 IEEE International, 2012, pp. 1-5.
Moon, et al. "Fin-width dependence of BJT-based 1T-DRAM implemented on FinFET." Electron Device Letters, vol. 31, No. 9 (2010): 909-911.
Moon, et al. "An optically assisted program method for capacitor-less 1T-DRAM." Electron Devices, IEEE Transactions on, vol. 57, No. 7, 2010, pp. 1714-1718.
Moon, et al. "Multi-functional universal device using a band-engineered vertical structure." Electron Devices Meeting (IEDM), 2011 IEEE International. IEEE, 2011, pp. 24-26.
Moon, et al. "Ultimately scaled 20nm unified-RAM." Electron Devices Meeting (IEDM), 2010 IEEE International. IEEE, 2010, pp. 12-2.
Nicoletti, et al. "The Dependence of Retention Time on Gate Length in UTBOX FBRAM With Different Source/Drain Junction Engineering." Electron Device Letters, vol. 33, No. 7, 2012, pp. 940-942.
Ohsawa, et al, "A Novel Capacitor-less DRAM Cell: Floating Body Cell", CRC Press, Taylor & Francis Group, 2012, pp. 1-7.
Ohsawa, et al. Autonomous refresh of floating body cell (FBC). IEEE, 2008, pp. 801-804.
Ohsawa, et al. Autonomous refresh of floating-body cell due to Current Anomaly of Impact Ionization, IEEE Transactions on Electron Devices, vol. 56 No. 10, 2009, pp. 2302-2311.
Pulicani, R., et al. "Simulation of intrinsic bipolar transistor mechanisms for future capacitor-less eDRAM on bulk substrate." Electronics, Circuits, and Systems (ICECS), 2010 17th IEEE International Conference on. IEEE, 2010, pp. 966-969.
Ranica, et al. "Scaled 1T-Bulk devices built with CMOS 90nm technology for low-cost eDRAM applications." VLSI Technology, 2005. Digest of Technical Papers. 2005 Symposium on. IEEE, 2005, pp. 38-39.
Ranica, et al., A one transistor cell on bulk substrate (1T-Bulk) for low-cost and high density eDRAM. VLSI Technology, 2004, pp. 128-129.

\* cited by examiner

METHOD OF MAINTAINING THE STATE OF SEMICONDUCTOR MEMORY HAVING ELECTRICALLY FLOATING BODY TRANSISTOR

CROSS-REFERENCE

This application is a continuation of co-pending application Ser. No. 15/485,011, filed Apr. 11, 2017, which is a continuation of application Ser. No. 15/347,048, filed Nov. 9, 2016, now U.S. Pat. No. 9,653,467, which is a continuation of application Ser. No. 14/956,253, filed Dec. 1, 2015, now U.S. Pat. No. 9,514,803, which is a continuation of application Ser. No. 14/688,122, filed Apr. 16, 2015, now U.S. Pat. No. 9,236,382, which is a continuation of application Ser. No. 14/448,757, filed Jul. 31, 2014, now U.S. Pat. No. 9,030,872, which is a continuation of application Ser. No. 13/941,475, filed Jul. 13, 2013, now U.S. Pat. No. 8,937,834, which is a continuation of application Ser. No. 13/478,014, filed May 22, 2012, now U.S. Pat. No. 8,514,623, which is a continuation of application Ser. No. 13/244,855, filed Sep. 26, 2011, now U.S. Pat. No. 8,208,302, which is a continuation of application Ser. No. 12/797,334, filed Jun. 9, 2010, now U.S. Pat. No. 8,130,547, which is a continuation-in-part application of application Ser. No. 12/552,903, filed Sep. 2, 2009, now U.S. Pat. No. 8,194,451, and a continuation-in-part application of application Ser. No. 12/533,661, filed Jul. 31, 2009, now U.S. Pat. No. 8,077,536, and a continuation-in-part application of application Ser. No. 12/545,623, filed Aug. 21, 2009, now U.S. Pat. No. 8,159,868, and which claims the benefit of U.S. Provisional Application No. 61/093,726, filed Sep. 3, 2008, and U.S. Provisional Application No. 61/094,540, filed Sep. 5, 2008. We hereby incorporate all of the aforementioned applications and patents herein, in their entireties, by reference thereto, and we claim priority to application Ser. Nos. 15/485,011; 15/347,048; 14/956,253; 14/688,122; 14/448,757; 13/941,475; 13/478,014; 13/244,855; 12/797,334; 12/552,903; 12/533,661 and 12/545,623, under 35 USC § 120, and to application Ser. Nos. 61/093,726 and 61/094,540 under 35 USC § 119.

This application claims the benefit of U.S. Provisional Application No. 61/309,589, filed Mar. 2, 2010, which application is hereby incorporated herein, in its entirety, by reference thereto and to which application we claim priority under 35 U.S.C. Section 119.

This application also hereby incorporates, in its entirety by reference thereto, application Ser. No. 12/797,320, filed concurrently herewith and titled "Semiconductor Memory Having Electrically Floating Body Transistor".

FIELD OF THE INVENTION

The present invention relates to semiconductor memory technology. More specifically, the present invention relates to methods of maintaining the state of semiconductor memory device/array of devices having an electrically floating body transistor.

BACKGROUND OF THE INVENTION

Semiconductor memory devices are used extensively to store data. Static and Dynamic Random Access Memory (SRAM and DRAM, respectively) are widely used in many applications. SRAM typically consists of six transistors and hence has a large cell size. However, unlike DRAM, it does not require periodic refresh operations to maintain its memory state. Conventional DRAM cells consist of a one-transistor and one-capacitor (1T/1C) structure. As the 1T/1C memory cell feature is being scaled, difficulties arise due to the necessity of maintaining the capacitance value.

DRAM based on the electrically floating body effect has been proposed (see for example "A Capacitor-less 1T-DRAM Cell", S. Okhonin et al., pp. 85-87, IEEE Electron Device Letters, vol. 23, no. 2, February 2002 and "Memory Design Using One-Transistor Gain Cell on SOI", T. Ohsawa et al., pp. 152-153, Tech. Digest, 2002 IEEE International Solid-State Circuits Conference, February 2002). Such memory eliminates the capacitor used in the conventional 1T/1C memory cell, and thus is easier to scale to smaller feature size. In addition, such memory allows for a smaller cell size compared to the conventional 1T/1C memory cell. However, unlike SRAM, such DRAM memory cell still requires refresh operation, since the stored charge leaks over time.

A conventional 1T/1C DRAM refresh operation involves first reading the state of the memory cell, followed by re-writing the memory cell with the same data. Thus this read-then-write refresh requires two operations: read and write. The memory cell cannot be accessed while being refreshed. An "automatic refresh" method", which does not require first reading the memory cell state, has been described in Fazan et al., U.S. Pat. No. 7,170,807. However, such operation still interrupts access to the memory cells being refreshed.

In addition, the charge in a floating body DRAM memory cell decreases over repeated read operations. This reduction in floating body charge is due to charge pumping, where the floating body charge is attracted to the surface and trapped at the interface (see for example "Principles of Transient Charge Pumping on Partially Depleted SOI MOSFETs", S. Okhonin, et al., pp. 279-281, IEEE Electron Device Letters, vol. 23, no. 5, May 2002).

Thus there is a continuing need for semiconductor memory devices and methods of operating such devices such that the states of the memory cells of the semiconductor memory device are maintained without interrupting the memory cell access.

There is also a need for semiconductor memory devices and methods of operating the same such that the states of the memory cells are maintained upon repeated read operations.

The present invention meets the above needs and more as described in detail below.

SUMMARY OF THE INVENTION

In one aspect of the present invention, a method of maintaining a state of a memory cell without interrupting access to the memory cell is provided, including: applying a back bias to the cell to offset charge leakage out of a floating body of the cell, wherein a charge level of the floating body indicates a state of the memory cell; and accessing the cell.

In at least one embodiment, the applying comprises applying the back bias to a terminal of the cell that is not used for address selection of the cell.

In at least one embodiment, the back bias is applied as a constant positive voltage bias.

In at least one embodiment, the back bias is applied as a periodic pulse of positive voltage.

In at least one embodiment, a maximum potential that can be stored in the floating body is increased by the application of back bias to the cell, resulting in a relatively larger memory window.

In at least one embodiment, the application of back bias performs a holding operation on the cell, and the method further comprises simultaneously performing a read operation on the cell at the same time that the holding operation is being performed.

In at least one embodiment, the cell is a multi-level cell, wherein the floating body is configured to indicate more than one state by storing multi-bits, and the method further includes monitoring cell current of the cell to determine a state of the cell.

In another aspect of the present invention, a method of operating a memory array having rows and columns of memory cells assembled into an array of the memory cells is provided, wherein each memory cell has a floating body region for storing data, the method including: performing a holding operation on at least all of the cells not aligned in a row or column of a selected cell; and accessing the selected cell and performing a read or write operation on the selected cell while performing the hold operation on the at least all of the cells not aligned in a row or column of the selected cell.

In at least one embodiment, the performance of a holding operation comprises performing the holding operation on all of the cells and the performing a read or write operation comprises performing a read operation on the selected cell.

In at least one embodiment, the holding operation is performed by applying back bias to a terminal not used for memory address selection.

In at least one embodiment, the terminal is segmented to allow independent control of the applied back bias to a selected portion of the memory array.

In at least one embodiment, the performance of a holding operation comprises performing the holding operation on all of the cells except for the selected cell, and the performing a read or write operation comprises performing a write "0" operation on the selected cell, wherein a write "0" operation is also performed on all of the cells sharing a common source line terminal with the selected cell during the performing a write "0" operation.

In at least one embodiment, an individual bit write "0" operation is performed, wherein the performing a holding operation comprises performing the holding operation on all of the cells except for the selected cell, while the performing a read or write operation comprises performing a write "0" operation on the selected cell.

In at least one embodiment, the performance of a holding operation comprises performing the holding operation on all of the cells except for the selected cell while the performing a read or write operation comprises performing a write "1" operation on the selected cell.

In at least one embodiment, the performance of a holding operation comprises performing the holding operation on all of the cells except for the selected cell while the performing a read or write operation comprises performing a multi-level write operation on the selected cell, using an alternating write and verify algorithm.

In at least one embodiment, the performance of a holding operation comprises performing the holding operation on all of the cells except for the selected cell while the performing a read or write operation comprises performing a multi-level write operation on the selected cell, wherein the multi-level write operation includes: ramping a voltage applied to the selected cell to perform the write operation; reading the state of the selected cell by monitoring a change in current through the selected cell; and removing the ramped voltage applied once the change in cell current reaches a predetermined value.

In at least one embodiment, the performance of a holding operation comprises performing the holding operation on all of the cells except for the selected cell while the performing a read or write operation comprises performing a multi-level write operation on the selected cell, wherein the multi-level write operation includes: ramping a current applied to the selected cell to perform the write operation; reading the state of the selected cell by monitoring a change in voltage across a bit line and a source line of the selected cell; and removing the ramped current applied once the change in cell voltage reaches a predetermined value.

In at least one embodiment, the multi-level write operation permits bit-level selection of a bit portion of memory of the selected cell.

In at least one embodiment, the performance of a holding operation comprises performing the holding operation on all of the cells except for the selected cell while the performing a read or write operation comprises performing a single-level or multi-level write operation on the selected cell, wherein the single-level and each level of the multi-level write operation includes: ramping a voltage applied to the selected cell to perform the write operation; reading the state of the selected cell by monitoring a change in current toward an addressable terminal of the selected cell; and verifying a state of the write operation using a reference memory cell.

In at least one embodiment, the method further includes configuring a state of the reference memory cell using a write-then-verify operation, prior to performing the write operation.

In at least one embodiment, configuring a state of the reference memory cell comprises configuring the state upon power up of the memory array.

In another aspect of the present invention, a method of operating a memory array having rows and columns of memory cells assembled into an array of the memory cells is provided, wherein each memory cell has a floating body region for storing data; and wherein the method includes: refreshing a state of at least one of the memory cells; and accessing at least one other of the memory cells, wherein access of the at least one other of the memory cells in not interrupted by the refreshing, and wherein the refreshing is performed without alternating read and write operations.

In at least one embodiment, at least one of the memory cells is a multi-level memory cell.

In another aspect of the present invention, a method of operating a memory array having rows and columns of memory cells assembled into an array of the memory cells is provided, wherein each memory cell has a floating body region for storing data; and wherein the method includes: accessing a selected memory cell from the memory cells; and performing a simultaneous write and verify operation on the selected memory cell without performing an alternating write and read operation.

In at least one embodiment, the selected memory cell is a multi-level memory cell.

In at least one embodiment, a verification portion of the write and verify operation is performed by sensing a current change in the column direction of the array in a column that the selected cell is connected to.

In at least one embodiment, a verification portion of the write and verify operation is performed by sensing a current change in the row direction of the array in a row that the selected cell is connected to.

In at least one embodiment, a write portion of the write and verify operation employs use of a drain or gate voltage ramp.

In at least one embodiment, a write portion of the write and verify operation employs use of a drain current ramp.

These and other features of the invention will become apparent to those persons skilled in the art upon reading the details of the methods, devices and arrays as more fully described below.

DETAILED DESCRIPTION OF THE INVENTION

Figure 1A:
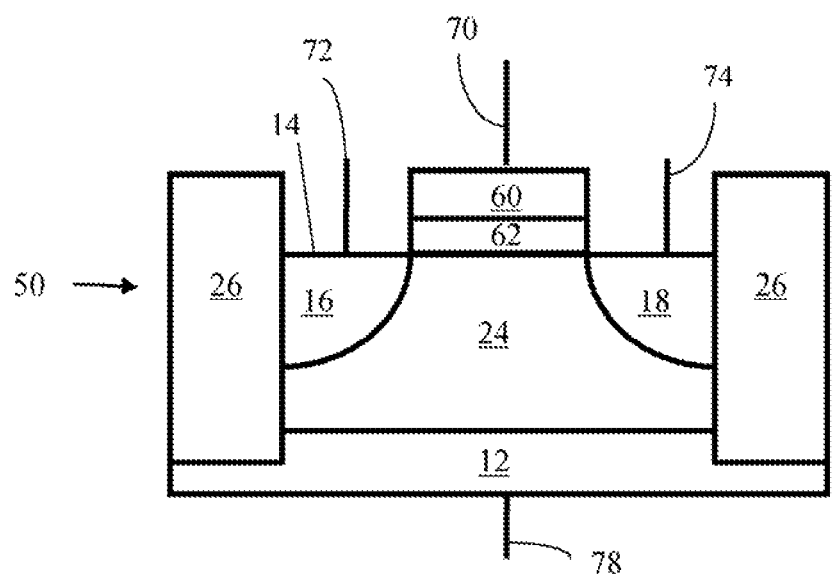
FIG. 1A is a schematic illustration of a memory cell according to an embodiment of the present invention.

Before the present systems, devices and methods are described, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed within the invention. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described. All publications mentioned herein are incorporated herein by reference to disclose and describe the methods and/or materials in connection with which the publications are cited.

It must be noted that as used herein and in the appended claims, the singular forms "a", "an", and "the" include plural referents unless the context clearly dictates otherwise. Thus, for example, reference to "a cell" includes a plurality of such cells and reference to "the terminal" includes reference to one or more terminals and equivalents thereof known to those skilled in the art, and so forth.

The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed.

Definitions

A "holding operation", "standby operation" or "holding/standby operation", as used herein, refers to a process of sustaining a state of a memory cell by maintaining the stored charge. Maintenance of the stored charge may be facilitated by applying a back bias to the cell in a manner described herein.

A "a multi-level write operation" refers to a process that includes an ability to write more than more than two different states into a memory cell to store more than one bit per cell.

A "write-then-verify" algorithm or operation refers to a process where alternating write and read operations to a memory cell are employed to verify whether a desired memory state of the memory cell has been achieved during the write operation.

A "read verify operation" refers to a process where a read operation is performed to verify whether a desired memory state of a memory cell has been achieved.

A "read while programming" operation refers to a process where simultaneous write and read operations can be performed to write a memory cell state.

A "back bias terminal" refers to a terminal at the back side of a semiconductor transistor device, usually at the opposite side of the gate of the transistor. A back bias terminal is also commonly referred to as a "back gate terminal". Herein, the back bias terminal refers to the substrate terminal or the buried well terminal, depending upon the embodiment being described.

The term "back bias" refers to a voltage applied to a back bias terminal.

DETAILED DESCRIPTION

Referring now to FIG. 1, a memory cell 50 according to an embodiment of the present invention is shown. The cell 50 includes a substrate 12 of a first conductivity type, such as n-type conductivity type, for example. Substrate 12 is typically made of silicon, but may comprise germanium, silicon germanium, gallium arsenide, carbon nanotubes, or other semiconductor materials known in the art. The substrate 12 has a surface 14. A first region 16 having a first conductivity type, such as n-type, for example, is provided in substrate 12 and which is exposed at surface 14. A second region 18 having the first conductivity type is also provided in substrate 12, which is exposed at surface 14 and which is spaced apart from the first region 16. First and second regions 16 and 18 are formed by an implantation process formed on the material making up substrate 12, according to any of implantation processes known and typically used in the art. Alternatively, a solid state diffusion process can be used to form first and second regions 16 and 18.

Figure 2:
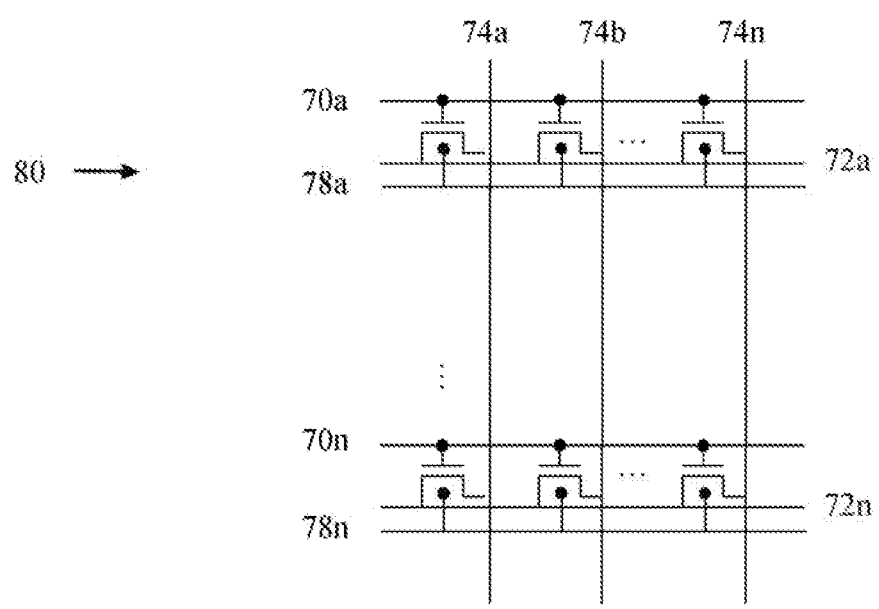
FIG. 2 schematically illustrates multiple cells joined in an array to make a memory device according to an embodiment of the present invention.

A floating body region 24 having a second conductivity type different from the first conductivity type, such as p-type conductivity type when the first conductivity type is n-type conductivity type, is bounded by surface 14, first and second regions 16, 18, insulating layers 26, and substrate 12. The floating body region 24 can be formed by an implantation process formed on the material making up substrate 12, or can be grown epitaxially. Insulating layers 26 (e.g. shallow trench isolation (STI)), may be made of silicon oxide, for example. Insulating layers 26 insulate cell 50 from neighboring cells 50 when multiple cells 50 are joined in an array 80 to make a memory device as illustrated in FIG. 2. A gate 60 is positioned in between the regions 16 and 18, and above the surface 14. The gate 60 is insulated from surface 14 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of polysilicon material or metal gate electrode, such as tungsten, tantalum, titanium and their nitrides.

Figure 1B:
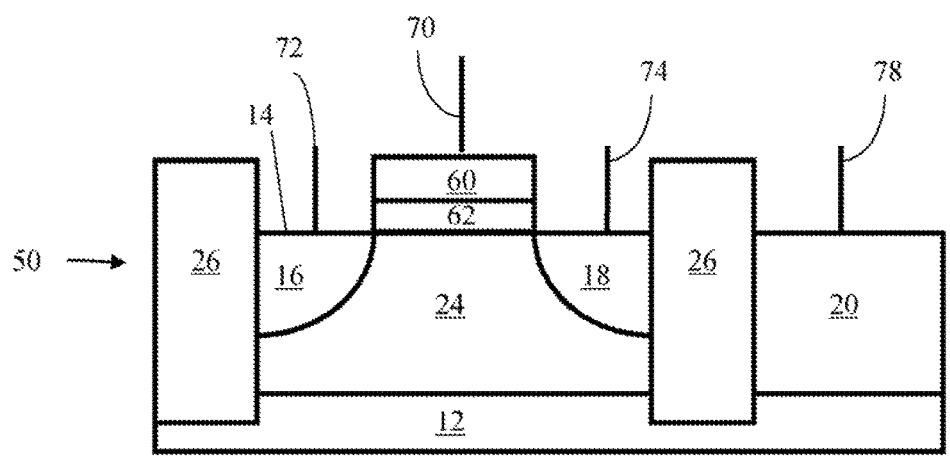
FIG. 1B is a schematic illustration of a memory cell according to an embodiment of the present invention showing a contact to the substrate region.

Cell 50 further includes word line (WL) terminal 70 electrically connected to gate 60, source line (SL) terminal 72 electrically connected to one of regions 16 and 18 (connected to 16 as shown, but could, alternatively, be connected to 18), bit line (BL) terminal 74 electrically connected to the other of regions 16 and 18 (connected to 18 as shown, but could, alternatively, be connected to 16 when 72 is connected to 18), and substrate terminal 78 electrically connected to substrate 12. Contact to substrate region can alternatively be made through region 20 having a first conductivity type, and which is electrically connected to substrate region 12, as shown in FIG. 1B.

In another embodiment, the memory cell 50 has a p-type conductivity type as the first conductivity type and n-type conductivity type as the second conductivity type, as noted above.

The operation of a memory cell 50 has been described for example in "Scaled 1T-Bulk Devices Built with CMOS 90 nm Technology for Low-cost eDRAM Applications", R. Ranica, et al., pp. 38-41, Tech. Digest, Symposium on VLSI Technology, 2005, which is hereby incorporated herein, in its entirety, by reference thereto. The memory cell states are represented by the charge in the floating body 24. If cell 50 has holes stored in the floating body region 24, then the memory cell 50 will have a lower threshold voltage (gate voltage where transistor is turned on) compared to when cell 50 does not store holes in floating body region 24.

Figure 3:
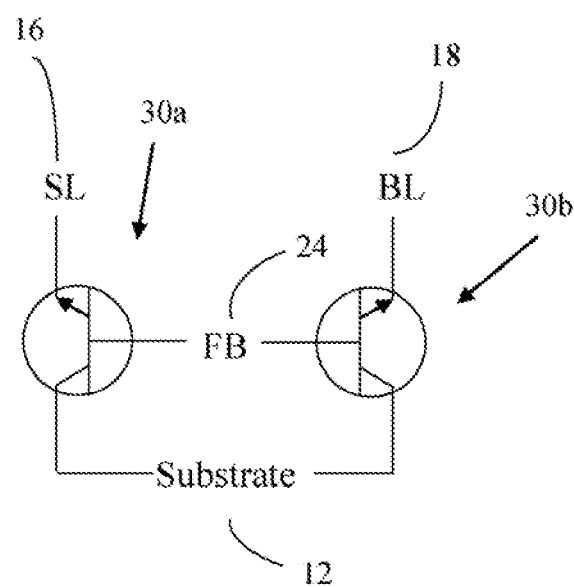
FIG. 3 schematically illustrates n-p-n bipolar devices that are inherently formed in a memory cell according to an embodiment of the present invention.

The positive charge stored in the floating body region 24 will decrease over time due to the p-n diode leakage formed by floating body 24 and regions 16, 18, and substrate 12 and due to charge recombination. A unique capability of the invention is the ability to perform the holding operation in parallel to all memory cells 50 of the array 80. The holding operation can be performed by applying a positive back bias to the substrate terminal 78 while grounding terminal 72 and/or terminal 74. The positive back bias applied to the substrate terminal will maintain the state of the memory cells 50 that it is connected to. The holding operation is relatively independent of the voltage applied to terminal 70. As shown in FIG. 3, inherent in the memory cell 50 are n-p-n bipolar devices 30a and 30b formed by substrate region 12, floating body 24, and SL and BL regions 16, 18. If floating body 24 is positively charged (i.e. in a state "1"), the bipolar transistor 30a formed by SL region 16, floating body 24, and substrate region 12 and bipolar transistor 30b formed by BL region 18, floating body 24, and substrate region 12 will be turned on.

A fraction of the bipolar transistor current will then flow into floating region 24 (usually referred to as the base current) and maintain the state "1" data. The efficiency of the holding operation can be enhanced by designing the bipolar device formed by substrate 12, floating region 24, and regions 16, 18 to be a low-gain bipolar device, where the bipolar gain is defined as the ratio of the collector current flowing out of substrate terminal 78 to the base current flowing into the floating region 24.

For memory cells in state "0" data, the bipolar devices 30a, 30b will not be turned on, and consequently no base hole current will flow into floating region 24. Therefore, memory cells in state "0" will remain in state "0".

Figure 4A:
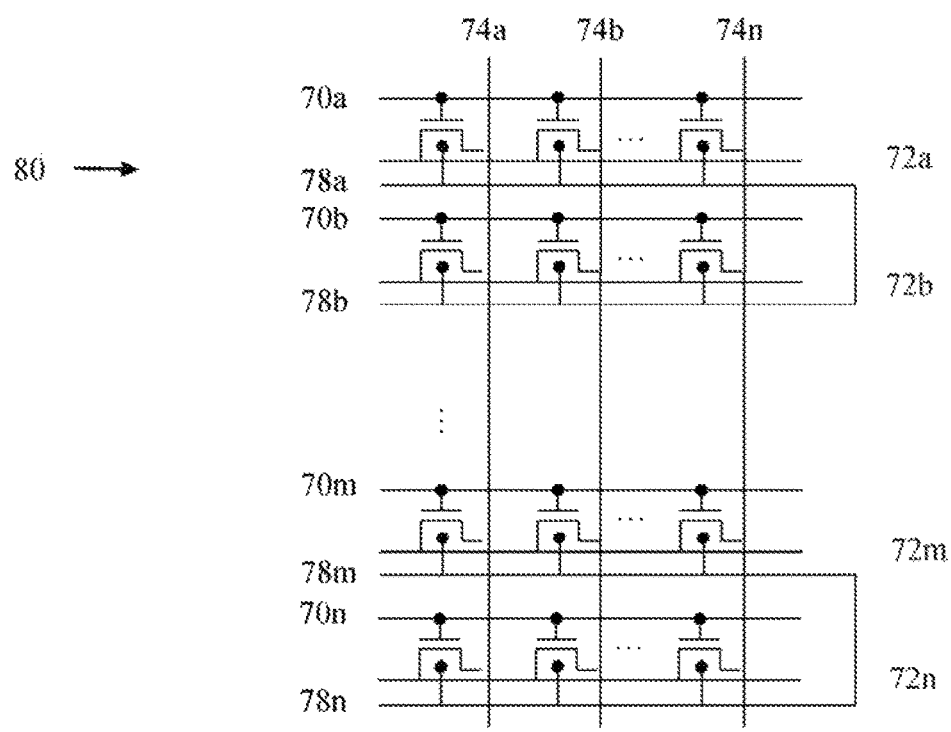
FIG. 4A illustrates segmenting of substrate terminals in an array according to an embodiment of the present invention.

As can be seen, the holding operation can be performed in mass, parallel manner as the substrate terminal 78 (e.g., 78a, 78b, ..., 78n) is typically shared by all the cells 50 in the memory array 80. The substrate terminal 78 can also be segmented to allow independent control of the applied bias on the selected portion of the memory array as shown in FIG. 4A, where substrate terminal 78a, 78b is shown segmented from substrate terminal 78m, 78n, for example. Also, because substrate terminal 78 is not used for memory address selection, no memory cell access interruption occurs due to the holding operation.

Figure 4B:
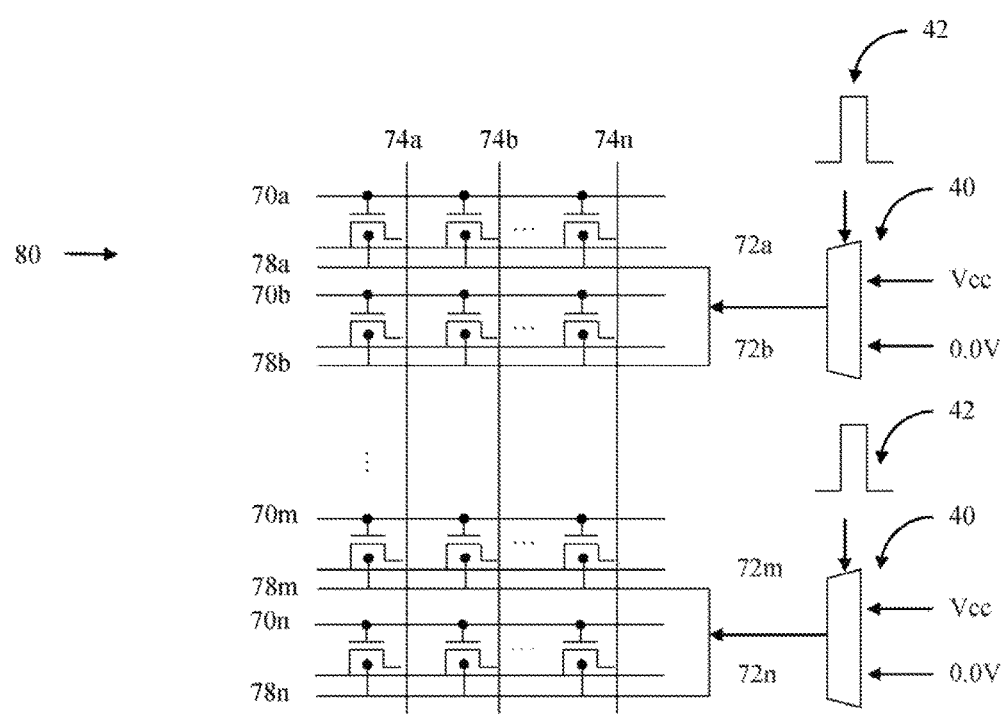
FIG. 4B schematically illustrates multiplexers used to determine the biases applied to segmented substrate terminals according to an embodiment of the present invention.
Figure 4C:
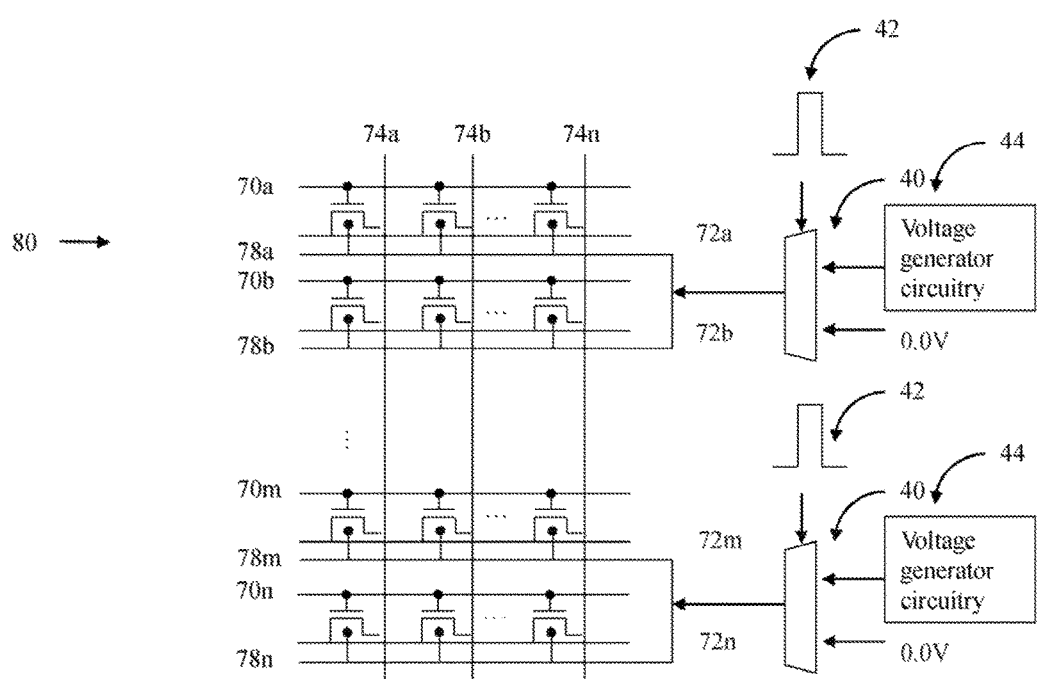
FIG. 4C schematically illustrates use of a voltage generator circuitries to input positive bias to the multiplexers according to an embodiment of the present invention.

In another embodiment, a periodic pulse of positive voltage can be applied to substrate terminal 78, as opposed to applying a constant positive bias, in order to reduce the power consumption of the memory cell 50. The state of the memory cell 50 can be maintained by refreshing the charge stored in floating body 24 during the period over which the positive voltage pulse is applied to the back bias terminal (i.e., substrate terminal 78). FIG. 4B further shows multiplexers 40 that determine the bias applied to substrate terminal 78 where the control signal could be the clock signal 42 or as will be described later, determined by different operating modes. The positive input signals could be the power supply voltage Vcc (FIG. 4B) or a different positive bias could be generated by voltage generator circuitry 44 (see FIG. 4C).

Figure 5:
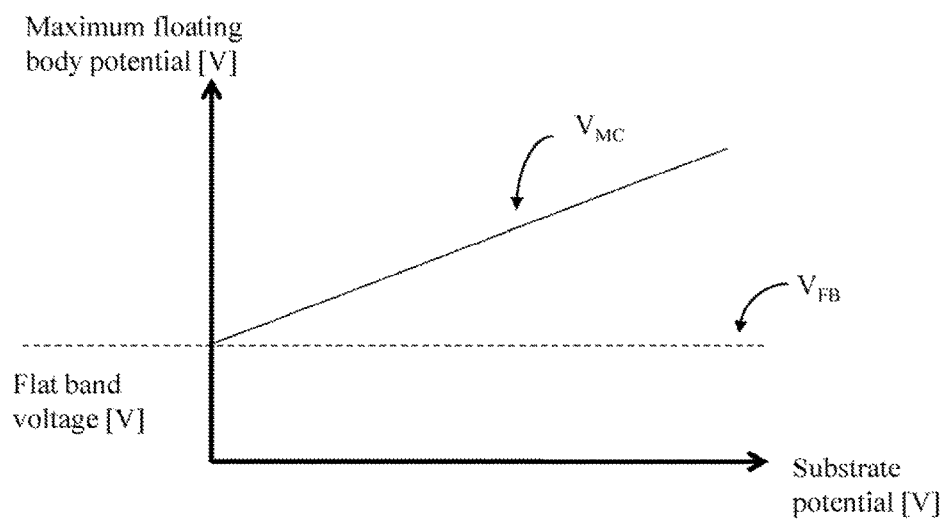
FIG. 5 graphically illustrates that the maximum charge stored in a floating body of a memory cell can be increased by applying a positive bias to the substrate terminal according to an embodiment of the present invention.

The holding/standby operation also results in a larger memory window by increasing the amount of charge that can be stored in the floating body 24. Without the holding/standby operation, the maximum potential that can be stored in the floating body 24 is limited to the flat band voltage $V_{FB}$ as the junction leakage current to regions 16 and 18 increases exponentially at floating body potential greater than $V_{FB}$. However, by applying a positive voltage to substrate terminal 78, the bipolar action results in a hole current flowing into the floating body 24, compensating for the junction leakage current between floating body 24 and regions 16 and 18. As a result, the maximum charge $V_{MC}$ stored in floating body 24 can be increased by applying a positive bias to the substrate terminal 78 as shown in FIG. 5. The increase in the maximum charge stored in the floating body 24 results in a larger memory window.

The holding/standby operation can also be used for multi-bit operations in memory cell 50. To increase the memory density without increasing the area occupied by the memory cell 50, a multi-level operation is typically used. This is done by dividing the overall memory window into different levels. In floating body memory, the different memory states are represented by different charges in the floating body 24, as described for example in "The Multistable Charge-Controlled Memory Effect in SOI Transistors at Low Temperatures", Tack et al., pp. 1373-1382, IEEE Transactions on Electron Devices, vol. 37, May 1990 and U.S. Pat. No. 7,542,345 "Multi-bit memory cell having electrically floating body transistor, and method of programming and reading same", each of which is hereby incorporated herein, in its entirety, by reference thereto. However, since the state with zero charge in the floating body 24 is the most stable state, the floating body 24 will, over time, lose its charge until it reaches the most stable state. In multi-level operations, the difference of charge representing different states is smaller than that for a single-level operation. As a result, a multi-level memory cell is more sensitive to charge loss, as less charge loss is required to change states.

FIG. 6 shows the floating body 24 relative net current for different floating body 24 potentials as a function of the voltage applied to substrate terminal 78 with BL, SL, and WL terminals 72, 74, and 70, grounded. When zero voltage is applied to substrate terminal 78, no bipolar current is flowing into the floating body 24 and as a result, the stored charge will leak over time. When a positive voltage is applied to substrate terminal 78, hole current will flow into floating body 24 and balance the junction leakage current to regions 16 and 18. The junction leakage current is determined by the potential difference between the floating body 24 and regions 16 and 18, while the bipolar current flowing into floating body 24 is determined by both the substrate terminal 78 potential and the floating body 24 potential. As indicated in FIG. 6, for different floating body potentials, at a certain substrate terminal 78 potential $V_{HOLD}$, the current flowing into floating body 24 is balanced by the junction leakage between floating body 24 and regions 16 and 18. The different floating body 24 potentials represent different charges used to represent different states of memory cell 50. This shows that different memory states can be maintained by using the holding/standby operation described here.

An example of the bias condition for the holding operation is hereby provided: zero voltage is applied to BL terminal 74, zero voltage is applied to SL terminal 72, zero or negative voltage is applied to WL terminal 70, and a positive voltage is applied to the substrate terminal 78. In one particular non-limiting embodiment, about 0.0 volts is applied to terminal 72, about 0.0 volts is applied to terminal 74, about 0.0 volts is applied to terminal 70, and about +1.2 volts is applied to terminal 78. However, these voltage levels may vary.

The charge stored in the floating body 24 can be sensed by monitoring the cell current of the memory cell 50. If cell 50 is in a state "1" having holes in the floating body region 24, then the memory cell will have a lower threshold voltage (gate voltage where the transistor is turned on), and consequently a higher cell current, compared to if cell 50 is in a state "0" having no holes in floating body region 24. A sensing circuit/read circuitry 90 typically connected to BL terminal 74 of memory array 80 (e.g., see read circuitry 90 in FIG. 18A) can then be used to determine the data state of the memory cell. Examples of the read operation is described in "A Design of a Capacitorless 1T-DRAM Cell Using Gate-Induced Drain Leakage (GIDL) Current for Low-power and High-speed Embedded Memory", and Yoshida et al., pp. 913-918, International Electron Devices Meeting, 2003 and U.S. Pat. No. 7,301,803 "Bipolar reading technique for a memory cell having an electrically floating body transistor", both of which are hereby incorporated herein, in their entireties, by reference thereto. An example of a sensing circuit is described in "An 18.5 ns 128 Mb SOI DRAM with a Floating body Cell", Ohsawa et al., pp. 458-459, 609, IEEE International Solid-State Circuits Conference, 2005, which is hereby incorporated herein, in its entirety, by reference thereto.

Figure 7:
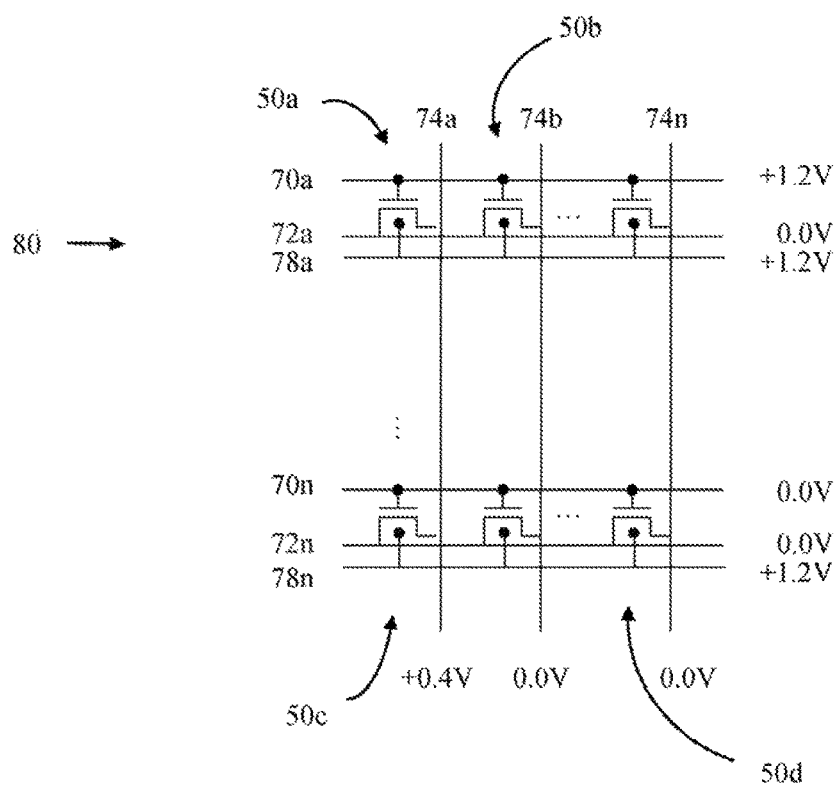
FIG. 7 shows bias conditions for a selected memory cell and unselected memory cells in a memory array according to an embodiment of the present invention.

The read operation can be performed by applying the following bias condition: a positive voltage is applied to the substrate terminal 78, zero voltage is applied to SL terminal 72, a positive voltage is applied to the selected BL terminal 74, and a positive voltage greater than the positive voltage applied to the selected BL terminal 74 is applied to the selected WL terminal 70. The unselected BL terminals will remain at zero voltage and the unselected WL terminals will remain at zero or negative voltage. In one particular non-limiting embodiment, about 0.0 volts is applied to terminal 72, about +0.4 volts is applied to the selected terminal 74, about +1.2 volts is applied to the selected terminal 70, and about +1.2 volts is applied to terminal 78. The unselected terminals 74 remain at 0.0 volts and the unselected terminals 70 remain at 0.0 volts. FIG. 7 shows the bias conditions for the selected memory cell 50a and unselected memory cells 50b, 50c, and 50d in memory array 80. However, these voltage levels may vary.

Figure 8A:
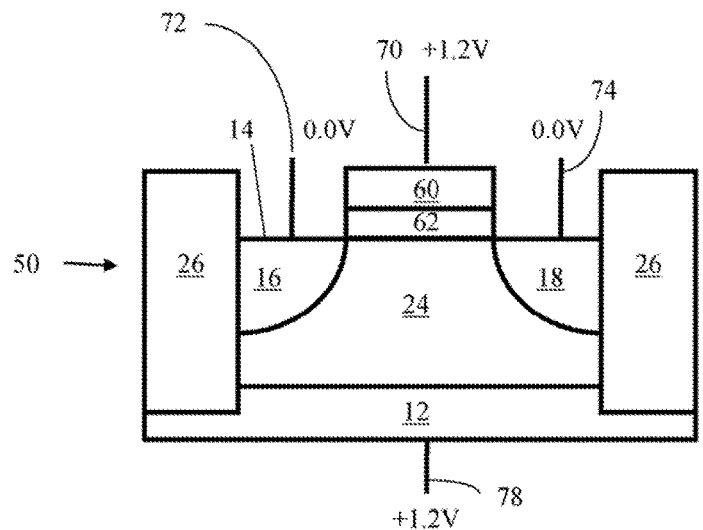
FIG. 8A illustrates an unselected memory cell sharing the same row as a selected memory cell during a read operation of the selected memory cell according to an embodiment of the present invention.
Figure 8B:
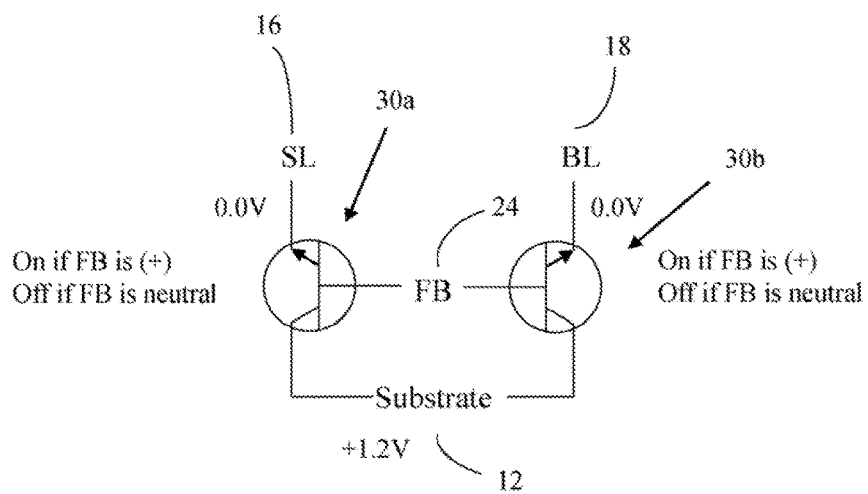
FIG. 8B illustrates the states of the n-p-n bipolar devices of the unselected memory cell of FIG. 8A during the read operation of the selected memory cell according to the embodiment of FIG. 8A.
Figure 8C:
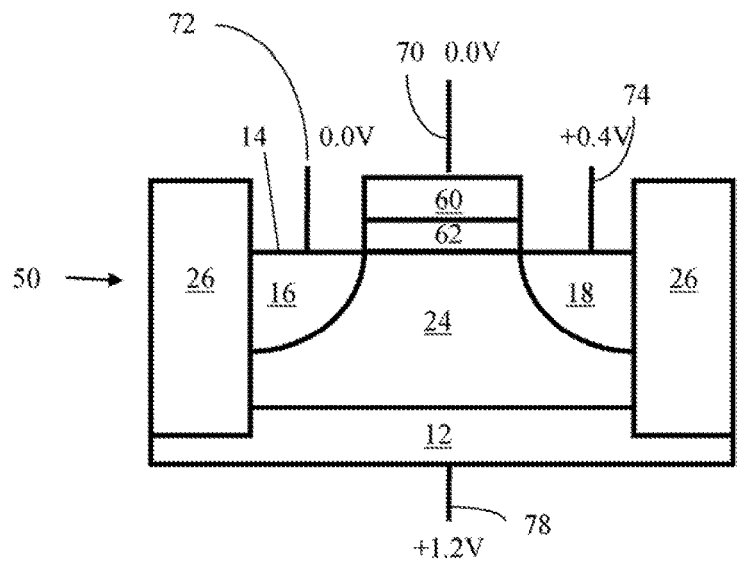
FIG. 8C illustrates an unselected memory cell sharing the same column as a selected memory cell during a read operation of the selected memory cell according to the embodiment of FIG. 8A.
Figure 8D:
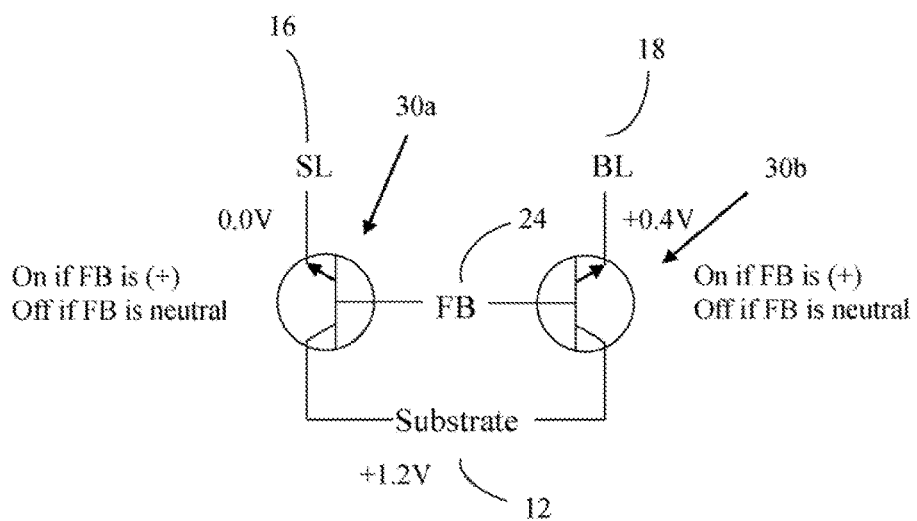
FIG. 8D illustrates the states of the n-p-n bipolar devices of the unselected memory cell of FIG. 8C during the read operation of the selected memory cell according to the embodiment of FIG. 8A.
Figure 8E:
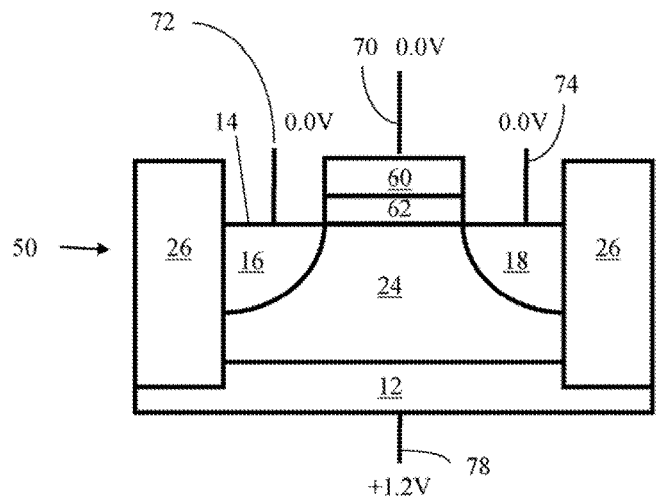
FIG. 8E illustrates an unselected memory cell that shares neither the same row nor the same column as a selected memory cell during a read operation of the selected memory cell according to the embodiment of FIG. 8A.
Figure 8F:
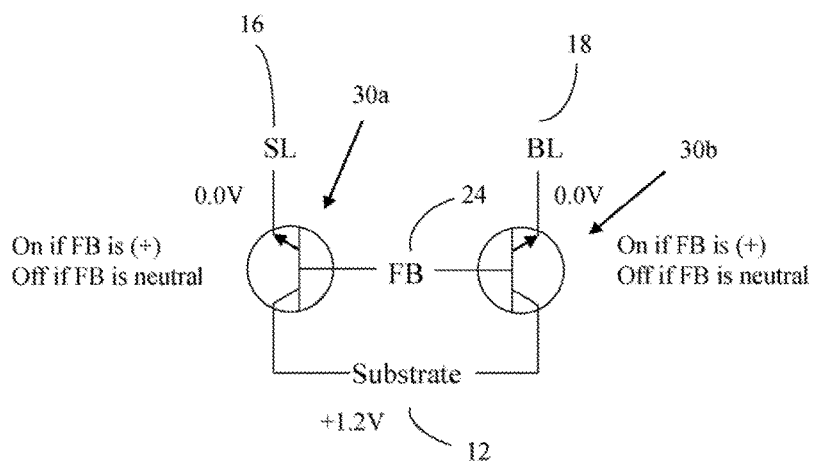
FIG. 8F illustrates the states of the n-p-n bipolar devices of the unselected memory cell of FIG. 8E during the read operation of the selected memory cell according to the embodiment of FIG. 8A.

The unselected memory cells 50 during read operations are shown in FIGS. 8A, 8C and 8E, with illustration of the states of the n-p-n bipolar devices 30a, 30b inherent in the cells 50 of FIGS. 8A, 8C and 8E in FIGS. 8B, 8D and 8F, respectively. The bias conditions for memory cells 50 sharing the same row (e.g. memory cell 50b) and those sharing the same column (e.g. memory cell 50c) as the selected memory cell 50a are shown in FIGS. 8A-8B and FIGS. 8C-8D, respectively, while the bias condition for memory cells 50 not sharing the same row or the same column as the selected memory cell 50 (e.g. memory cell 50d) is shown in FIGS. 8E-8F.

For memory cells 50 sharing the same row as the selected memory cell, both the SL terminal 72 and BL terminal 74 are at about 0.0 volts (FIGS. 8A-8B). As can be seen, these cells will be at holding mode, with memory cells in state "1" and will maintain the charge in floating body 24 because the intrinsic n-p-n bipolar devices 30a, 30b will generate hole current to replenish the charge in floating body 24; while memory cells 50 in state "0" will remain in the neutral state.

For memory cells 50 sharing the same column as the selected memory cell, a positive voltage is applied to the BL terminal 74 (FIGS. 8C-8D). However, the n-p-n bipolar device 30a formed by substrate 12, floating body 24, and region 16 will still maintain the state of the floating body 24 as the SL terminal 72 connected to region 16 is grounded.

For memory cells 50 not sharing the same row or the same column as the selected memory cell, both the SL terminal 72 and BL terminal 74 are at about 0.0 volts (FIGS. 8E-8F). As can be seen, these cells will be at holding mode, where memory cells in state "1" will maintain the charge in floating body 24 because the intrinsic n-p-n bipolar devices 30a, 30b will generate holes current to replenish the charge in floating body 24; while memory cells in state "0" will remain in the neutral state.

From the above description, it can be seen that the holding operation does not interrupt the read operation of the memory cells 50. At the same time, the unselected memory cells 50 during a read operation will remain in a holding operation.

Figure 9:
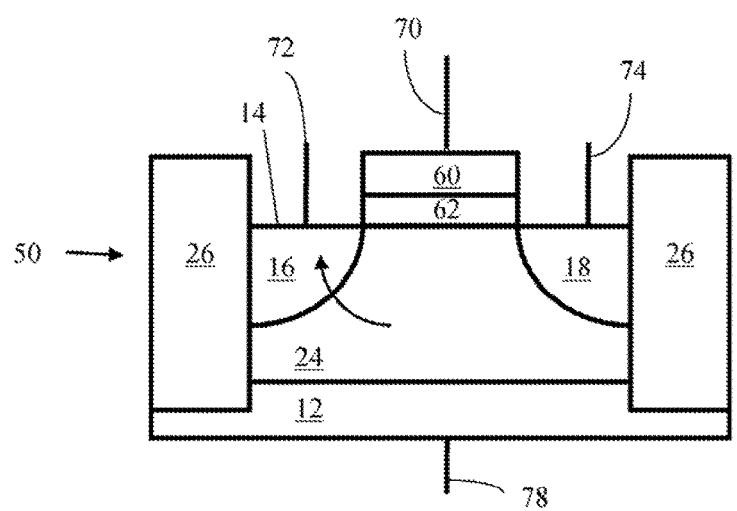
FIG. 9 is a schematic illustration of a write "0" operation to a memory cell according to an embodiment of the present invention.

Write operations of memory cell 50 are now described. A write "0" operation of the cell 50 is described with reference to FIG. 9. To write "0" to cell 50, a negative bias is applied to SL terminal 72, zero or negative voltage is applied to WL terminal 70, and zero or positive voltage is applied to substrate terminal 78. The SL terminal 72 for the unselected cells will remain grounded. Under these conditions, the p-n junction between 24 and 16 is forward-biased, evacuating any holes from the floating body 24. In one particular non-limiting embodiment, about −2.0 volts is applied to terminal 72, about 0.0 volts is applied to terminal 70, and about +1.2 volts is applied to terminal 78. However, these voltage levels may vary, while maintaining the relative relationships between the charges applied, as described above.

Figure 10:
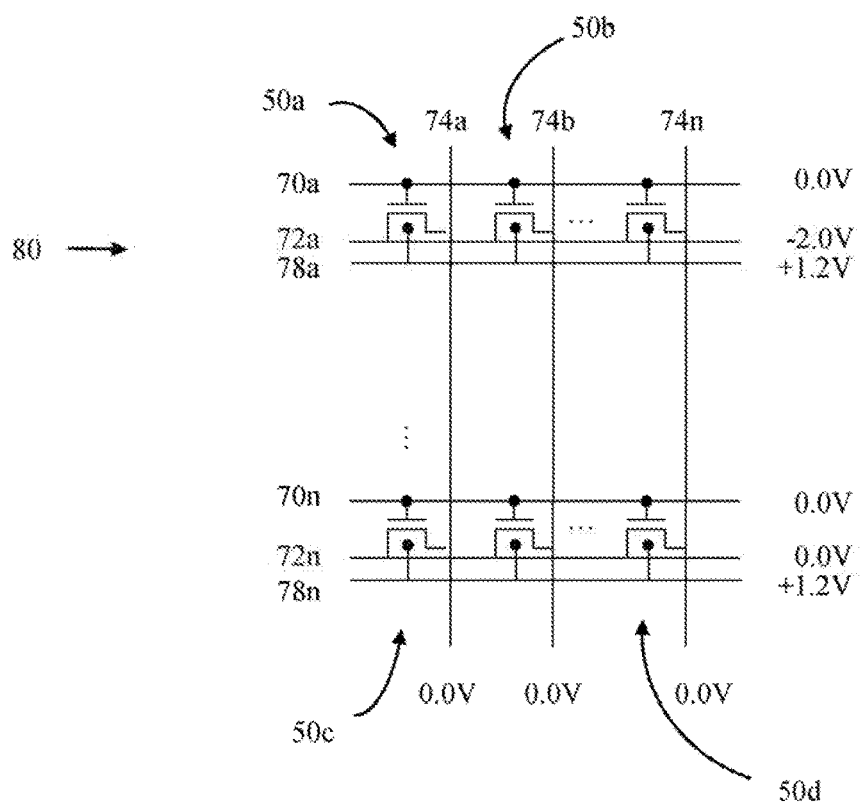
FIG. 10 shows an example of bias conditions for a selected memory cell and unselected memory cells during a write "0" operation in a memory array according to an embodiment of the present invention.

FIG. 10 shows an example of bias conditions for the selected and unselected memory cells 50 during a write "0" operation in memory array 80. For the selected memory cells, the negative bias applied to SL terminal 72 causes large potential difference between floating body 24 and region 16. Even for memory cells having a positively charged floating body 24, the hole current generated by the intrinsic n-p-n bipolar devices 30a, 30b will not be sufficient to compensate for the forward bias current of p-n diode formed by floating body 24 and junction 16.

Figure 11A:
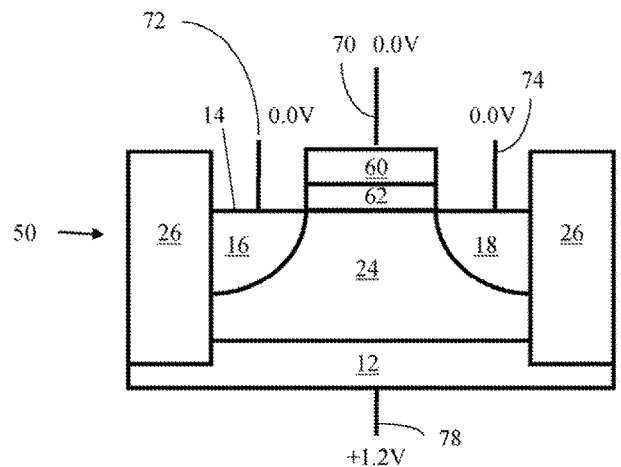
FIG. 11A illustrates an example of bias conditions on unselected memory cells during a write "0" operation according to an embodiment of the present invention.
Figure 11B:
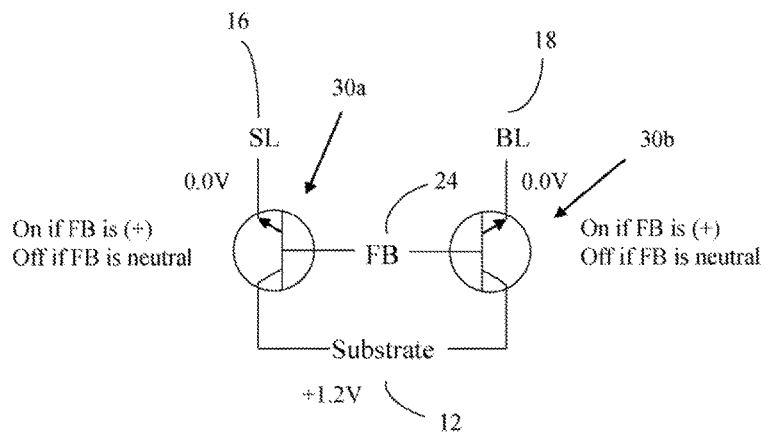
FIG. 11B shows an equivalent circuit diagram for the cell of FIG. 11A illustrating the intrinsic n-p-n bipolar devices.

An example of bias conditions and an equivalent circuit diagram illustrating the intrinsic n-p-n bipolar devices 30a, 30b of unselected memory cells 50 during write "0" operations are illustrated in FIGS. 11A-11B. Since the write "0" operation only involves applying a negative voltage to the SL terminal 72, the bias conditions for all the unselected cells are the same. As can be seen, the unselected memory cells will be in a holding operation, with both BL and SL terminals at about 0.0 volts. The positive back bias applied to the substrate terminal 78 employed for the holding operation does not interrupt the write "0" operation of the selected memory cells. Furthermore, the unselected memory cells remain in the holding operation.

The write "0" operation referred to above has a drawback in that all memory cells 50 sharing the same SL terminal will be written to simultaneously and as a result, this does not allow individual bit writing, i.e., writing to a single cell 50 memory bit. To write multiple data to different memory cells 50, write "0" is first performed on all the memory cells, followed by write "1" operations on a selected bit or selected bits.

An alternative write "0" operation that allows for individual bit writing can be performed by applying a positive voltage to WL terminal 70, a negative voltage to BL terminal 74, zero or positive voltage to SL terminal 72, and zero or positive voltage to substrate terminal 78. Under these conditions, the floating body 24 potential will increase through capacitive coupling from the positive voltage applied to the WL terminal 70. As a result of the floating body 24 potential increase and the negative voltage applied to the BL terminal 74, the p-n junction between 24 and 18 is forward-biased, evacuating any holes from the floating body 24. To reduce undesired write "0" disturb to other memory cells 50 in the memory array 80, the applied potential can be optimized as follows: if the floating body 24 potential of state "1" is referred to as $V_{FB1}$, then the voltage applied to the WL terminal 70 is configured to increase the floating body 24 potential by $V_{FB1}/2$ while $-V_{FB1}/2$ is applied to BL terminal 74. A positive voltage can be applied to SL terminal 72 to further reduce the undesired write "0" disturb on other memory cells 50 in the memory array. The unselected cells will remain at holding state, i.e. zero or negative voltage applied to WL terminal 70 and zero voltage applied to BL terminal 74.

Figure 12:
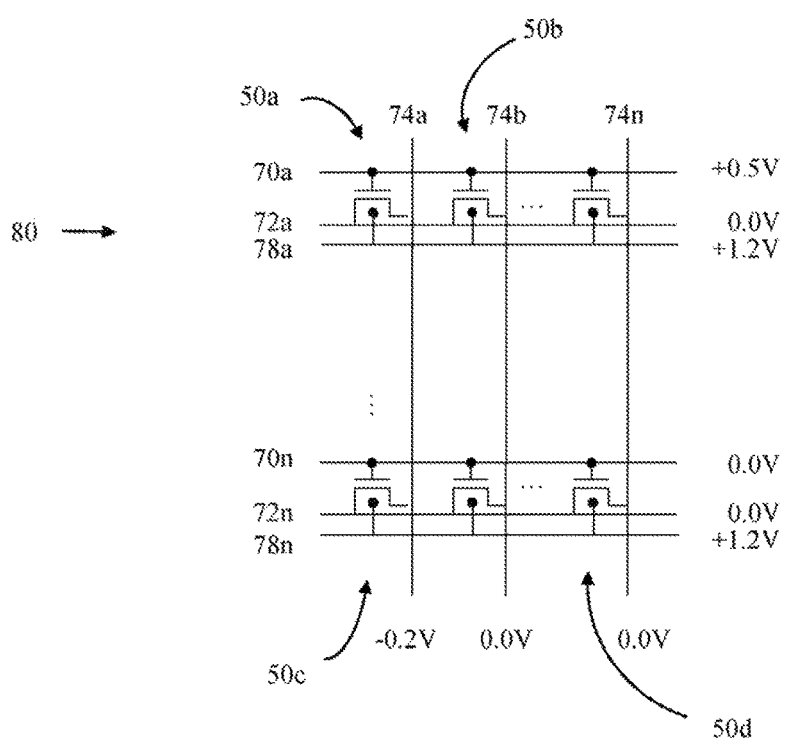
FIG. 12 shows bias conditions for selected and unselected memory cells of a memory array during a write "0" operation according to an embodiment of the present invention.

In one particular non-limiting embodiment, the following bias conditions are applied to the selected memory cell 50a:

a potential of about 0.0 volts is applied to terminal 72, a potential of about −0.2 volts is applied to terminal 74, a potential of about +0.5 volts is applied to terminal 70, and about +1.2 volts is applied to terminal 78; while about 0.0 volts is applied to terminal 72, about 0.0 volts is applied to terminal 74, about 0.0 volts is applied to terminal 70, and about +1.2 volts is applied to terminal 78 of the unselected memory cells. FIG. 12 shows the bias conditions for the selected and unselected memory cells in memory array 80. However, these voltage levels may vary.

Figure 13A:
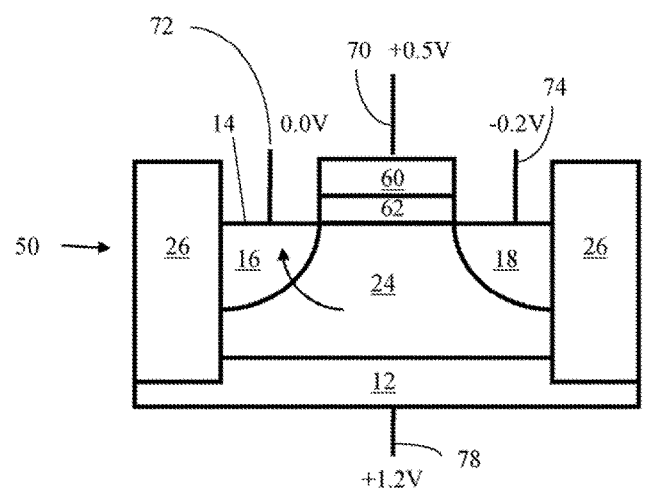
FIG. 13A illustrates an example of bias conditions on a selected memory cell during a write "0" operation according to an embodiment of the present invention.
Figure 13B:
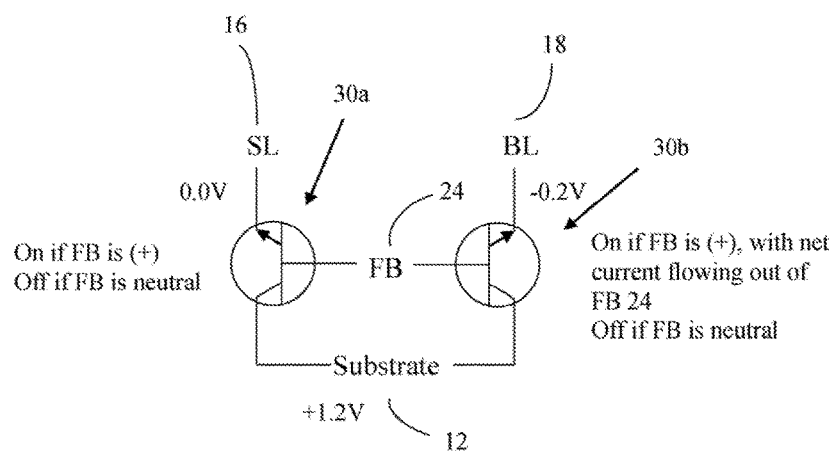
FIG. 13B shows an equivalent circuit diagram for the cell of FIG. 13A illustrating the intrinsic n-p-n bipolar devices.

The bias conditions of the selected memory cell 50*a* under write "0" operation are further elaborated and are shown in FIGS. 13A-13B. As discussed, the potential difference between floating body 24 and junction 18 (connected to BL terminal 74) is now increased, resulting in a higher forward bias current than the base hole current generated by the n-p-n bipolar devices 30*a*, 30*b* formed by substrate 12, floating body 24, and regions 16 and 18. The net result is that holes will be evacuated from floating body 24.

Figure 13C:
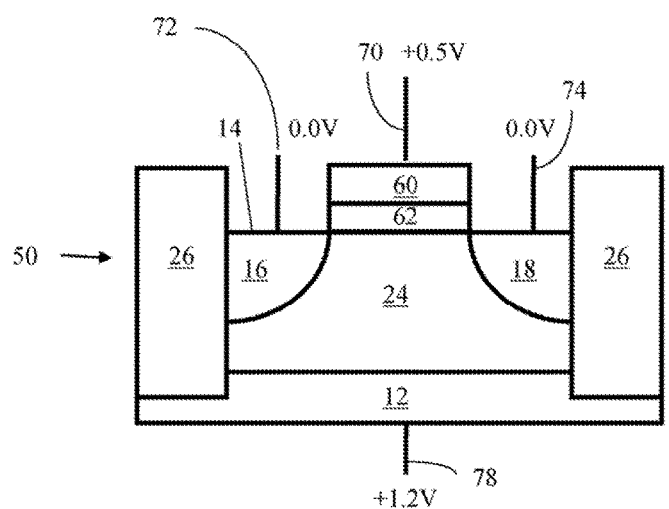
FIG. 13C illustrates an example of bias conditions on unselected memory cells sharing the same row as a selected memory cell in an array during a write "0" operation of the selected memory cell, according to the embodiment of FIG. 13A.
Figure 13D:
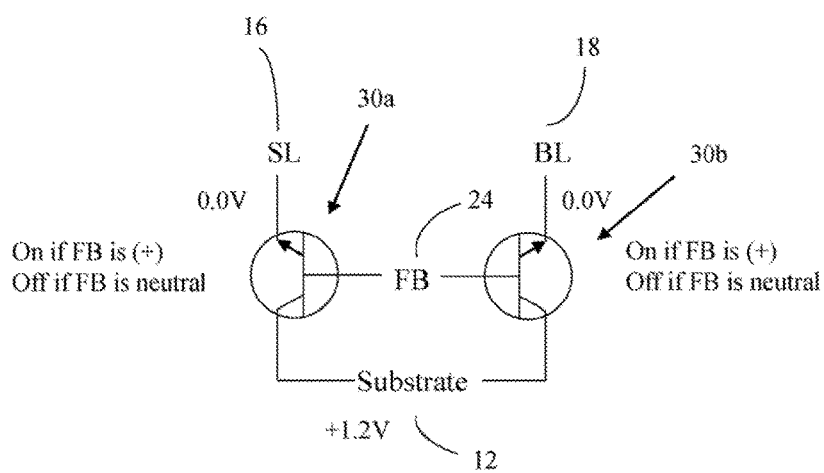
FIG. 13D shows an equivalent circuit diagram for the cell of FIG. 13C illustrating the intrinsic n-p-n bipolar devices.
Figure 13E:
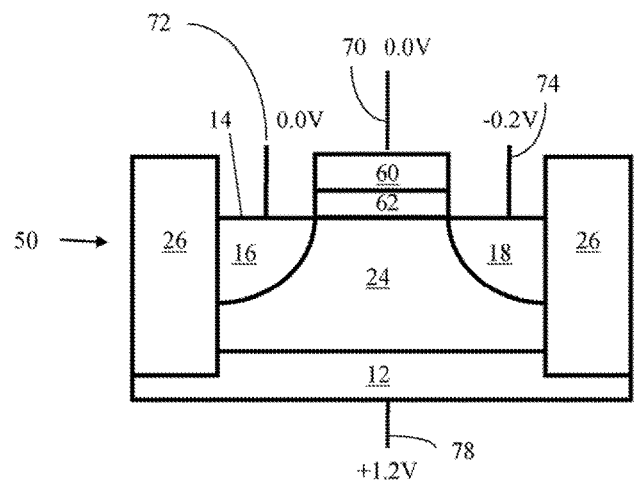
FIG. 13E illustrates an example of bias conditions on unselected memory cells sharing the same column as a selected memory cell in an array during a write "0" operation of the selected memory cell, according to the embodiment of FIG. 13A.
Figure 13F:
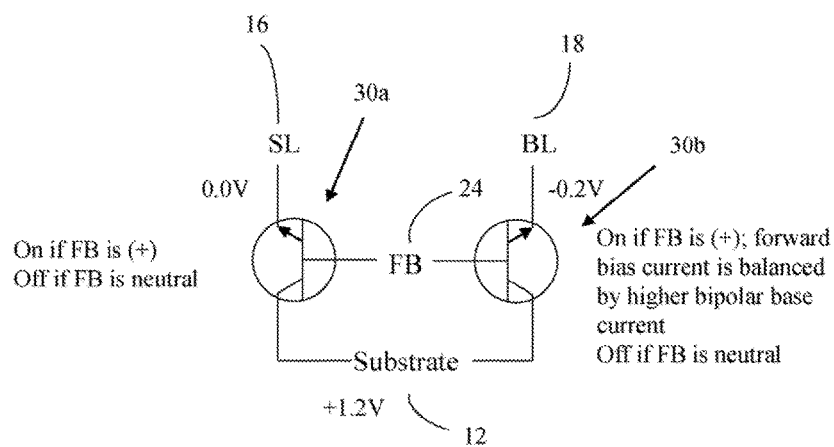
FIG. 13F shows an equivalent circuit diagram for the cell of FIG. 13E illustrating the intrinsic n-p-n bipolar devices.
Figure 13G:
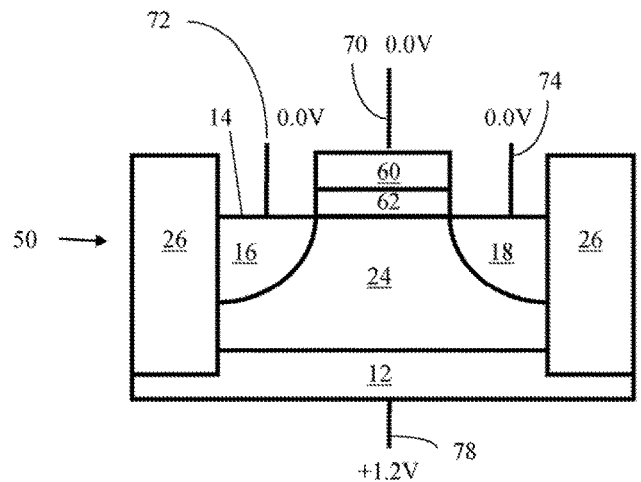
FIG. 13G illustrates an example of bias conditions on unselected memory cells that share neither the same row nor the same column as a selected memory cell in an array during a write "0" operation of the selected memory cell, according to the embodiment of FIG. 13A.
Figure 13H:
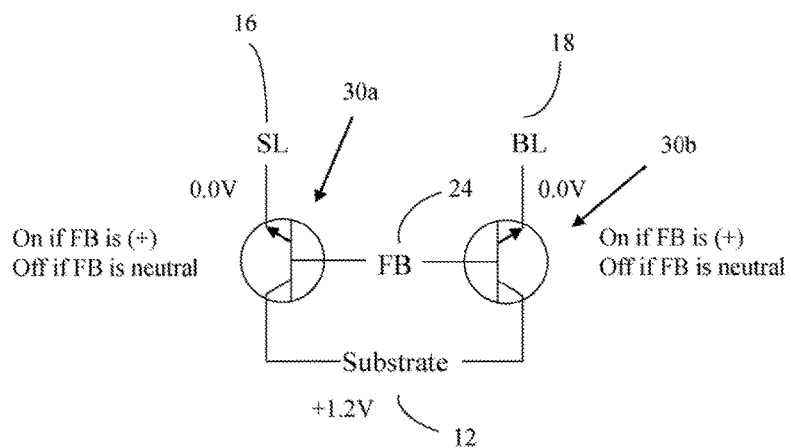
FIG. 13H shows an equivalent circuit diagram for the cell of FIG. 13G illustrating the intrinsic n-p-n bipolar devices.

The unselected memory cells 50 during write "0" operations are shown in FIGS. 13C-13H. The bias conditions for memory cells sharing the same row (e.g. memory cell 50*b*) are illustrated in FIGS. 13C-13D, and the bias conditions for memory cells sharing the same column (e.g. memory cell 50*c*) as the selected memory cell 50*a* are shown in FIGS. 13E-13F, while the bias conditions for memory cells not sharing the same row or the same column (e.g. memory cell 50*d*) as the selected memory cell 50 are shown in FIGS. 13G-13H.

For memory cells sharing the same row as the selected memory cell, both the SL terminal 72 and BL terminal 74 are at about 0.0 volts (FIGS. 13C and 13D). The floating body 24 potential of these cells will also increase due to capacitive coupling from the WL terminal 70. For memory cells in state "1", the increase in the floating body 24 potential is not sustainable as the forward bias current of the p-n diodes formed by floating body 24 and junctions 16 and 18 is greater than the base hole current generated by the n-p-n bipolar device 30 formed by substrate 12, floating body 24, and junctions 16 and 18. As a result, the floating body 24 potential will return to the initial state "1" equilibrium potential. For memory cells in state "0", if the increase in floating body 24 potential is sufficiently high (i.e., at least $V_{FB}/3$, see below), then both n-p-n bipolar devices 30*a* and 30*b* are turned on, and as a result the floating body 24 reaches a new equilibrium potential, between that of state "0" and state "1". Therefore, the WL potential needs to be optimized so that the n-p-n bipolar devices 30*a*, 30*b* will not be turned on or that the base hole current is low enough that it does not result in an increase of the floating body 24 potential over the time during which the write operation is carried out (write operation time). It has been determined by the present inventor that a floating body 24 potential increase of $V_{FB}/3$ is low enough to suppress the floating body 24 potential increase.

Accordingly, with careful design concerning the voltage applied to WL terminal 70, the states of the unselected memory cells sharing the same WL terminal (i.e. the same row) as the selected memory cells will be maintained.

For memory cells sharing the same column as the selected memory cell, a negative voltage is applied to the BL terminal 74 (see FIGS. 13E and 13F), resulting in an increase in the potential difference between floating body 24 and region 18 connected to BL terminal 74. As a result a higher forward bias current between floating body 24 and junction 18 occurs. For memory cells in state "0", the potential difference between floating body 24 and junction 18 is still sufficiently low that the p-n diode formed by floating body 24 and junction 18 is still not forward biased. Thus those memory cells will remain in state "0". For memory cells in state "1", junction leakage caused by forward bias current will increase. However, the hole current of the n-p-n bipolar device 30*b* formed by substrate 12, floating body 24, and region 18 will also increase as a result of the increase in potential difference between the substrate 12 and region 18 (the collector and emitter terminals, respectively). Hence, the floating body 24 of memory cells in state "1" will also remain positively charged (i.e., in state "1").

As to memory cells not sharing the same row or the same column as the selected memory cell, both the SL terminal 72 and BL terminal 74 are at about 0.0 volts (see FIGS. 13G and 13H). These cells will thus be in a holding mode and continue a holding operation, with memory cells in state "1" maintaining the charge in floating body 24 because the intrinsic n-p-n bipolar device 30 will generate hole current to replenish the charge in floating body 24; while memory cells in state "0" will remain in the neutral state.

Accordingly, the present invention provides for a write "0" operation that allows for bit selection. The positive bias applied to the substrate terminal 78 of the memory cells 50 is necessary to maintain the states of the unselected cells 50, especially those sharing the same row and column as the selected cells 50, as the bias conditions can potentially alter the states of the memory cells 50 without the intrinsic bipolar devices 30*a*, 30*b* (formed by substrate 12, floating body 24, and regions 16, 18, respectively) re-establishing the equilibrium condition. Also, the positive bias applied to the substrate terminal 78 employed for the holding operation does not interrupt the write "0" operation of the selected memory cell(s).

A write "1" operation can be performed on memory cell 50 through impact ionization or band-to-band tunneling mechanism, as described for example in "A Design of a Capacitorless 1T-DRAM Cell Using Gate-Induced Drain Leakage (GIDL) Current for Low-power and High-speed Embedded Memory", Yoshida et al., pp. 913-918, International Electron Devices Meeting, 2003, which was incorporated by reference above.

Figure 14:
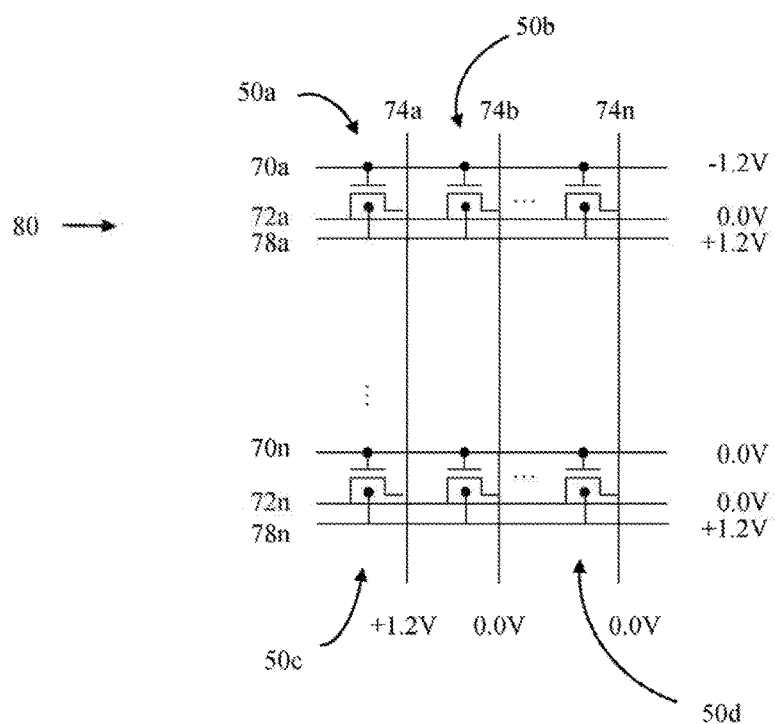
FIG. 14 illustrates an example of bias conditions of a selected memory cell and unselected memory cells in an array under a band-to-band tunneling write "1" operation of the selected cell according to an embodiment of the present invention.
Figure 15A:
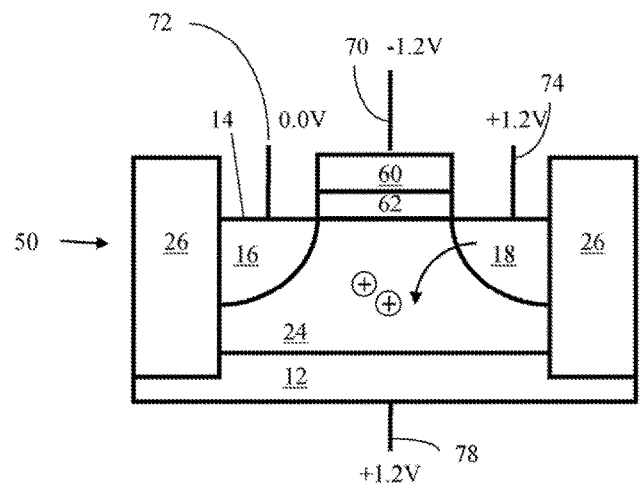
FIG. 15A illustrates an example of bias conditions on the selected memory cell of FIG. 14.
Figure 15B:
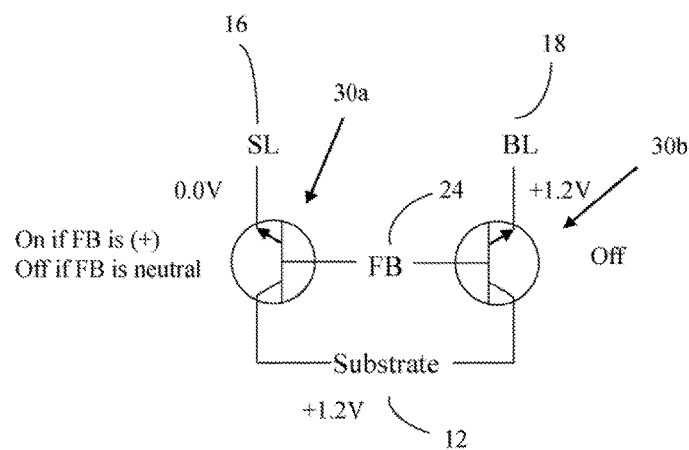
FIG. 15B shows an equivalent circuit diagram for the cell of FIG. 15A illustrating the intrinsic n-p-n bipolar devices.

An example of the bias condition of the selected memory cell 50 under band-to-band tunneling write "1" operation is illustrated in FIG. 14 and FIGS. 15A-15B. The negative bias applied to the WL terminal 70 and the positive bias applied to the BL terminal 74 results in hole injection to the floating body 24 of the selected memory cell 50. The positive bias applied to the substrate terminal 78 maintains the resulting positive charge on the floating body 24 as discussed above. The unselected cells 50 remain at the holding mode, with zero or negative voltage applied to the unselected WL terminal 70 and zero voltage is applied to the unselected BL terminal 74 to maintain the holding operation (holding mode).

In one particular non-limiting embodiment, the following bias conditions are applied to the selected memory cell 50*a*: a potential of about 0.0 volts is applied to terminal 72, a potential of about +1.2 volts is applied to terminal 74, a potential of about −1.2 volts is applied to terminal 70, and about +1.2 volts is applied to terminal 78, and the following bias conditions are applied to the unselected memory cells 50: about 0.0 volts is applied to terminal 72, about 0.0 volts is applied to terminal 74, about 0.0 volts is applied to terminal 70, and about +1.2 volts is applied to terminal 78. FIG. 14 shows the bias conditions for the selected and unselected memory cells in memory array 80. However, these voltage levels may vary.

Figure 15C:
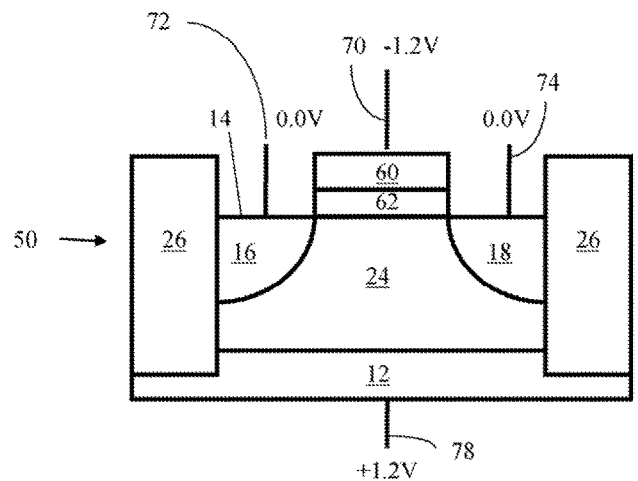
FIG. 15C illustrates an example of bias conditions on unselected memory cells sharing the same row as a selected memory cell in an array during a write "1" operation of the selected memory cell, according to the embodiment of FIG. 15A.
Figure 15D:
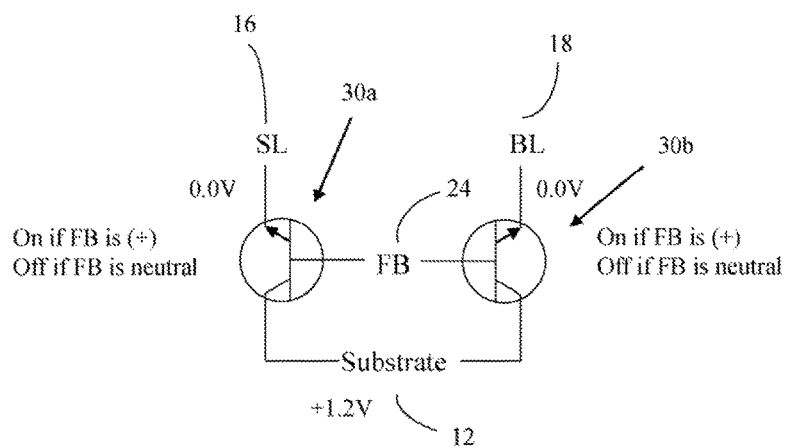
FIG. 15D shows an equivalent circuit diagram for the cell of FIG. 15C illustrating the intrinsic n-p-n bipolar devices.
Figure 15E:
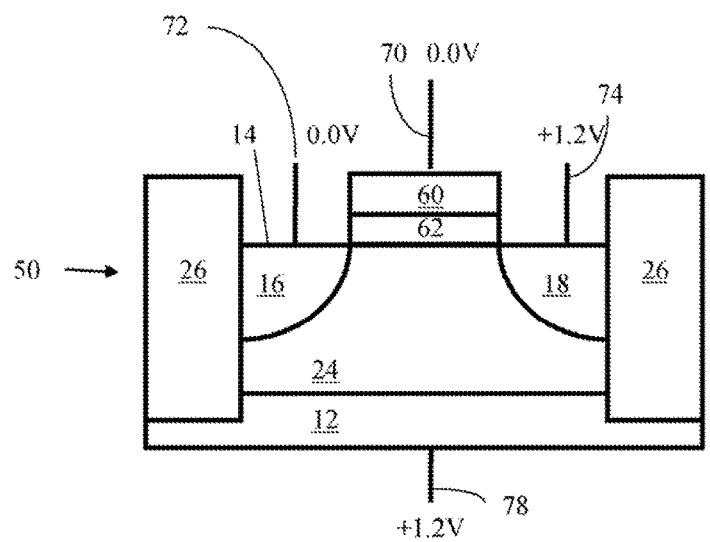
FIG. 15E illustrates an example of bias conditions on unselected memory cells sharing the same column as a selected memory cell in an array during a write "1" operation of the selected memory cell, according to the embodiment of FIG. 15A.
Figure 15F:
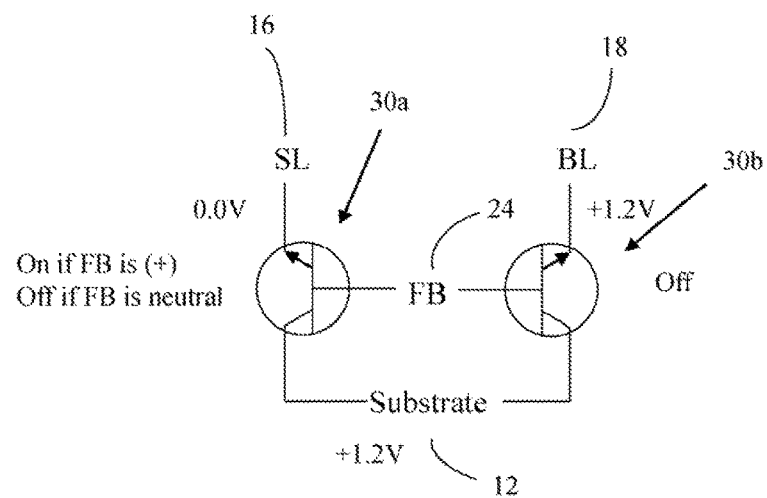
FIG. 15F shows an equivalent circuit diagram for the cell of FIG. 15E illustrating the intrinsic n-p-n bipolar devices.
Figure 15G:
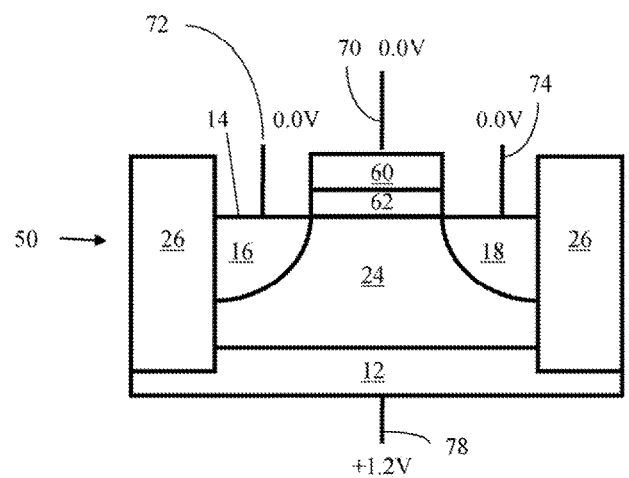
FIG. 15G illustrates an example of bias conditions on unselected memory cells that share neither the same row nor the same column as a selected memory cell in an array during a write "1" operation of the selected memory cell, according to the embodiment of FIG. 15A.
Figure 15H:
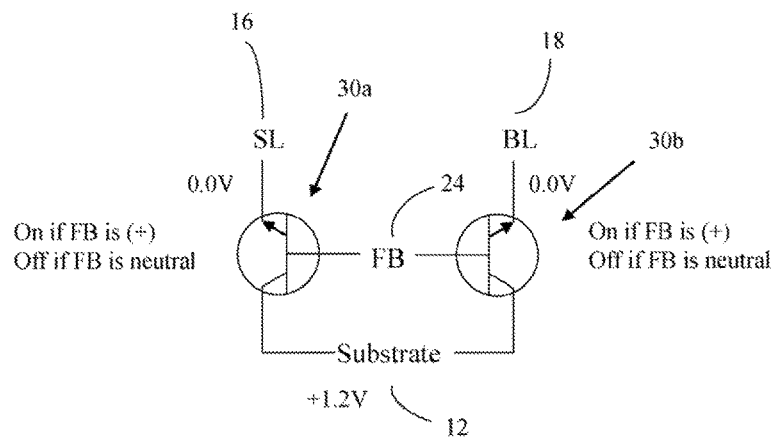
FIG. 15H shows an equivalent circuit diagram for the cell of FIG. 15G illustrating the intrinsic n-p-n bipolar devices.

The unselected memory cells during write "1" operations are shown in FIGS. 15C-15H. The bias conditions for memory cells sharing the same row (e.g. memory cell 50b) are shown in FIGS. 15C-15D and the bias conditions for memory cells sharing the same column as the selected memory cell 50a (e.g. memory cell 50c) are shown in FIGS. 15E-15F. The bias conditions for memory cells 50 not sharing the same row or the same column as the selected memory cell 50a (e.g. memory cell 50d) are shown in FIGS. 15G-15H.

For memory cells sharing the same row as the selected memory cell, both the SL terminal 72 and BL terminal 74 are at about 0.0 volts, with the WL terminal 70 at zero or negative voltage (FIGS. 15C-15D). Comparing with the holding operation bias condition, it can be seen that cells sharing the same row (i.e. the same WL terminal 70) are in holding mode. As a result, the states of these memory cells will remain unchanged.

For memory cells sharing the same column as the selected memory cell, a positive voltage is applied to the BL terminal 74. As a result, the bipolar device 30b formed by substrate 12, floating body 24, and region 18 connected to BL terminal 74 will be turned off because of the small voltage difference between the substrate terminal 78 and BL terminal 74 (the collector and emitter terminals, respectively). However, the bipolar device 30a formed by substrate 12, floating body 24, and region 16 connected to SL terminal 72 will still generate base hole current for memory cells in state "1" having positive charge in floating body 24. Memory cells in state "0" will remain in state "0" as this bipolar device 30a (formed by substrate 12, floating body 24, and region 16) is off.

For memory cells not sharing the same row or the same column as the selected memory cell, both the SL terminal 72 and BL terminal 74 are at about 0.0 volts (see FIGS. 15G-15H). As can be seen, these cells will be in a holding operation (holding mode), where memory cells in state "1" will maintain the charge in floating body 24 because the intrinsic n-p-n bipolar devices 30a, 30b will generate hole current to replenish the charge in floating body 24; while memory cells in state "0" will remain in the neutral state.

Thus the positive bias applied to the substrate terminal 78 employed for the holding operation does not interrupt the write "1" operation of the selected memory cell(s). At the same time, the unselected memory cells during write "1" operation will remain in holding operation.

A multi-level write operation can be performed using an alternating write and verify algorithm, where a write pulse is first applied to the memory cell 50, followed by a read operation to verify if the desired memory state has been achieved. If the desired memory state has not been achieved, another write pulse is applied to the memory cell 50, followed by another read verification operation. This loop is repeated until the desired memory state is achieved.

For example, using band-to-band tunneling hot hole injection, a positive voltage is applied to BL terminal 74, zero voltage is applied to SL terminal 72, a negative voltage is applied to WL terminal 70, and a positive voltage is applied to the substrate terminal 78. Positive voltages of different amplitude are applied to BL terminal 74 to write different states to floating body 24. This results in different floating body potentials 24 corresponding to the different positive voltages or the number of positive voltage pulses that have been applied to BL terminal 74. By applying positive voltage to substrate terminal 78, the resulting floating body 24 potential is maintained through base hole current flowing into floating body 24. In one particular non-limiting embodiment, the write operation is performed by applying the following bias condition: a potential of about 0.0 volts is applied to terminal 72, a potential of about −1.2 volts is applied to terminal 70, and about +1.2 volts is applied to terminal 78, while the potential applied to BL terminal 74 is incrementally raised. For example, in one non-limiting embodiment 25 millivolts is initially applied to BL terminal 74, followed by a read verify operation. If the read verify operation indicates that the cell current has reached the desired state (i.e., cell current corresponding to whichever of 00, 01, 10 or 11 is desired is achieved), then the multi write operation is commenced. If the desired state is not achieved, then the voltage applied to BL terminal 74 is raised, for example, by another 25 millivolts, to 50 millivolts. This is subsequently followed by another read verify operation, and this process iterates until the desired state is achieved. However, the voltage levels described may vary. The write operation is followed by a read operation to verify the memory state.

The write-then-verify algorithm is inherently slow since it requires multiple write and read operations. The present invention provides a multi-level write operation that can be performed without alternate write and read operations. This is accomplished by ramping the voltage applied to BL terminal 74, while applying zero voltage to SL terminal 72, a positive voltage to WL terminal 70, and a positive voltage to substrate terminal 78 of the selected memory cells. The unselected memory cells will remain in holding mode, with zero or negative voltage applied to WL terminal 70 and zero voltage applied to BL terminal 74. These bias conditions will result in a hole injection to the floating body 24 through impact ionization mechanism. The state of the memory cell 50 can be simultaneously read for example by monitoring the change in the cell current through a read circuitry 90 (FIGS. 16A-16C) coupled to the source line 72. The cell current measured in the source line direction is a cumulative cell current of all memory cells 50 which share the same source line 72 (see FIGS. 16A-16C). As a result, only one memory cell 50 sharing the same source line 72 can be written. This ensures that the change in the cumulative cell current is a result of the write operation on the selected memory cell 50.

Figure 17:
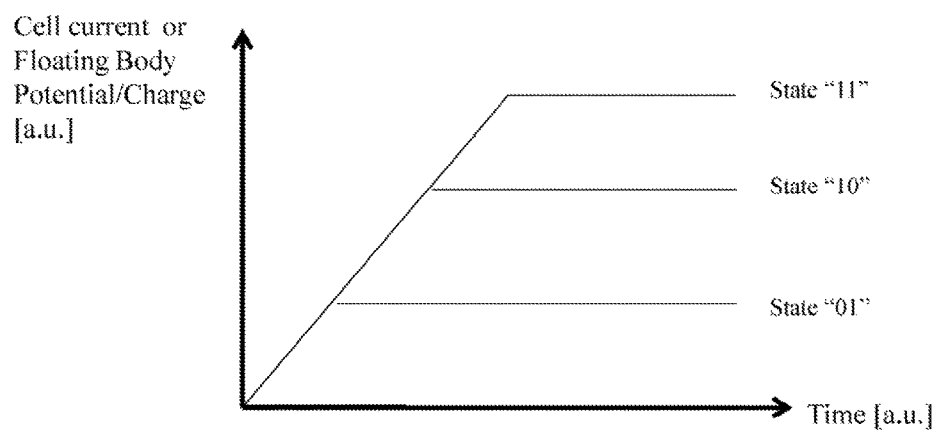
FIG. 17 graphically illustrates that the potential of the floating body of a memory cell will increase over time as bias conditions are applied that will result in hole injection to the floating body, according to an embodiment of the present invention.

As shown in FIG. 17, the potential of the floating body 24 increases over time as these bias conditions result in hole injection to floating body 24 through an impact ionization mechanism. Once the change in cell current reaches the desired level associated with a state of the memory cell 50, the voltage applied to BL terminal 74 can be removed. By applying a positive voltage (back bias) to substrate terminal 78, the resulting floating body 24 potential is maintained through base hole current flowing into floating body 24. In this manner, the multi-level write operation can be performed without alternate write and read operations.

Figure 16A:
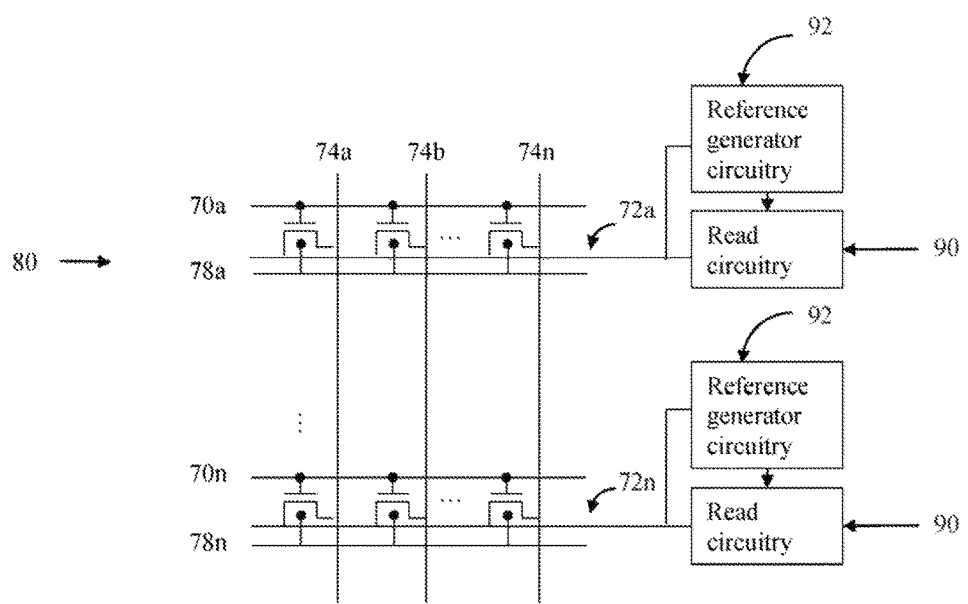
FIG. 16A shows a reference generator circuit which serves to generate the initial cumulative cell current of the memory cells sharing the same source line being written, according to an embodiment of the present invention.
Figure 16B:
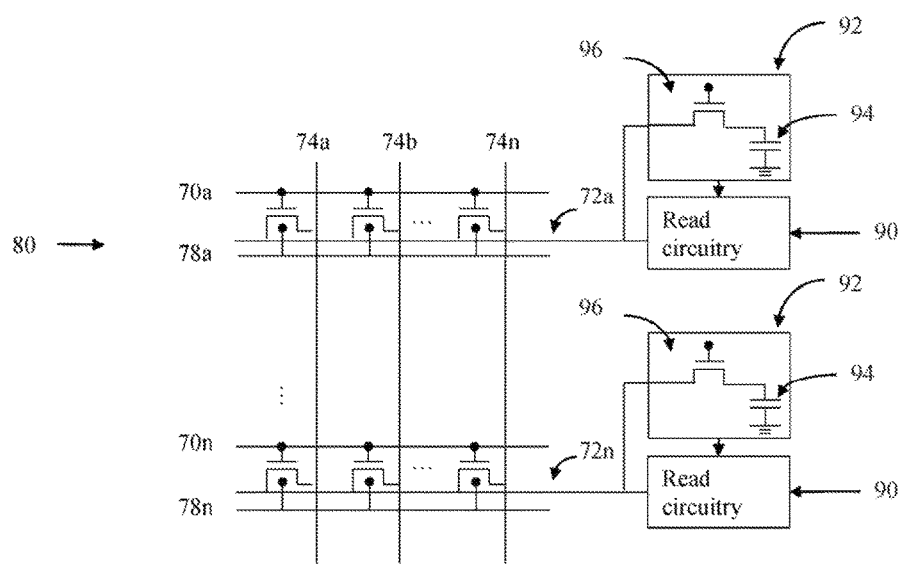
FIG. 16B shows a reference generator circuit which serves to generate the initial cumulative cell current of the memory cells sharing the same source line being written, according to another embodiment of the present invention.
Figure 16C:
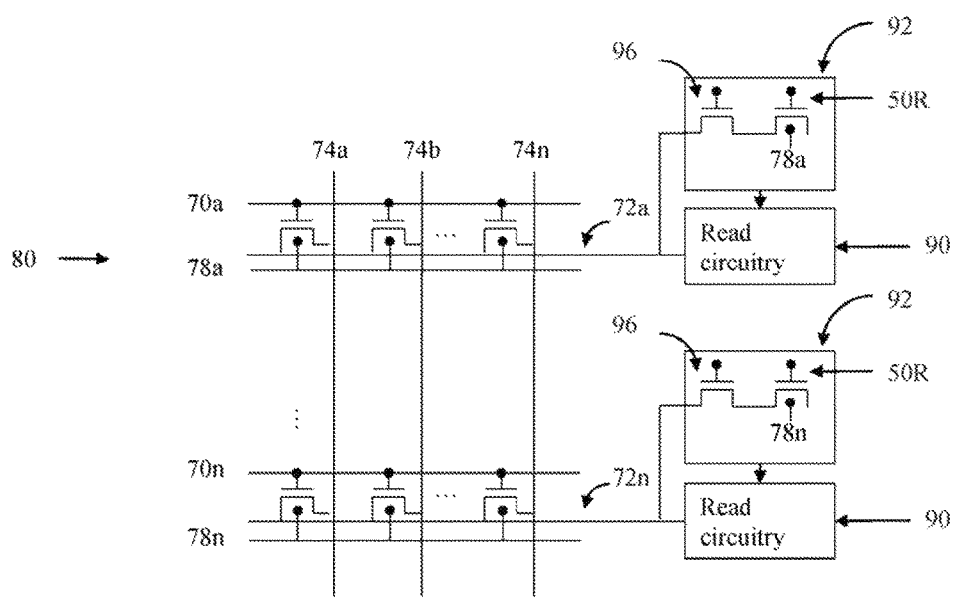
FIG. 16C shows a reference generator circuit which serves to generate the initial cumulative cell current of the memory cells sharing the same source line being written, according to another embodiment of the present invention.

FIGS. 16A-16C also show a reference generator circuit 92, which serves to generate the initial cumulative cell current of the memory cells 50 sharing the same source line 72 being written. For example, the cumulative charge of the initial state for all memory cells 50 sharing the same source line 72 can be stored in a capacitor 94 (see FIG. 16B). Transistor 96 is turned on when charge is to be written into or read from capacitor 94. Alternatively, a reference cell 50R (FIG. 16C) similar to a memory cell 50 can also be used to store the initial state. Using a similar principle, a write operation is performed on the reference cell 50R using the cumulative cell current from the source line 72. Transistor 96 is turned on when a write operation is to be performed on the reference cell 50R. A positive bias is also applied to the substrate of the reference cell to maintain its state. The size of the reference cell 50R needs to be configured such that it is able to store the maximum cumulative charge of all the memory cells 50, i.e. when all of the memory cells 50 sharing the same source line 72 are positively charged.

In a similar manner, a multi-level write operation using an impact ionization mechanism can be performed by ramping the write current applied to BL terminal 74 instead of ramping the BL terminal 74 voltage.

In yet another embodiment, a multi-level write operation can be performed through a band-to-band tunneling mechanism by ramping the voltage applied to BL terminal 74, while applying zero voltage to SL terminal 72, a negative voltage to WL terminal 70, and zero or positive voltage to substrate terminal 78 of the selected memory cells 50. The unselected memory cells 50 will remain in holding mode, with zero or negative voltage applied to WL terminal 70 and zero voltage applied to BL terminal 74. Optionally, multiple BL terminals 74 can be simultaneously selected to write multiple cells in parallel. The potential of the floating body 24 of the selected memory cell(s) 50 will increase as a result of the band-to-band tunneling mechanism. The state of the selected memory cell(s) 50 can be simultaneously read for example by monitoring the change in the cell current through a read circuitry 90 coupled to the source line. Once the change in the cell current reaches the desired level associated with a state of the memory cell, the voltage applied to BL terminal 74 can be removed. If positive voltage is applied to substrate terminal 78, the resulting floating body 24 potential is maintained through base hole current flowing into floating body 24. In this manner, the multi-level write operation can be performed without alternate write and read operations.

Similarly, the multi-level write operation using band-to-band tunneling mechanism can also be performed by ramping the write current applied to BL terminal 74 instead of ramping the voltage applied to BL terminal 74.

Figure 18A:
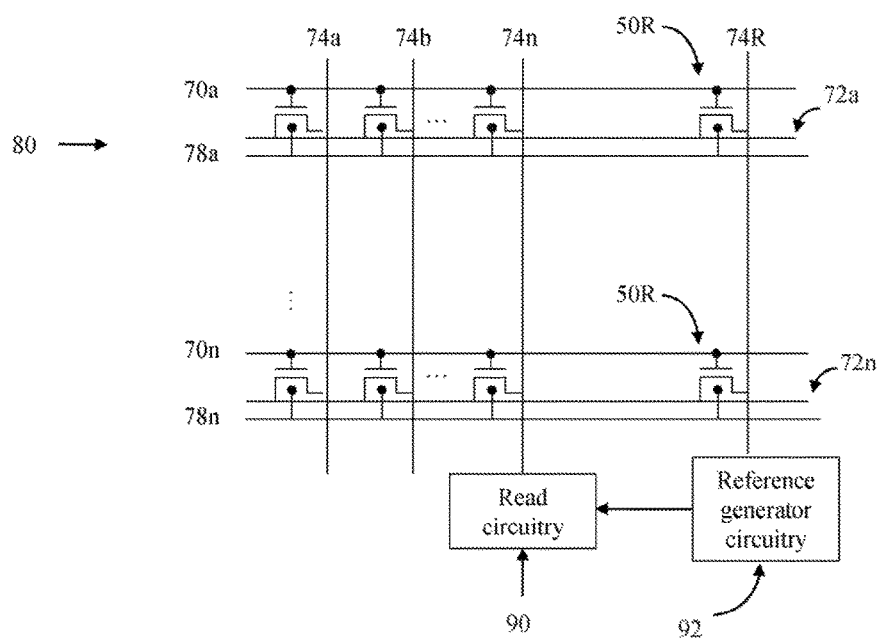
FIG. 18A schematically illustrates reference generator circuitry and read circuitry connected to a memory array according to an embodiment of the present invention.

In another embodiment, a read while programming operation can be performed by monitoring the change in cell current in the bit line direction through a reading circuitry 90 coupled to the bit line 74 as shown in FIG. 18A. Reference cells 50R representing different memory states are used to verify the state of the write operation The reference cells 50R can be configured through a write-then-verify operation for example when the memory device is first powered up.

Figure 18B:
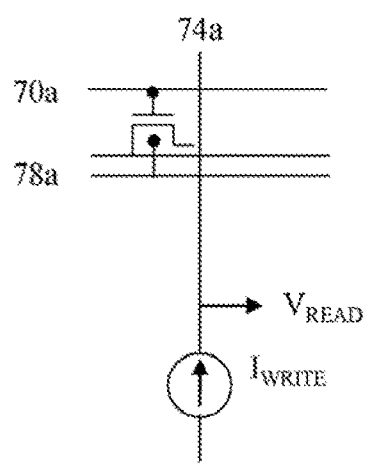
FIG. 18B shows a schematic of a voltage sensing circuitry configured to measure the voltage across the source line and the bit line terminals of a memory cell according to an embodiment of the present invention.

In the voltage ramp operation, the resulting cell current of the memory cell 50 being written is compared to the reference cell 50R current by means of the read circuitry 90. During this read while programming operation, the reference cell 50R is also being biased at the same bias conditions applied to the selected memory cell 50 during the write operation. Therefore, the write operation needs to be ceased after the desired memory state is achieved to prevent altering the state of the reference cell 50R. For the current ramp operation, the voltage at the bit line 74 can be sensed instead of the cell current. The bit line voltage can be sensed for example using a voltage sensing circuitry (see FIG. 18B) as described in "VLSI Design of Non-Volatile Memories", Campardo G. et al., 2005, which is hereby incorporated herein, in its entirety, by reference thereto.

An example of a multi-level write operation without alternate read and write operations, using a read while programming operation/scheme in the bit line direction is given, where two bits are stored per memory cell 50, requiring four states to be storable in each memory cell 50. With increasing charge in the floating body 24, the four states are referred to as states "00", "01", "10", and "11". To program a memory cell 50 to a state "01", the reference cell 50R corresponding to state "01" is activated. Subsequently, the bias conditions described above are applied both to the selected memory cell 50 and to the "01" reference cell 50R: zero voltage is applied to the source line terminal 72, a positive voltage is applied to the substrate terminal 78, a positive voltage is applied to the WL terminal 70 (for the impact ionization mechanism), while the BL terminal 74 is being ramped up, starting from zero voltage. Starting the ramp voltage from a low voltage (i.e. zero volts) ensures that the state of the reference cell 50R does not change.

The voltage applied to the BL terminal 74 is then increased. Consequently, holes are injected into the floating body 24 of the selected cell 50 and subsequently the cell current of the selected cell 50 increases. Once the cell current of the selected cell 50 reaches that of the "01" reference cell, the write operation is stopped by removing the positive voltage applied to the BL terminal 74 and WL terminal 70.

As was noted above, a periodic pulse of positive voltage can be applied to substrate terminal 78, as opposed to applying a constant positive bias, to reduce the power consumption of the memory cell 50. The memory cell 50 operations during the period where the substrate terminal 78 is being grounded are now briefly described. During the period when the substrate terminal 78 is grounded, the memory cells 50 connected to a ground substrate terminal 78 are no longer in holding mode. Therefore the period during which the substrate terminal is grounded must be shorter than the charge retention time period of the floating body, to prevent the state of the floating body from changing when the substrate terminal is grounded. The charge lifetime (i.e., charge retention time period) of the floating body 24 without use of a holding mode has been shown to be on the order of milliseconds, for example, see "A Scaled Floating Body Cell (FBC) Memory with High-k+Metal Gate on Thin-Silicon and Thin-BOX for 16-nm Technology Node and Beyond", Ban et al., pp. 92-92, Symposium on VLSI Technology, 2008, which is hereby incorporated herein, in its entirety, by reference thereto. The state of the memory cell 50 can be maintained by refreshing the charge stored in floating body 24 during the period over which the positive voltage pulse is applied to the back bias terminal (i.e., substrate terminal 78).

Figure 19:
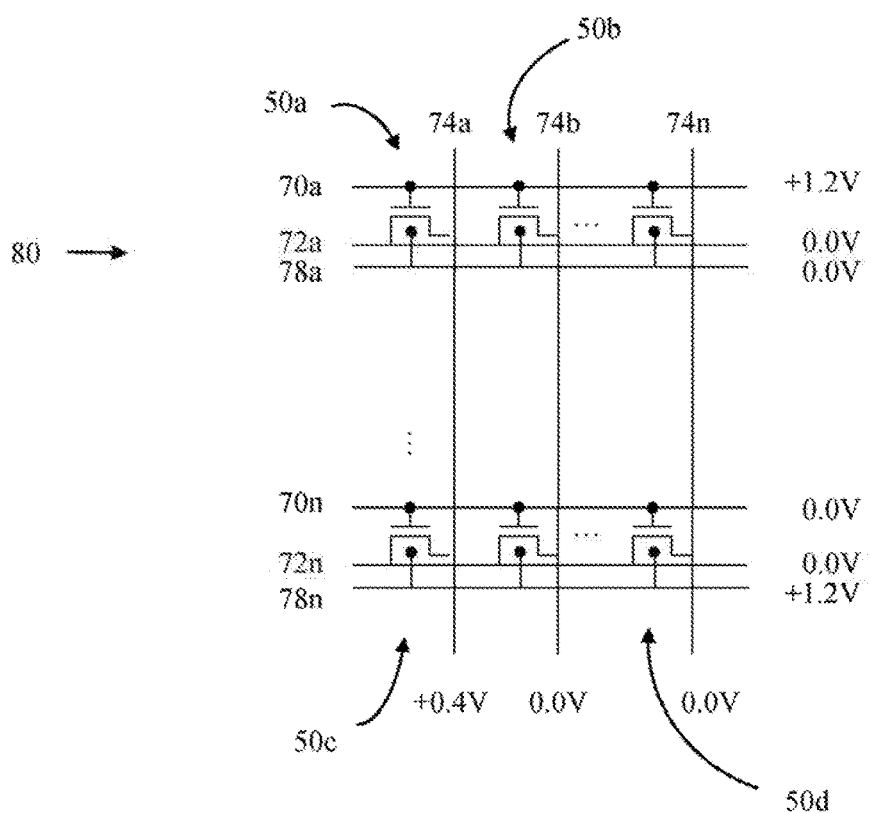
FIG. 19 illustrates bias conditions on a selected cell and unselected cells of an array during a read operation on the selected cell according to an embodiment of the present invention.

A read operation can be performed by applying the following bias conditions: zero voltage is applied to the substrate terminal 78, zero voltage is applied to SL terminal 72, a positive voltage is applied to the selected BL terminal 74, and a positive voltage greater than the positive voltage applied to the selected BL terminal 74 is applied to the selected WL terminal 70. The unselected BL terminals 74 will remain at zero voltage and the unselected WL terminals 70 will remain at zero or negative voltage. If the substrate terminals 78 are segmented (as for example shown in FIGS. 4A-4C), a positive voltage can be applied to the unselected substrate terminals 78. In one particular non-limiting embodiment, about 0.0 volts is applied to terminal 72, about +0.4 volts is applied to the selected terminal 74, about +1.2 volts is applied to the selected terminal 70, and about 0.0 volts is applied to terminal 78. The unselected terminals 74 remain at 0.0 volts and the unselected terminals 70 remain at 0.0 volts. The unselected terminals 78 (in the case where the substrate terminals 78 are segmented as in FIGS. 4A and 4B) can remain at +1.2 volts (see FIG. 19). Because the read operation is carried out over a time period on the order of nanoseconds, it is of a much shorter duration than the charge lifetime (charge retention time period) of the floating body 24 unassisted by a holding operation. Accordingly, the performance of a read operation does not affect the states of the memory cells connected to the terminal 78 as it is momentarily (on the order of nanoseconds) grounded.

Figure 20:
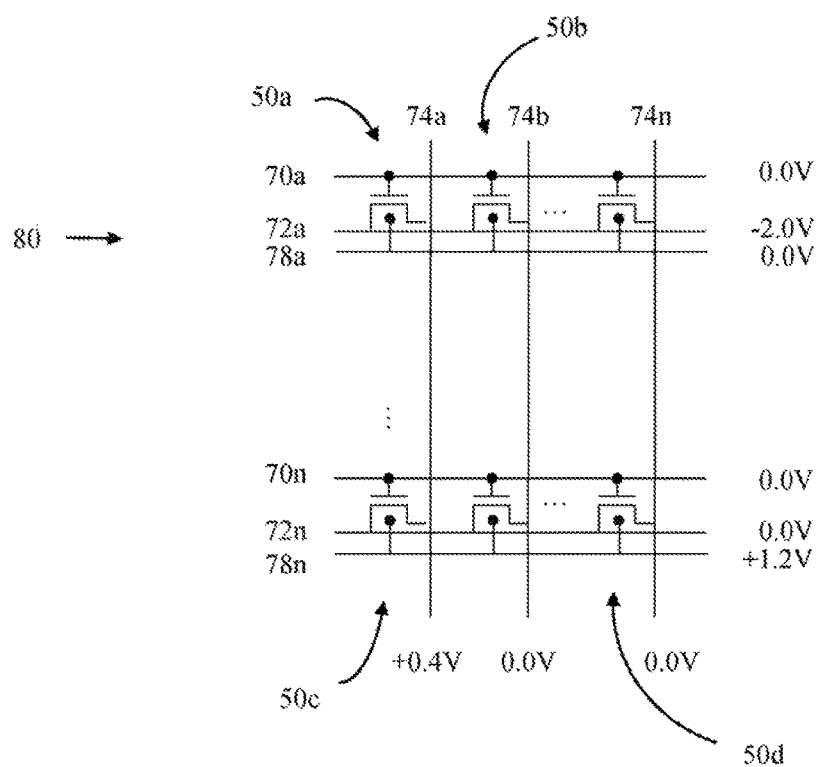
FIG. 20 illustrates bias conditions on a selected cell and unselected cells of an array during a write "0" operation on the selected cell according to an embodiment of the present invention.

A write "0" operation of the cell 50 can be performed by applying the following bias conditions: a negative bias is applied to SL terminal 72, zero or negative voltage is applied to WL terminal 70, and zero voltage is applied to substrate terminal 78. The SL terminal 72 for the unselected cells will remain grounded. If the substrate terminals 78 are segmented (as for example shown in FIGS. 4A-4C), a positive voltage can be applied to the unselected substrate terminals 78. Under these conditions, the p-n junction between 24 and 16 is forward-biased, evacuating any holes from the floating body 24. In one particular non-limiting embodiment, about −2.0 volts is applied to terminal 72, about 0.0 volts is applied to terminal 70, and about 0.0 volts is applied to terminal 78. The unselected terminals 78 (in the case where the substrate terminals 78 are segmented as in FIGS. 4A and 4B) can remain at +1.2 volts. With the substrate terminal 78 being grounded, there is no bipolar hole current flowing to the floating body 24. As a result, the write "0" operation will also require less time. Because the write "0" operation is brief, occurring over a time period on the order of nanoseconds, it is of much shorter duration than the charge retention time period of the floating body 24, unassisted by a holding operation. Accordingly, the write "0" operation does not affect the states of the unselected memory cells 50 connected to the terminal 78 being momentarily grounded to perform the write "0" operation. The bias conditions applied to the memory array 80 are shown in FIG. 20. However, these voltage levels may vary, while maintaining the relative relationships between the charges applied, as described above.

Figure 21:
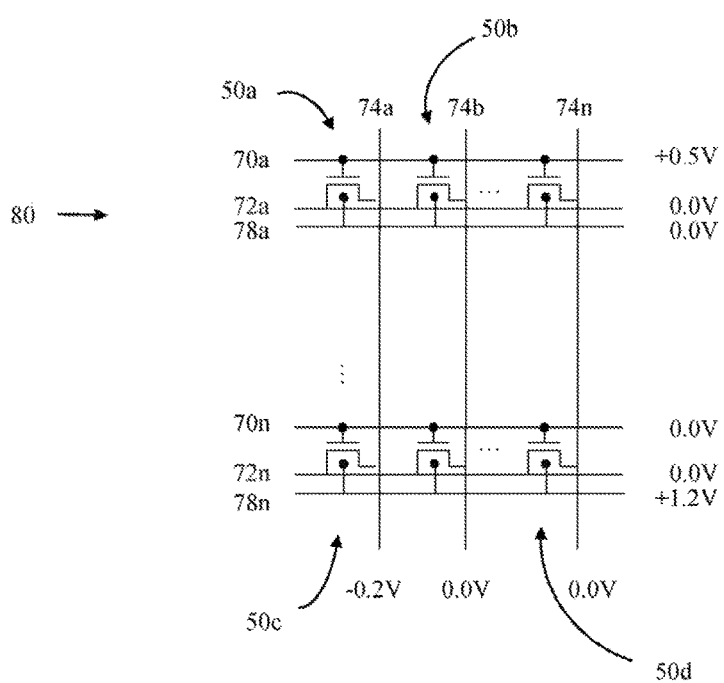
FIG. 21 illustrates bias conditions on a selected cell and unselected cells of an array during a write "0" operation on the selected cell according to another embodiment of the present invention.

An example of the bias conditions for an alternative write "0" operation which allows for individual bit write is shown in FIG. 21. The following conditions are applied to selected memory cell 50: a positive voltage to WL terminal 70, a negative voltage to BL terminal 74, zero or positive voltage to SL terminal 72, and zero voltage to substrate terminal 78. Under these conditions, the floating body 24 potential will increase through capacitive coupling from the positive voltage applied to the WL terminal 70. As a result of the floating body 24 potential increase and the negative voltage applied to the BL terminal 74, the p-n junction between 24 and 18 is forward-biased, evacuating any holes from the floating body 24. To reduce undesired write "0" disturb to other memory cells in the memory array sharing the same row or column as the selected memory cell, the applied potential can be optimized as follows: if the floating body 24 potential of state "1" is referred to as $V_{FB1}$, then the voltage applied to the WL terminal 70 is configured to increase the floating body 24 potential by $V_{FB1}/2$ while $-V_{FB1}/2$ is applied to BL terminal 74. A positive voltage can be applied to SL terminal 72 to further reduce the undesired write "0" disturb on other memory cells 50 in the memory array that doe not share the same common SL terminal 72 as the selected memory cell. The unselected cells will remain at holding state, i.e. zero or negative voltage applied to WL terminal 70, zero voltage applied to BL terminal 74, and positive voltage applied to substrate terminal 78 (in the case the substrate terminals 78 are segmented as for example shown in FIGS. 4A-4C). Because the write "0" operation is brief, occurring over a time period on the order of nanoseconds, it is of much shorter duration than the charge retention time period of the floating body 24, unassisted by a holding operation. Accordingly, the write "0" operation does not affect the states of the unselected memory cells 50 connected to the terminal 78 being momentarily grounded to perform the write "0" operation.

Still referring to FIG. 21, in one particular non-limiting embodiment, the following bias conditions are applied to the selected memory cell 50a: a potential of about 0.0 volts is applied to terminal 72a, a potential of about −0.2 volts is applied to terminal 74a, a potential of about +0.5 volts is applied to terminal 70a, and about 0.0 volts is applied to terminal 78a; while about 0.0 volts is applied to terminal 72n and the other SL terminals not connected to the selected cell 50a, about 0.0 volts is applied to terminal 74n and the other BL terminals not connected to the selected cell 50a, about 0.0 volts is applied to terminal 70n and the other WL terminals not connected to the selected cell 50a, and about +1.2 volts is applied to terminal 78n and the other substrate terminals not connected to the selected cell 50a. However, these voltage levels may vary.

Figure 22:
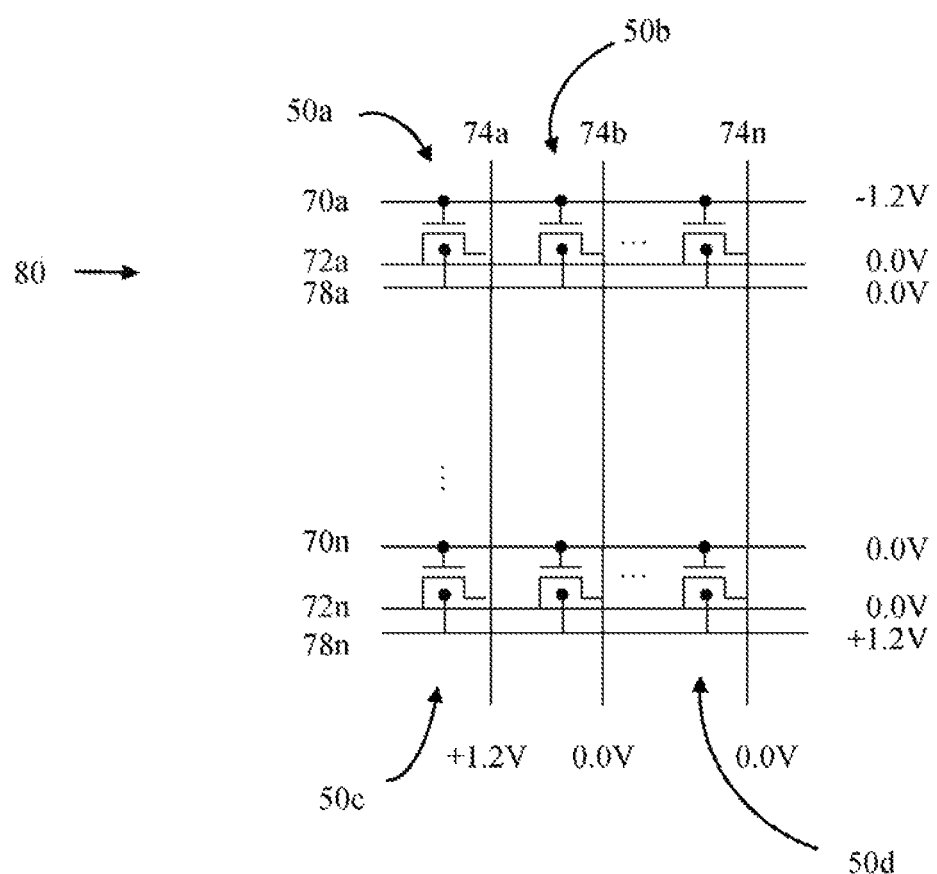
FIG. 22 illustrates bias conditions on a selected cell and unselected cells of an array during a bend-to-band tunneling write "1" operation on the selected cell according to another embodiment of the present invention.

An example of the bias conditions applied to the memory array 80 under a band-to-band tunneling write "1" operation to cell 50a is shown in FIG. 22, where a negative bias is applied to WL terminal 70a, a positive bias is applied to BL terminal 74a, zero voltage is applied to SL terminal 72a, and zero voltage is applied to substrate terminal 78a. The negative bias applied to the WL terminal 70a and the positive bias applied to the BL terminal 74a will result in hole injection to the floating body 24 of the selected memory cell 50a. The unselected cells 50 will remain at the holding mode, with zero or negative voltage applied to the unselected WL terminals 70 (in this case, terminal 70n and any other WL terminal 70 not connected to selected cell 50a) and zero voltage is applied to the unselected BL terminals 74 (in this case, terminals 74b, 74n and any other BL terminal 74 not connected to selected cell 50a) and positive voltage applied to unselected substrate terminals 78 (in the case the substrate terminals 78 are segmented as for example shown in FIGS. 4A and 4B; and, in FIG. 22, to terminals 78n and any other substrate terminals 78 not connected to selected cell 50a).

Still referring to FIG. 22, in one particular non-limiting embodiment, the following bias conditions are applied to the selected memory cell 50a: a potential of about 0.0 volts is applied to terminal 72a, a potential of about +1.2 volts is applied to terminal 74a, a potential of about −1.2 volts is applied to terminal 70a, and about 0.0 volts is applied to terminal 78a; while about 0.0 volts is applied to the unselected terminals 72 (defined in the preceding paragraph), about 0.0 volts is applied to unselected terminals 74 (defined in the preceding paragraph), about 0.0 volts is applied to unselected terminals 70 (defined in the preceding paragraph), and about +1.2 volts is applied to unselected substrate terminals 78 (defined in the preceding paragraph) of the unselected memory cells. However, these voltage levels may vary.

Figure 23A:
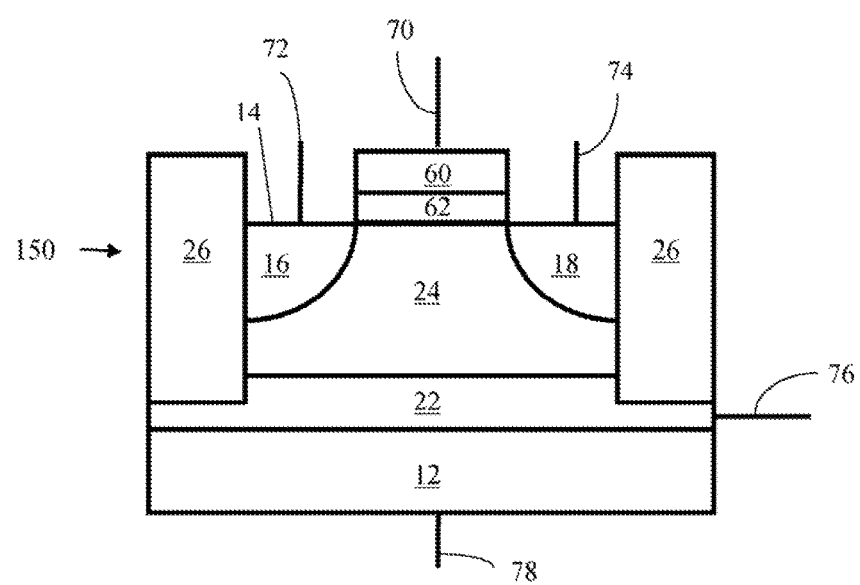
FIG. 23A is a schematic illustration of a memory cell according to another embodiment of the present invention.

FIG. 23A shows another embodiment of a memory cell 150 according to the present invention. The cell 150 includes a substrate 12 of a first conductivity type, such as a p-type conductivity type, for example. Substrate 12 is typically made of silicon, but may comprise germanium, silicon germanium, gallium arsenide, carbon nanotubes, or other semiconductor materials known in the art. The substrate 12 has a surface 14. A first region 16 having a second conductivity type, such as n-type, for example, is provided in substrate 12 and is exposed at surface 14. A second region 18 having the second conductivity type is also provided in substrate 12, and is also exposed at surface 14. Second region 18 is spaced apart from the first region 16, as shown.

First and second regions 16 and 18 may be formed by an implantation process on the material making up substrate 12, according to any of implantation processes known and typically used in the art. Alternatively, a solid state diffusion process may be used to form first and second regions 16 and 18.

Figure 24:
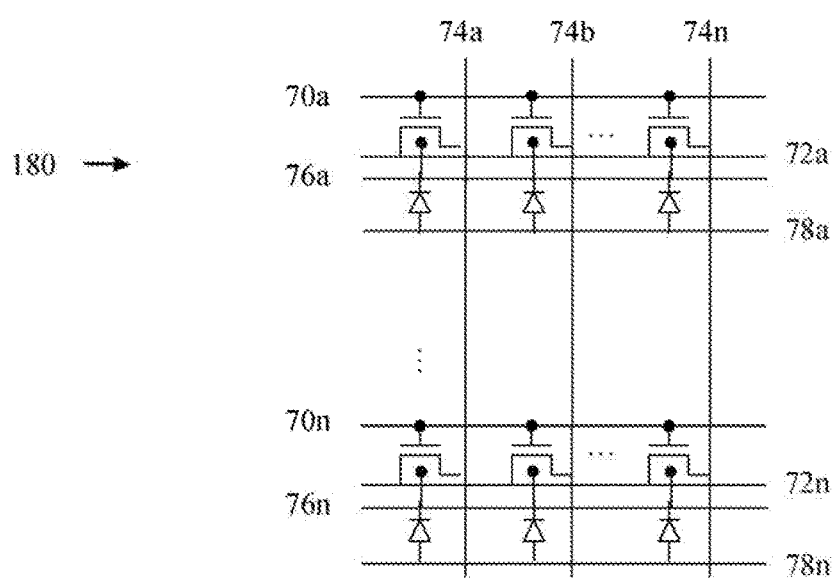
FIG. 24 schematically illustrates an array of memory cells of the type illustrated in FIG. 23.

A buried layer 22 of the second conductivity type is also provided in the substrate 12, buried in the substrate 12, as shown. Buried layer 22 may also be formed by an ion implantation process on the material of substrate 12. Alternatively, buried layer 22 can be grown epitaxially. A floating body region 24 of the substrate 12 having a first conductivity type, such as a p-type conductivity type, is bounded by surface, first and second regions 16,18, insulating layers 26 and buried layer 22. Insulating layers 26 (e.g., shallow trench isolation (STI)), may be made of silicon oxide, for example. Insulating layers 26 insulate cell 150 from neighboring cells 150 when multiple cells 150 are joined in an array 180 to make a memory device as illustrated in FIG. 24. A gate 60 is positioned in between the regions 16 and 18, and above the surface 14. The gate 60 is insulated from surface 14 by an insulating layer 62. Insulating layer 62 may be made of silicon oxide and/or other dielectric materials, including high-K dielectric materials, such as, but not limited to, tantalum peroxide, titanium oxide, zirconium oxide, hafnium oxide, and/or aluminum oxide. The gate 60 may be made of polysilicon material or metal gate electrode, such as tungsten, tantalum, titanium and their nitrides.

Figure 23B:
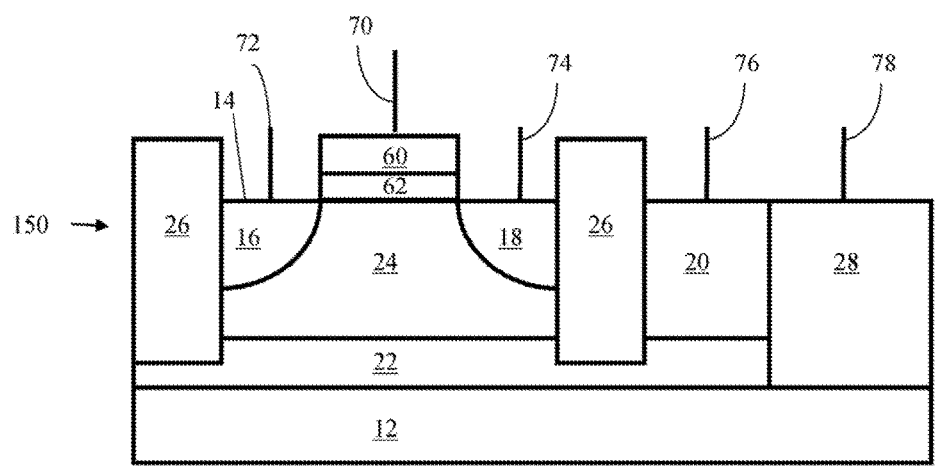
FIG. 23B is a schematic illustration of a memory cell according to another embodiment of the present invention showing contacts to the buried well and substrate regions.

Cell 150 further includes word line (WL) terminal 70 electrically connected to gate 60, source line (SL) terminal 72 electrically connected to one of regions 16 and 18 (connected to 16 as shown, but could, alternatively, be connected to 18), bit line (BL) terminal 74 electrically connected to the other of regions 16 and 18, buried well (BW) terminal 76 electrically connected to buried layer 22, and substrate terminal 78 electrically connected to substrate 12 at a location beneath buried layer 22. Contact to buried well region can alternatively be made through region 20 having a second conductivity type, and which is electrically connected to buried well region 22, while contact to substrate region 12 can alternatively be made through region 28 having a first conductivity type, and which is electrically connected to substrate region 12, as shown in FIG. 23B.

In another embodiment, the memory cell 150 may be provided with p-type conductivity type as the first conductivity type and n-type conductivity type as the second conductivity type.

Figure 25:
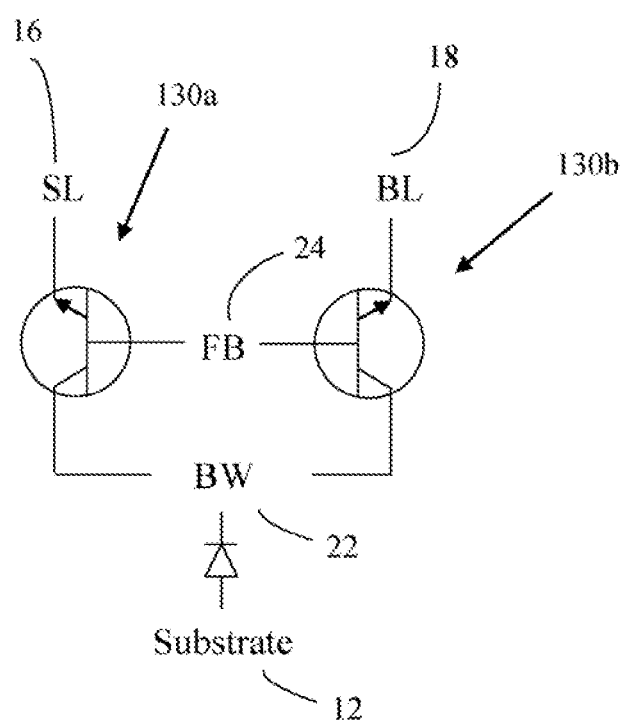
FIG. 25 schematically illustrates n-p-n bipolar devices inherent in the cell of FIG. 23.

As shown in FIG. 25, inherent in this embodiment of the memory cell 150 are n-p-n bipolar devices 130a, 130b formed by buried well region 22, floating body 24, and SL and BL regions 16, 18. The memory cell operations will be described as follows. As will be seen, the operation principles of this embodiment of the memory cell 150 will follow the descriptions above, where the bias applied on the n-type substrate terminal 78 for the above described memory cell 50 is now applied to the n-type buried well terminal 76 of cell 150. The p-type substrate 12 of the current embodiment of the memory cell 150 will be grounded, reverse biasing the p-n junction between substrate 12 and buried well layer 22, thereby preventing any leakage current between substrate 12 and buried well layer 22.

A holding operation can be performed by applying a positive back bias to the BW terminal 76 while grounding terminal 72 and/or terminal 74. If floating body 24 is positively charged (i.e. in a state "1"), the bipolar transistor formed by SL region 16, floating body 24, and buried well region 22 and bipolar transistor formed by BL region 18, floating body 24, and buried well region 22 will be turned on.

A fraction of the bipolar transistor current will then flow into floating region 24 (usually referred to as the base current) and maintain the state "1" data. The efficiency of the holding operation can be enhanced by designing the bipolar devices 130a, 130b formed by buried well layer 22, floating region 24, and regions 16/18 to be a low-gain bipolar device, where the bipolar gain is defined as the ratio of the collector current flowing out of BW terminal 76 to the base current flowing into the floating region 24.

For memory cells in state "0" data, the bipolar devices 130a, 130b will not be turned on, and consequently no base hole current will flow into floating region 24. Therefore, memory cells in state "0" will remain in state "0".

The holding operation can be performed in mass, parallel manner as the BW terminal 76 (functioning as back bias terminal) is typically shared by all the cells 150 in the memory array 180, or at least by multiple cells 150 in a segment of the array 180. The BW terminal 76 can also be segmented to allow independent control of the applied bias on a selected portion of the memory array 180. Also, because BW terminal 76 is not used for memory address selection, no memory cell access interruption occurs due to the holding operation.

An example of the bias conditions applied to cell 150 to carry out a holding operation includes: zero voltage is applied to BL terminal 74, zero voltage is applied to SL terminal 72, zero or negative voltage is applied to WL terminal 70, a positive voltage is applied to the BW terminal 76, and zero voltage is applied to substrate terminal 78. In one particular non-limiting embodiment, about 0.0 volts is applied to terminal 72, about 0.0 volts is applied to terminal 74, about 0.0 volts is applied to terminal 70, about +1.2 volts is applied to terminal 76, and about 0.0 volts is applied to terminal 78. However, these voltage levels may vary.

Figure 26:
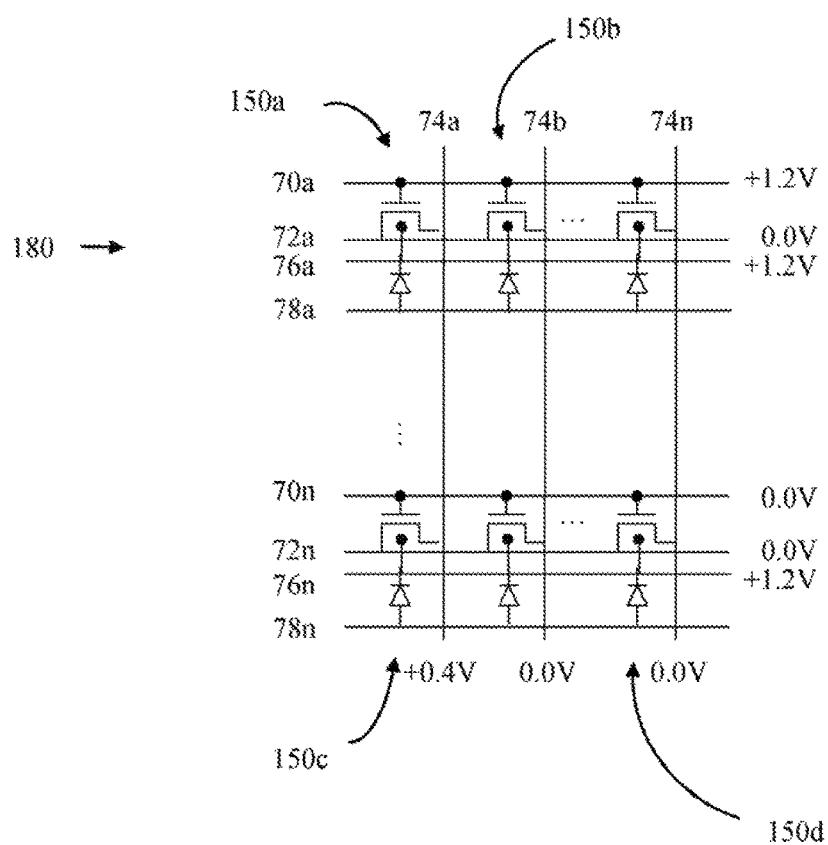
FIG. 26 illustrates an example of bias conditions on a array during performance of a read operation on a selected cell according to an embodiment of the present invention.

A read operation can be performed on cell 150 by applying the following bias conditions: a positive voltage is applied to the BW terminal 76, zero voltage is applied to SL terminal 72, a positive voltage is applied to the selected BL terminal 74, and a positive voltage greater than the positive voltage applied to the selected BL terminal 74 is applied to the selected WL terminal 70, while zero voltage is applied to substrate terminal 78. When cell 150 is in an array 180 of cells 150, the unselected BL terminals 74 (e.g., 74b, . . . , 74n) will remain at zero voltage and the unselected WL terminals 70 (e.g., 70n and any other WL terminals 70 not connected to selected cell 150a) will remain at zero or negative voltage. In one particular non-limiting embodiment, about 0.0 volts is applied to terminal 72, about +0.4 volts is applied to the selected terminal 74a, about +1.2 volts is applied to the selected terminal 70a, about +1.2 volts is applied to terminal 76, and about 0.0 volts is applied to terminal 78, as illustrated in FIG. 26. The unselected terminals 74 remain at 0.0 volts and the unselected terminal 70 remain at 0.0 volts as illustrated in FIG. 26. However, these voltage levels may vary while maintaining the relative relationships between voltage levels as generally described above. As a result of the bias conditions applied as described, the unselected memory cells (150b, 150c and 150d) will be at holding mode, maintaining the states of the respective floating bodies 24 thereof. Furthermore, the holding operation does not interrupt the read operation of the selected memory cell 150a.

To write "0" to cell 150, a negative bias is applied to SL terminal 72, zero or negative voltage is applied to WL terminal 70, zero or positive voltage is applied to BW terminal 76, and zero voltage is applied to substrate terminal 78. The SL terminal 72 for the unselected cells 150 that are not commonly connected to the selected cell 150a will remain grounded. Under these conditions, the p-n junctions (junction between 24 and 16 and between 24 and 18) are forward-biased, evacuating any holes from the floating body 24. In one particular non-limiting embodiment, about −2.0 volts is applied to terminal 72, about −1.2 volts is applied to terminal 70, about +1.2 volts is applied to terminal 76, and about 0.0 volts is applied to terminal 78. However, these voltage levels may vary, while maintaining the relative relationships between the charges applied, as described above.

The bias conditions for all the unselected cells are the same since the write "0" operation only involves applying a negative voltage to the SL terminal 72 (thus to the entire row). As can be seen, the unselected memory cells will be in holding operation, with both BL and SL terminals at about 0.0 volts.

Thus, the holding operation does not interrupt the write "0" operation of the memory cells. Furthermore, the unselected memory cells will remain in holding operation during a write "0" operation.

An alternative write "0" operation, which, unlike the previous write "0" operation described above, allows for individual bit write, can be performed by applying a positive voltage to WL terminal 70, a negative voltage to BL terminal 74, zero or positive voltage to SL terminal 72, zero or positive voltage to BW terminal 76, and zero voltage to substrate terminal 78. Under these conditions, the floating body 24 potential will increase through capacitive coupling from the positive voltage applied to the WL terminal 70. As a result of the floating body 24 potential increase and the negative voltage applied to the BL terminal 74, the p-n junction (junction between 24 and 16) is forward-biased, evacuating any holes from the floating body 24. The applied bias to selected WL terminal 70 and selected BL terminal 74 can potentially affect the states of the unselected memory cells 150 sharing the same WL or BL terminal as the selected memory cell 150. To reduce undesired write "0" disturb to other memory cells 150 in the memory array 180, the applied potential can be optimized as follows: If the floating body 24 potential of state "1" is referred to as $V_{FB1}$, then the voltage applied to the WL terminal 70 is configured to increase the floating body 24 potential by $V_{FB1}/2$ while $-V_{FB1}/2$ is applied to BL terminal 74. This will minimize the floating body 24 potential change in the unselected cells 150 in state "1" sharing the same BL terminal as the selected cell 150 from $V_{FB1}$ at to $V_{FB1}/2$. For memory cells 150 in state "0" sharing the same WL terminal as the selected cell 150, if the increase in floating body 24 potential is sufficiently high (i.e., at least $V_{FB}/3$, see below), then both n-p-n bipolar devices 130a and 130b will not be turned on or so that the base hold current is low enough that it does not result in an increase of the floating body 24 potential over the time during which the write operation is carried out (write operation time). It has been determined according to the present invention that a floating body 24 potential increase of $V_{FB}/3$ is low enough to suppress the floating body 24 potential increase. A positive voltage can be applied to SL terminal 72 to further reduce the undesired write "0" disturb on other memory cells 150 in the memory array. The unselected cells will remain at holding state, i.e. zero or negative voltage applied to WL terminal 70 and zero voltage applied to BL terminal 74. The unselected cells 150 not sharing the same WL or BL terminal as the selected cell 150 will remain at holding state, i.e., with zero or negative voltage applied to unselected WL terminal and zero voltage applied to unselected BL terminal 74.

Figure 27:
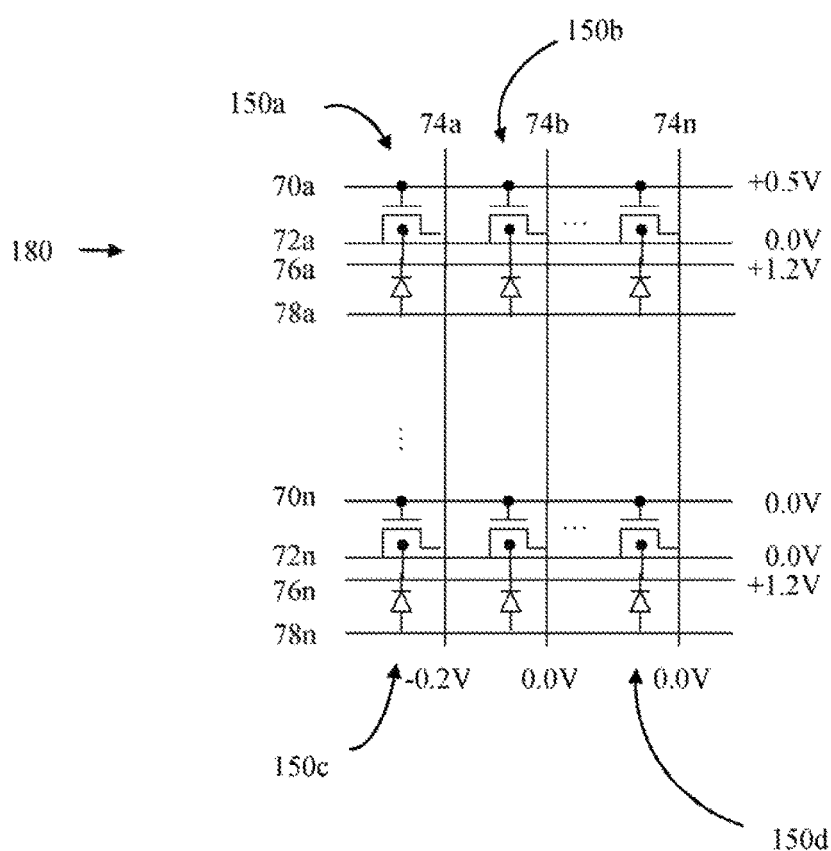
FIG. 27 illustrates bias conditions on a selected cell and unselected cells of an array during a write "0" operation on the selected cell according to an embodiment of the present invention.

In one particular non-limiting embodiment, for the selected cell 150 a potential of about 0.0 volts is applied to terminal 72, a potential of about −0.2 volts is applied to terminal 74, a potential of about +0.5 volts is applied to terminal 70, about +1.2 volts is applied to terminal 76, and about 0.0 volts is applied to terminal 78. For the unselected cells not sharing the same WL terminal or BL terminal with the selected memory cell 50, about 0.0 volts is applied to terminal 72, about 0.0 volts is applied to terminal 74, about 0.0 volts is applied to terminal 70, about +1.2 volts is applied to terminal 76, and about 0.0 volts is applied to terminal 78. FIG. 27 shows the bias conditions for the selected and unselected memory cells 150 in memory array 180. However, these voltage levels may vary.

Figure 28A:
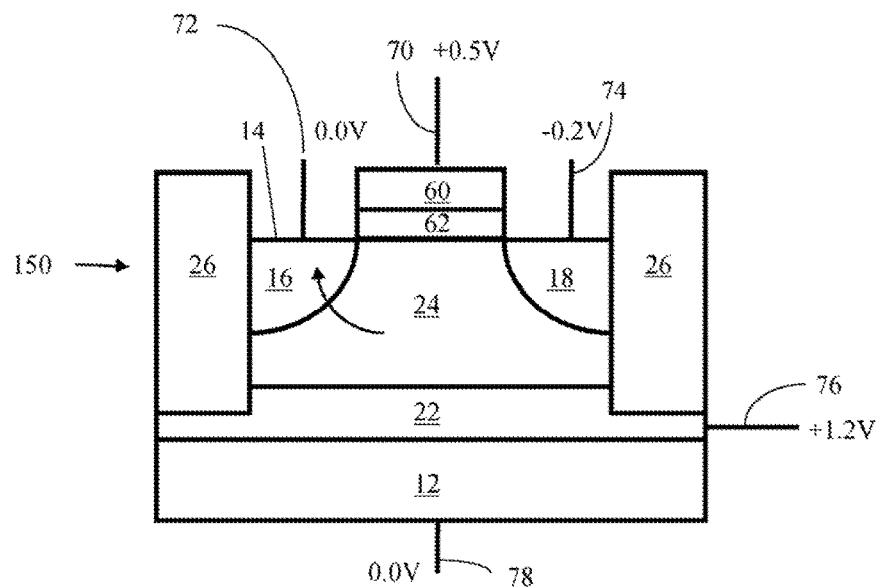
FIG. 28A illustrates an example of bias conditions on the selected memory cell of FIG. 27.
Figure 28B:
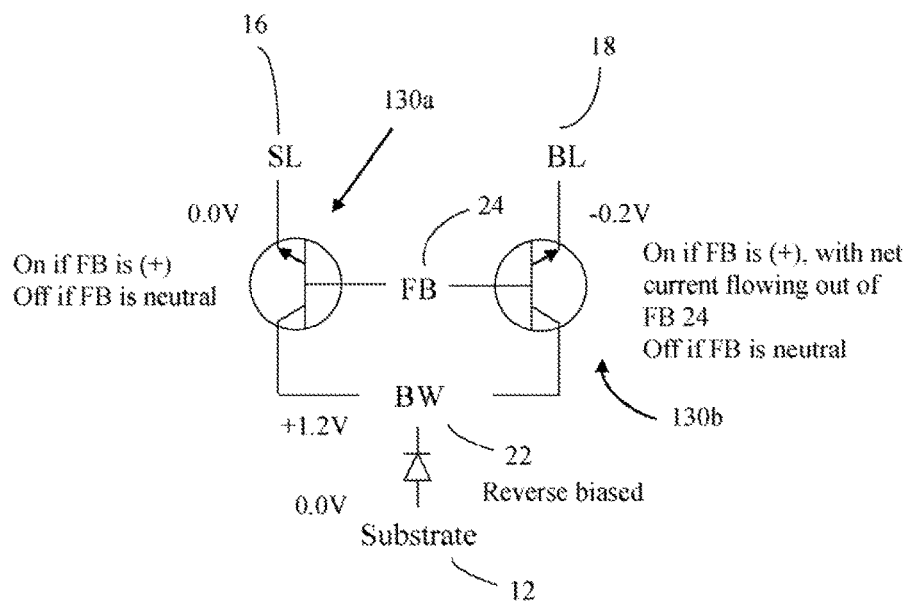
FIG. 28B shows an equivalent circuit diagram for the cell of FIG. 28A illustrating the intrinsic n-p-n bipolar devices.
Figure 28C:
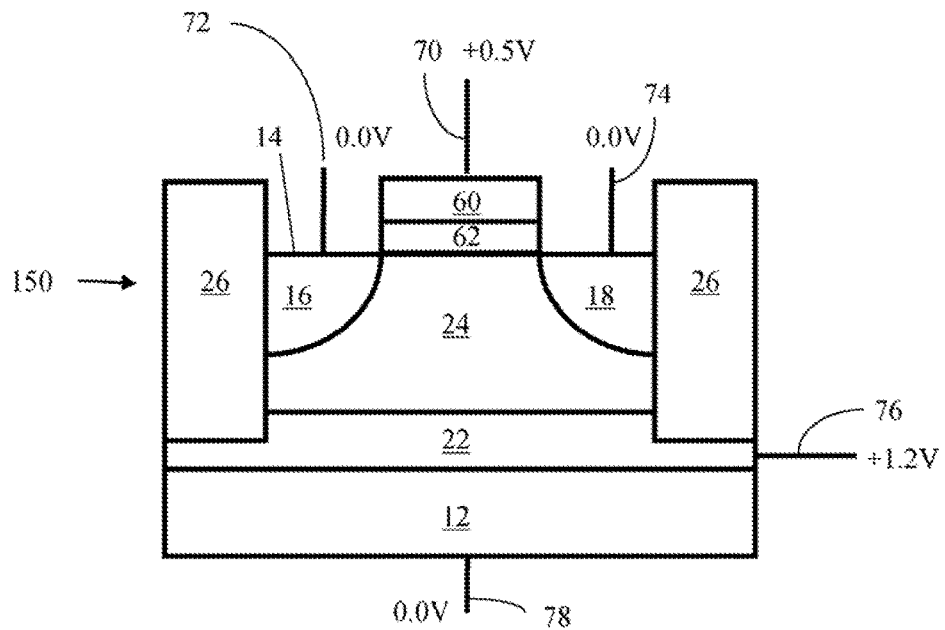
FIG. 28C illustrates an example of bias conditions on unselected memory cells sharing the same row as a selected memory cell in an array during a write "0" operation of the selected memory cell, according to the embodiment of FIG. 27.
Figure 28D:
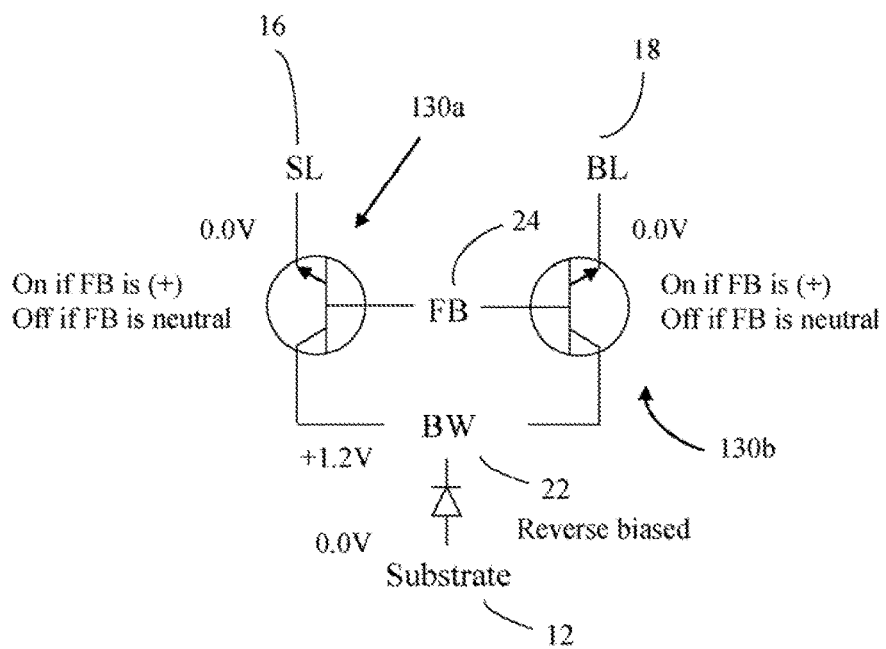
FIG. 28D shows an equivalent circuit diagram for the cell of FIG. 28C illustrating the intrinsic n-p-n bipolar devices.
Figure 28E:
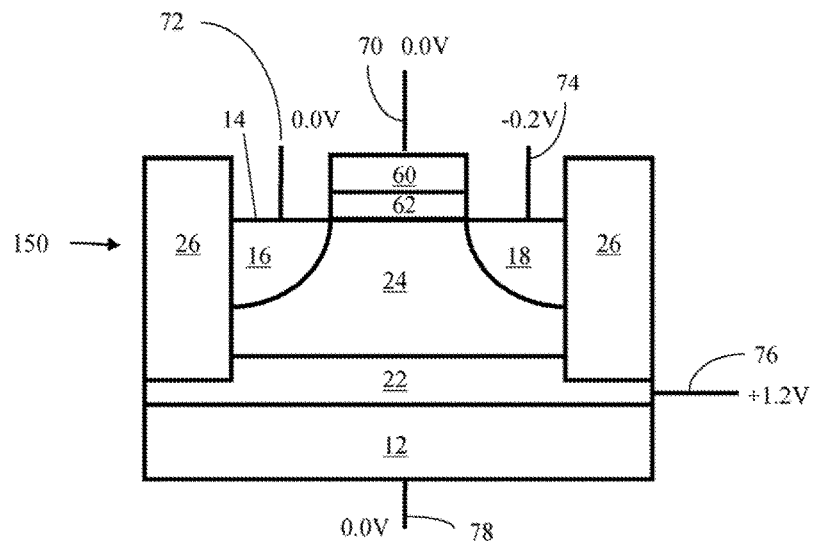
FIG. 28E illustrates an example of bias conditions on unselected memory cells sharing the same column as a selected memory cell in an array during a write "0" operation of the selected memory cell, according to the embodiment of FIG. 27.
Figure 28F:
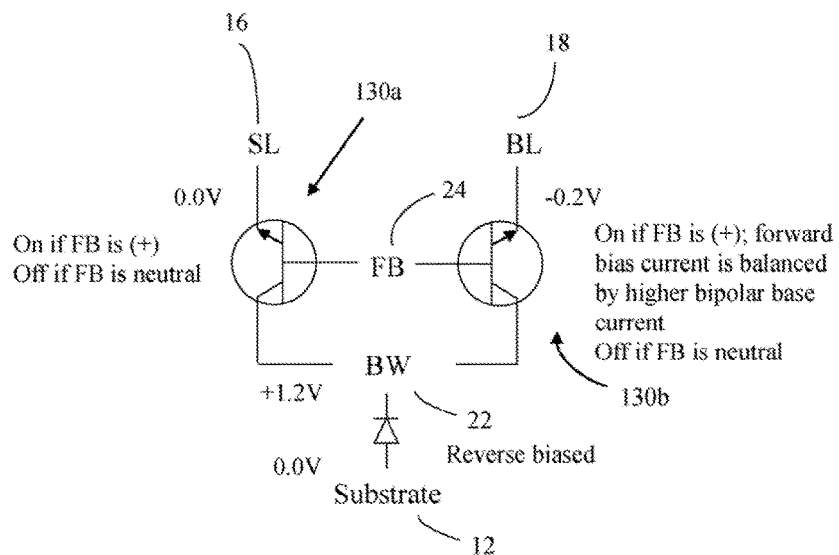
FIG. 28F shows an equivalent circuit diagram for the cell of FIG. 28E illustrating the intrinsic n-p-n bipolar devices.
Figure 28G:
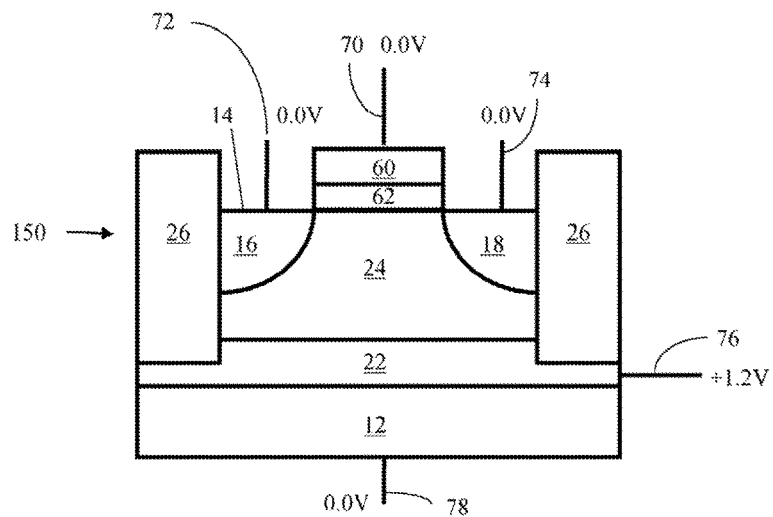
FIG. 28G illustrates an example of bias conditions on unselected memory cells that share neither the same row nor the same column as a selected memory cell in an array during a write "0" operation of the selected memory cell, according to the embodiment of FIG. 27.
Figure 28H:
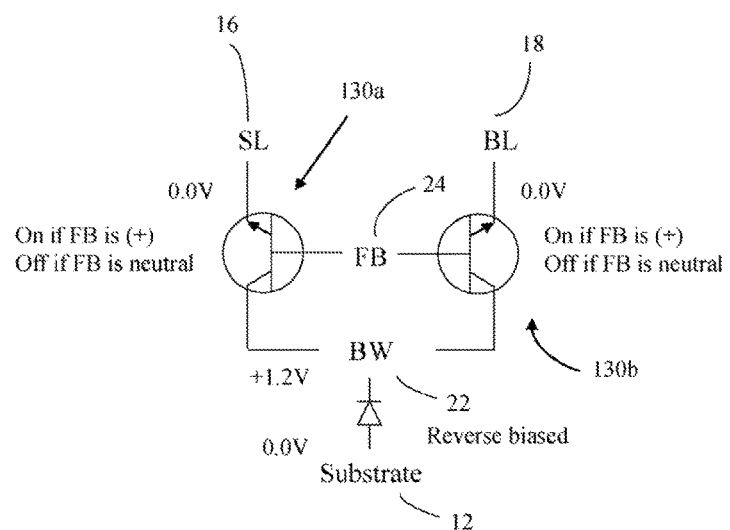
FIG. 28H shows an equivalent circuit diagram for the cell of FIG. 28G illustrating the intrinsic n-p-n bipolar devices.

An example of the bias conditions applied to a selected memory cell 150 during a write "0" operation is illustrated in FIGS. 28A-28B. An example of the bias conditions applied to the unselected memory cells 150 during write "0" operations are shown in FIGS. 28C-28H. The bias conditions for unselected memory cells 150 sharing the same row as selected memory cell 150a (e.g. memory cell 150b in FIG. 27) are shown in FIGS. 28C-28D. The bias conditions for unselected memory cells 150 sharing the same column as selected memory cell 150a (e.g. memory cell 150c in FIG. 27) are shown in FIGS. 28E-28H. The bias conditions for unselected memory cells 150 not sharing the same row or the same column as the selected memory cell 150a (e.g. memory cell 150d in FIG. 27) are shown in FIGS. 28G-28H.

During the write "0" operation (individual bit write "0" operation described above) in memory cell 150, the positive back bias applied to the BW terminal 76 of the memory cells 150 is necessary to maintain the states of the unselected cells 150, especially those sharing the same row or column as the selected cell 150a, as the bias condition can potentially alter the states of the memory cells 150 without the intrinsic bipolar device 130 (formed by buried well region 22, floating body 24, and regions 16, 18) re-establishing the equilibrium condition. Furthermore, the holding operation does not interrupt the write "0" operation of the memory cells 150.

A write "1" operation can be performed on memory cell 150 through an impact ionization mechanism or a band-to-band tunneling mechanism, as described for example in "A Design of a Capacitorless 1T-DRAM Cell Using Gate-Induced Drain Leakage (GIDL) Current for Low-power and High-speed Embedded Memory", Yoshida et al., pp. 913-918, International Electron Devices Meeting, 2003, which was incorporated by reference above.

Figure 29:
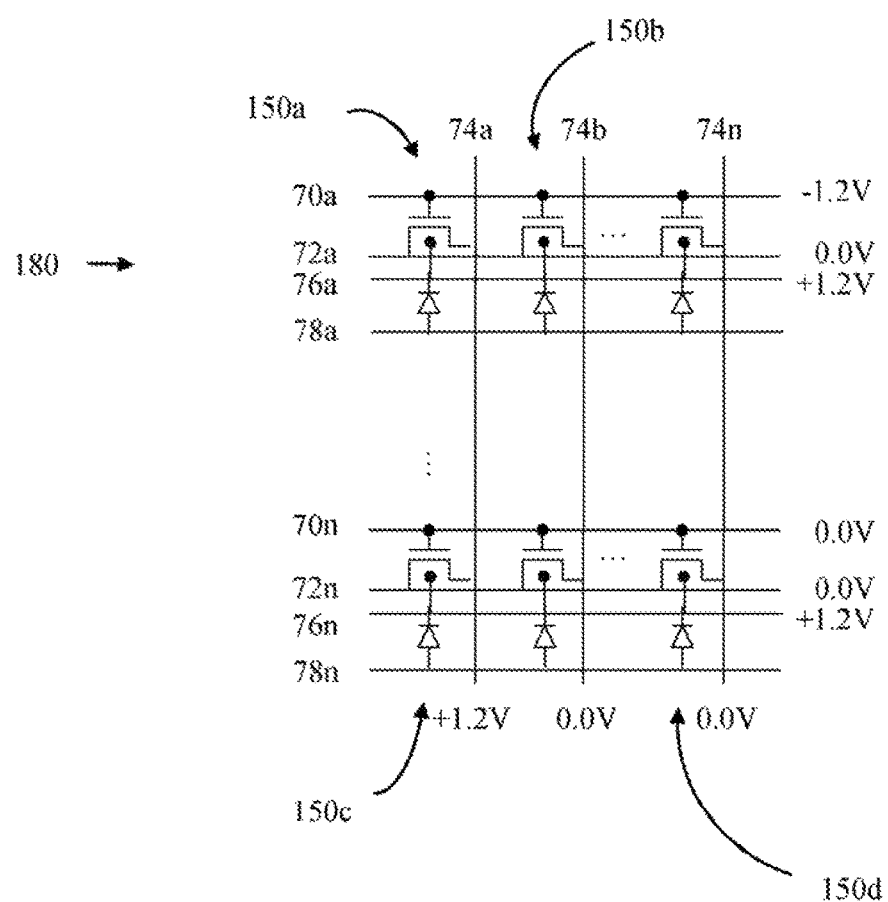
FIG. 29 illustrates an example of bias conditions applied to a selected memory cell under a band-to-band tunneling write "1" operation according to an embodiment of the present invention.

An example of bias conditions applied to selected memory cell 150a under a band-to-band tunneling write "1" operation is further elaborated and is shown in FIG. 29. The negative bias applied to the WL terminal 70a and the positive bias applied to the BL terminal 74a will result in hole injection to the floating body 24. The positive bias applied to the BW terminal 76a will maintain the resulting positive charge on the floating body 24 as discussed above. The unselected cells 150 will remain at the holding mode, with zero or negative voltage applied to the unselected WL terminal 70 (in FIG. 27, 70n and all other WL terminals 70 not connected to cell 150a) and zero voltage is applied to the unselected BL terminal 74b, 74n and all other BL terminals 74 not connected to cell 150a). The positive bias applied to the BW terminal 76 employed for the holding operations does not interrupt the write "1" operation of the selected memory cell(s). At the same time, the unselected memory cells 150 will remain in a holding operation during a write "1" operation on a selected memory cell 150.

Figure 6A:
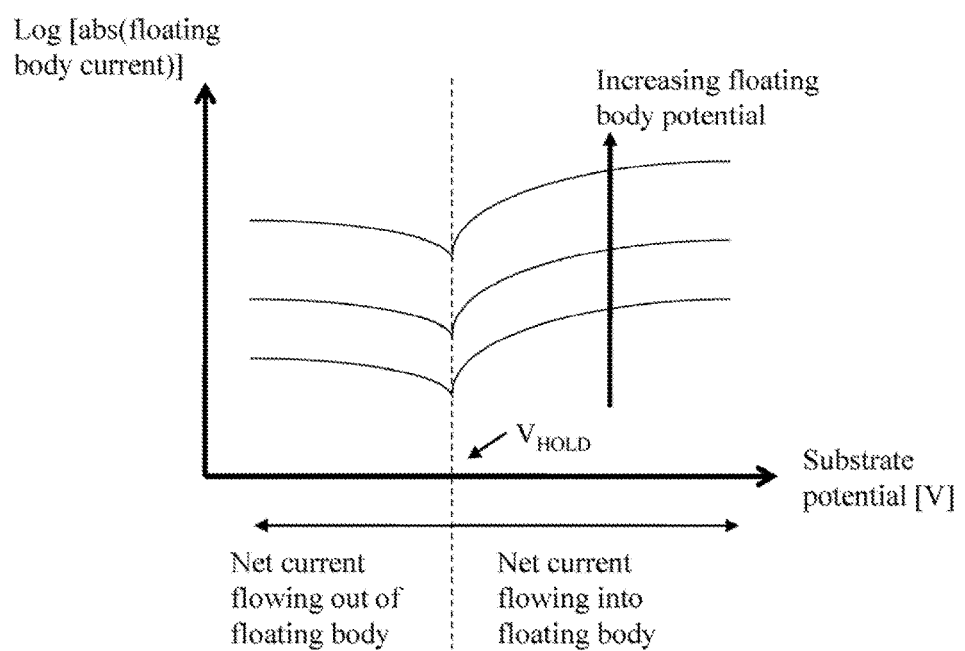
FIG. 6A graphs floating body potential as a function of floating body current and substrate potential according to an embodiment of the present invention.
Figure 6B:
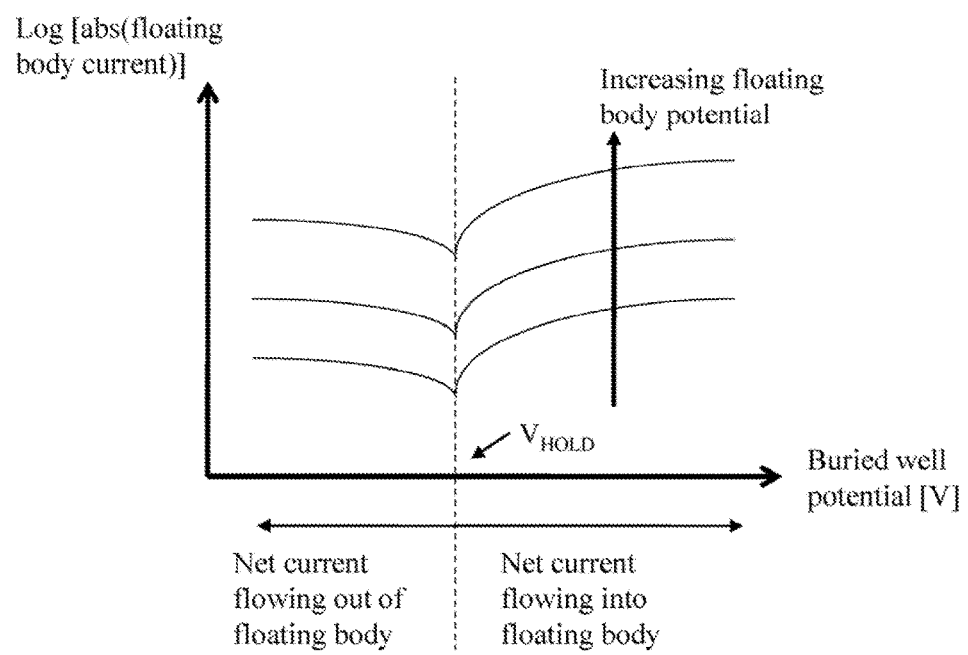
FIG. 6B graphs floating body potential as a function of floating body current and buried well potential according to an embodiment of the present invention.

A multi-level operation can also be performed on memory cell 150. A holding operation to maintain the multi-level states of memory cell 50 is described with reference to FIG. 6. The relationship between the floating body 24 current for different floating body 24 potentials as a function of the BW terminal 76 potential (FIG. 6B) is similar to that of floating body 24 current as a function of the substrate terminal 78 potential (FIG. 6A). As indicated in FIG. 6B, for different floating body potentials, at a certain BW terminal 76 potential $V_{HOLD}$, the current flowing into floating body 24 is balanced by the junction leakage between floating body 24 and regions 16 and 18. The different floating body 24 potentials represent different charges used to represent different states of memory cell 150. This shows that different memory states can be maintained by using the holding/standby operation described here.

A multi-level write operation without alternate write and read operations on memory cell 150 is now described. To perform this operation, zero voltage is applied to SL terminal 72, a positive voltage is applied to WL terminal 70, a positive voltage (back bias) is applied to BW terminal 76, and zero voltage is applied to substrate terminal 78, while the voltage of BL terminal 74 is ramped up. These bias conditions will result in a hole injection to the floating body 24 through an impact ionization mechanism. The state of the memory cell 150 can be simultaneously read for example by monitoring the change in the cell current through a read circuitry 90 coupled to the source line 72. The cell current measured in the source line direction (where source line current equals bit line current plus BW current and the currents are measured in the directions from buried well to source line and from bit line to source line) is a cumulative cell current of all memory cells 150 which share the same source line 72 (e.g. see FIGS. 16A-16C for examples of monitoring cell current in the source line direction. The same monitoring scheme can be applied to memory array 80 as well as memory array 180). As a result, only one memory cell 150 sharing the same source line 72 can be written. This ensures that the change in the cumulative cell current is a result of the write operation on the selected memory cell 150.

The applied bias conditions will result in hole injection to floating body 24 through an impact ionization mechanism. FIG. 17 shows the resulting increase of the floating body potential 24 over time. Once the change in cell current reaches the desired level associated with a state of the memory cell 150 (levels are schematically represented in FIG. 17), the voltage applied to BL terminal 74 can be removed. By applying a positive voltage to BW terminal 76, the resulting floating body 24 potential is maintained through base hole current flowing into floating body 24. In this manner, the multi-level write operation can be performed without alternate write and read operations.

In a similar manner, the multi-level write operation using impact ionization mechanism can also be performed by ramping the write current applied to BL terminal 74 instead of ramping the BL terminal 74 voltage.

In yet another embodiment, a multi-level write operation can be performed through a band-to-band tunneling mechanism by ramping the voltage applied to BL terminal 74, while applying zero voltage to SL terminal 72, a negative voltage to WL terminal 70, a positive voltage to BW terminal 76, and zero voltage to substrate terminal 78. The potential of the floating body 24 will increase as a result of the band-to-band tunneling mechanism. The state of the memory cell 50 can be simultaneously read for example by monitoring the change in the cell current through a read circuitry 90 coupled to the source line 72. Once the change in the cell current reaches the desired level associated with a state of the memory cell, the voltage applied to BL terminal 74 can be removed. If positive voltage is applied to substrate terminal 78, the resulting floating body 24 potential is maintained through base hole current flowing into floating body 24. In this manner, the multi-level write operation can be performed without alternate write and read operations.

Similarly, the multi-level write operation using band-to-band tunneling mechanism can also be performed by ramping the write current applied to BL terminal 74 instead of ramping the voltage applied to BL terminal 74.

Similarly, a read while programming operation can be performed by monitoring the change in cell current in the bit line 74 direction (where bit line current equals SL current plus BW current) through a reading circuitry 90 coupled to the bit line 74, for example as shown in FIG. 18A. For the current ramp operation, the voltage at the bit line 74 can be sensed, rather than sensing the cell current. The bit line voltage can be sensed, for example, using a voltage sensing circuitry, see FIG. 18B.

Another embodiment of memory cell 150 operations, which utilizes the silicon controlled rectifier (SCR) principle has been disclosed in U.S. patent application Ser. No. 12/533,661, filed Jul. 31, 2009, which was incorporated by reference, in its entirety, above.

Figure 30:
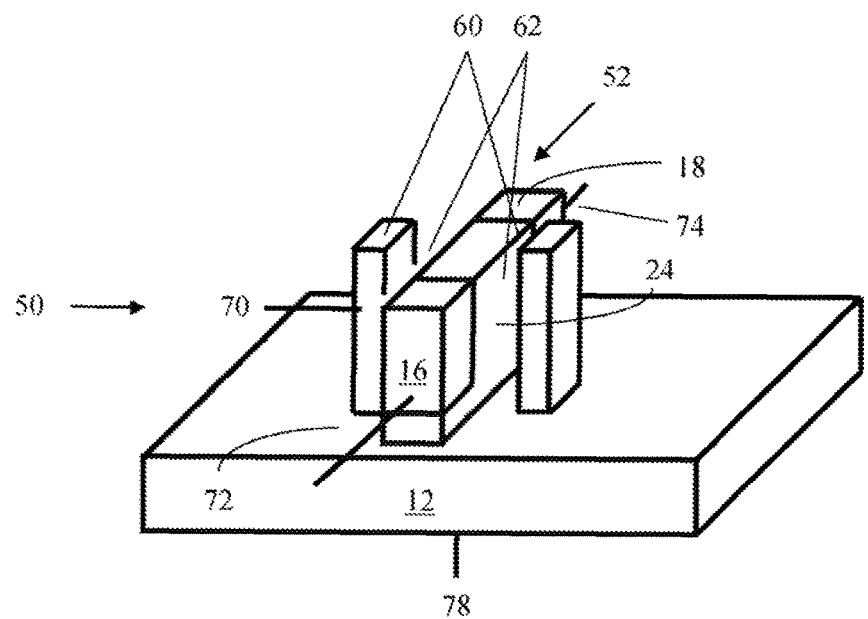
FIG. 30 is a schematic illustration of a memory cell according to another embodiment of the present invention.
Figure 31:
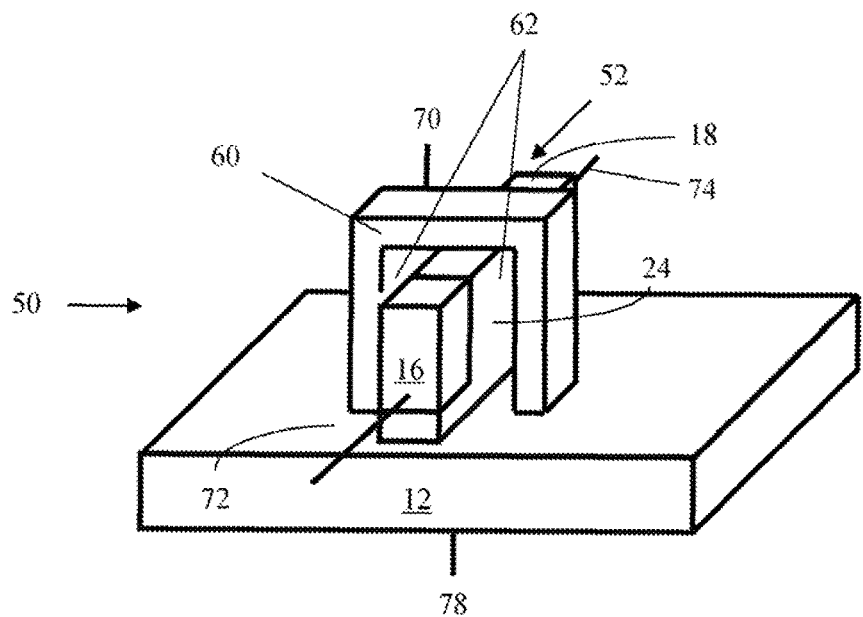
FIG. 31 is a schematic illustration of a memory cell according to another embodiment of the present invention.

FIGS. 30 and 31 show another embodiment of the memory cell 50 described in this invention. In this embodiment, cell 50 has a fin structure 52 fabricated on substrate 12 having a first conductivity type (such as n-type conductivity type) so as to extend from the surface of the substrate to form a three-dimensional structure, with fin 52 extending substantially perpendicularly to, and above the top surface of the substrate 12. Fin structure 52 includes first and second regions 16, 18 having the first conductivity type. The floating body region 24 is bounded by the top surface of the fin 52, the first and second regions 16, 18 and insulating layers 26 (insulating layers 26 can be seen in the top view of FIG. 34). Insulating layers 26 insulate cell 50 from neighboring cells 50 when multiple cells 50 are joined to make a memory device (array 80). The floating body region 24 is conductive having a second conductivity type (such as p-type conductivity type) and may be formed through an ion implantation process or may be grown epitaxially. Fin 52 is typically made of silicon, but may comprise germanium, silicon germanium, gallium arsenide, carbon nanotubes, or other semiconductor materials known in the art.

Memory cell device 50 further includes gates 60 on two opposite sides of the floating substrate region 24 as shown in FIG. 30. Alternatively, gates 60 can enclose three sides of the floating substrate region 24 as shown in FIG. 31. Gates 60 are insulated from floating body 24 by insulating layers 62. Gates 60 are positioned between the first and second regions 16, 18, adjacent to the floating body 24.

Device 50 includes several terminals: word line (WL) terminal 70, source line (SL) terminal 72, bit line (BL) terminal 74, and substrate terminal 78. Terminal 70 is connected to the gate 60. Terminal 72 is connected to first region 16 and terminal 74 is connected to second region 18. Alternatively, terminal 72 can be connected to second region 18 and terminal 74 can be connected to first region 16. Terminal 78 is connected to substrate 12.

Figure 32:
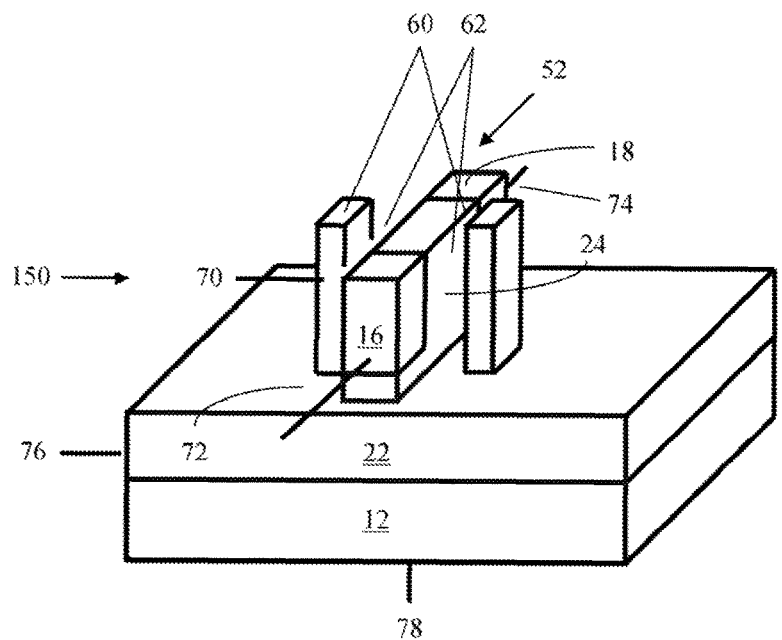
FIG. 32 is a schematic illustration of a memory cell according to another embodiment of the present invention.
Figure 33:
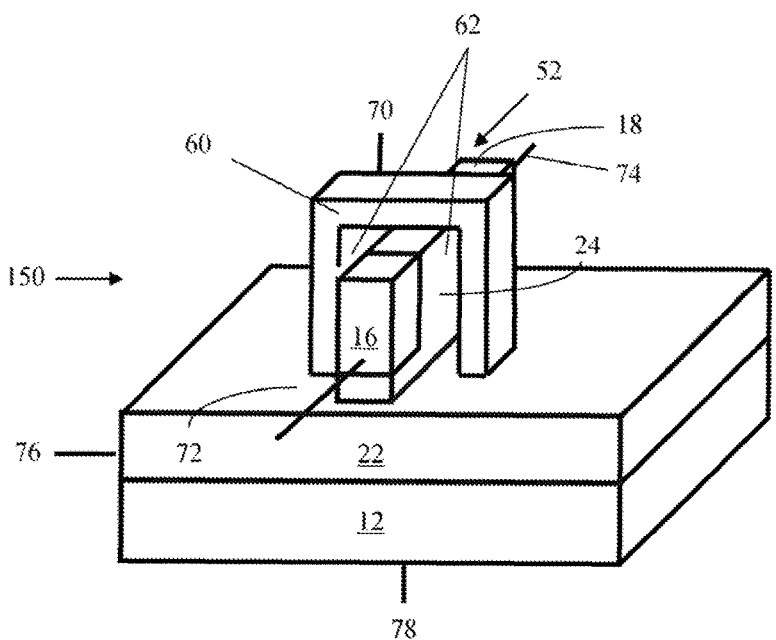
FIG. 33 is a schematic illustration of a memory cell according to another embodiment of the present invention.

FIGS. 32 and 33 show another embodiment of memory cell 150 described in this invention. In this embodiment, cell 150 has a fin structure 52 fabricated on substrate 12, so as to extend from the surface of the substrate to form a three-dimensional structure, with fin 52 extending substantially perpendicularly to, and above the top surface of the substrate 12. Fin structure 52 is conductive and is built on buried well layer 22. Region 22 may be formed by an ion implantation process on the material of substrate 12 or grown epitaxially. Buried well layer 22 insulates the floating substrate region 24, which has a first conductivity type (such as p-type conductivity type), from the bulk substrate 12. Fin structure 52 includes first and second regions 16, 18 having a second conductivity type (such as n-type conductivity type). Thus, the floating body region 24 is bounded by the top surface of the fin 52, the first and second regions 16, 18 the buried well layer 22, and insulating layers 26 (see FIG. 34). Insulating layers 26 insulate cell 150 from neighboring cells 150 when multiple cells 150 are joined to make a memory device. Fin 52 is typically made of silicon, but may comprise germanium, silicon germanium, gallium arsenide, carbon nanotubes, or other semiconductor materials known in the art.

Memory cell device 150 further includes gates 60 on two opposite sides of the floating substrate region 24 as shown in FIG. 32. Alternatively, gates 60 can enclose three sides of the floating substrate region 24 as shown in FIG. 33. Gates 60 are insulated from floating body 24 by insulating layers 62. Gates 60 are positioned between the first and second regions 16, 18, adjacent to the floating body 24.

Device 150 includes several terminals: word line (WL) terminal 70, source line (SL) terminal 72, bit line (BL) terminal 74, buried well (BW) terminal 76 and substrate terminal 78. Terminal 70 is connected to the gate 60. Terminal 72 is connected to first region 16 and terminal 74 is connected to second region 18. Alternatively, terminal 72 can be connected to second region 18 and terminal 74 can be connected to first region 16. Terminal 76 is connected to buried layer 22 and terminal 78 is connected to substrate 12.

Figure 34:
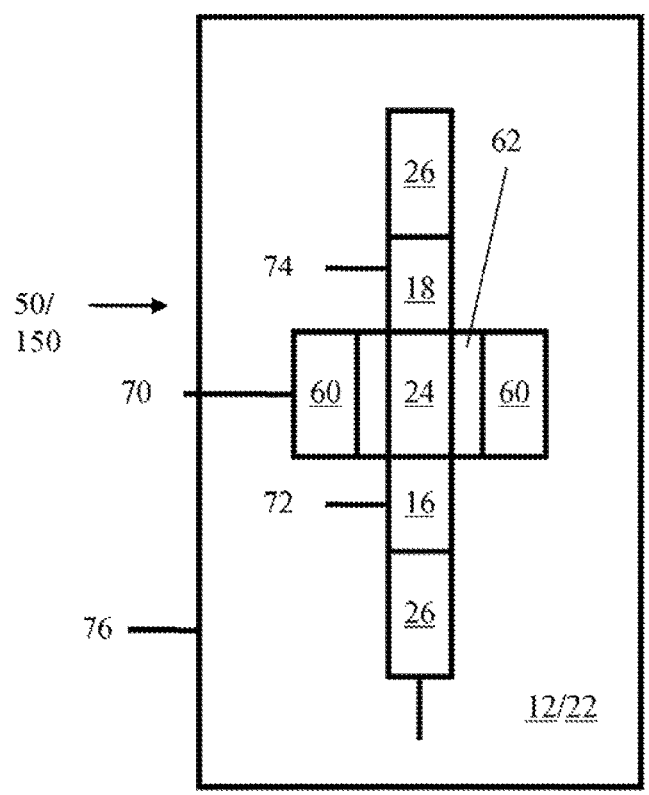
FIG. 34 is a top view, schematic illustration of a memory cell of FIGS. 30 and 32.

FIG. 34 illustrates the top view of the memory cells 50/150 shown in FIGS. 30 and 32.

From the foregoing it can be seen that with the present invention, a semiconductor memory with electrically floating body is achieved. The present invention also provides the capability of maintaining memory states or parallel non-algorithmic periodic refresh operations. As a result, memory operations can be performed in an uninterrupted manner. While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention as claimed.

That which is claimed is:

1. An integrated circuit comprising:
an array of semiconductor memory cells formed in a semiconductor substrate having at least one surface, the array comprising:
said semiconductor memory cells arranged in a matrix of rows and columns, wherein each said semiconductor memory cell includes:
a transistor comprising a source region, a floating body region, a drain region, and a gate;
a first bipolar device having a first floating base region, a first emitter, and a first collector; and
a second bipolar device having a second floating base region, a second emitter, and a second collector,
wherein said first floating base region and said second floating base region are common to said floating body region;
wherein said first collector is common to said second collector;
wherein at least one of said first bipolar device or second bipolar device maintains a state of said memory cell;
wherein said transistor is usable to access said memory cell; and
a control circuit configured to provide electrical signals to maintain the states of said memory cells without interrupting access to said memory cells.

2. The integrated circuit of claim 1, wherein said control circuit provides electrical signals to said first and second collectors to maintain the states of said memory cells connected to said first and second collectors.

3. The integrated circuit of claim 2, wherein said electrical signals to maintain the states of said memory cells are constant voltage biases.

4. The integrated circuit of claim 2, wherein said electrical signals to maintain the states of said memory cells are periodic pulses of voltage.

5. The integrated circuit of claim 1, wherein said integrated circuit comprises a fin structure extending from said substrate.

6. An integrated circuit comprising:
an array of semiconductor memory cells formed in a semiconductor substrate having at least one surface, the array comprising:
said semiconductor memory cells arranged in a matrix of rows and columns, wherein each said semiconductor memory cell includes:
a floating body region configured to be charged to a level indicative of a state of the memory cell;
a first region in electrical contact with said floating body region;
a second region in electrical contact with said floating body region and spaced apart from said first region;
a back bias region in electrical contact with said floating body region and located below said floating body region;
a first control circuit configured to perform a holding operation on said array; and
a second control circuit configured to access a selected memory cell and perform a read or write operation on said selected memory cell.

7. The integrated circuit of claim 6, wherein first control circuit provides electrical signals to at least two of said memory cells to maintain the states of said at least two memory cells.

8. The integrated circuit of claim 7, wherein said electrical signals are constant voltage biases.

9. The integrated circuit of claim 7, wherein said electrical signals are periodic pulses of voltage.

10. The integrated of claim 7, wherein said electrical signals result in at least two stable states.

11. The integrated circuit of claim 6, wherein said integrated circuit comprises a fin structure extending from said substrate.

12. An integrated circuit comprising:
an array of semiconductor memory cells formed in a semiconductor substrate having at least one surface, the array comprising:
said semiconductor memory cells arranged in a matrix of rows and columns, wherein each said semiconductor memory cell includes:
  a floating body region configured to be charged to a level indicative of a state of the memory cell;
  a first region in electrical contact with said floating body region;
  a second region in electrical contact with said floating body region and spaced apart from said first region;
  a back bias region in electrical contact with said floating body region and located below said floating body region;
a first control circuit configured to access a selected memory cell and perform a read or write operation on said selected memory cell; and
a second control circuit configured to provide electrical signals to perform a holding operation on said array, wherein said electrical signals are applied to a terminal not used for memory address selection.

13. The integrated circuit of claim 12, wherein said electrical signals to perform a holding operation are applied to a terminal connected to said back bias region.

14. The integrated circuit of claim 12, wherein said electrical signals to perform a holding operation are constant voltage biases.

15. The integrated circuit of claim 12, wherein said electrical signals to perform a holding operation are periodic pulses of voltage.

16. The integrated of claim 12, wherein said electrical signals to perform a holding operation result in at least two stable states.

17. The integrated circuit of claim 12, wherein said integrated circuit comprises a fin structure extending from said substrate.

* * * * *